(12) United States Patent
Iguchi et al.

(10) Patent No.: US 12,381,152 B2
(45) Date of Patent: Aug. 5, 2025

(54) SEMICONDUCTOR STORAGE DEVICE

(71) Applicant: Kioxia Corporation, Tokyo (JP)

(72) Inventors: Tadashi Iguchi, Mie (JP); Natsuki Fukuda, Mie (JP)

(73) Assignee: KIOXIA CORPORATION, Tokyo (JP)

( * ) Notice: Subject to any disclaimer, the term of this patent is extended or adjusted under 35 U.S.C. 154(b) by 594 days.

(21) Appl. No.: 17/686,209

(22) Filed: Mar. 3, 2022

(65) Prior Publication Data

US 2023/0090305 A1 Mar. 23, 2023

(30) Foreign Application Priority Data

Sep. 21, 2021 (JP) .................. 2021-153611

(51) Int. Cl.
  *H01L 23/535* (2006.01)
  *H01L 23/528* (2006.01)
  *H10B 41/27* (2023.01)
  *H10B 43/27* (2023.01)

(52) U.S. Cl.
  CPC ........ *H01L 23/535* (2013.01); *H01L 23/5283* (2013.01); *H10B 41/27* (2023.02); *H10B 43/27* (2023.02)

(58) Field of Classification Search
  CPC ... H01L 23/535; H01L 23/5283; H10B 41/27; H10B 43/27; H10B 41/50; H10B 43/50
  See application file for complete search history.

(56) References Cited

U.S. PATENT DOCUMENTS

| | | | |
|---|---|---|---|
| 9,478,546 B2* | 10/2016 | Yang | H10B 41/50 |
| 9,685,408 B1* | 6/2017 | Jiang | H10B 43/50 |
| 2012/0306089 A1 | 12/2012 | Freeman et al. | |
| 2014/0021628 A1* | 1/2014 | Shih | H01L 23/5226 257/774 |
| 2017/0263625 A1* | 9/2017 | Kikutani | H01L 23/5283 |
| 2019/0074249 A1* | 3/2019 | Sasaki | H10B 43/10 |
| 2020/0294850 A1* | 9/2020 | Lee | H10B 43/50 |

(Continued)

FOREIGN PATENT DOCUMENTS

| | | |
|---|---|---|
| JP | 2014-022717 A | 2/2014 |
| JP | 2014-517530 A | 7/2014 |

(Continued)

*Primary Examiner* — Joseph C. Nicely
*Assistant Examiner* — Alvin L Lee
(74) *Attorney, Agent, or Firm* — Foley & Lardner LLP

(57) ABSTRACT

A semiconductor storage device includes a substrate having a memory region and a hook-up region arranged in a first direction and memory structures arranged in a second direction. The memory structures include conductive layers arranged in a third direction and extending in the first direction over the memory region and the hook-up region and contact electrodes provided in the hook-up region and extending in the third direction to have an outer peripheral surface surrounded, each contact electrode being connected to any of the conductive layers. The hook-up region includes a first region, with a first contact electrode and a second contact electrode, and a second region, with a third contact electrode and a fourth contact electrode. In the third direction, a first average length of the first and second electrodes is equal to a second average length of the third and fourth contact electrodes.

18 Claims, 61 Drawing Sheets

(56) References Cited

U.S. PATENT DOCUMENTS

| 2021/0082934 | A1 | 3/2021 | Iwamoto |
| 2021/0226013 | A1 | 7/2021 | Goto |
| 2021/0280601 | A1 | 9/2021 | Kashiyama et al. |

FOREIGN PATENT DOCUMENTS

| JP | 2018-026518 A | 2/2018 |
| TW | 202114072 A | 4/2021 |
| TW | 202135071 A | 9/2021 |

* cited by examiner

SEMICONDUCTOR STORAGE DEVICE

CROSS-REFERENCE TO RELATED APPLICATION(S)

This application is based upon and claims the benefit of priority from Japanese Patent Application No. 2021-153611, filed Sep. 21, 2021, the entire contents of which are incorporated herein by reference.

FIELD

Embodiments described herein relate generally to a semiconductor storage device.

BACKGROUND

A semiconductor storage device has been known, which includes a substrate, a plurality of conductive layers stacked in a direction intersecting the surface of the substrate, a semiconductor layer facing the plurality of conductive layers, and a gate insulating layer provided between the conductive layers and the semiconductor layer. The gate insulating layer includes, for example, a memory unit capable of storing data such as an insulating charge storage layer such as silicon nitride ($Si_3N_4$) or a conductive charge storage layer such as a floating gate.

Examples of related art include JP-A-2018-026518.

DETAILED DESCRIPTION

Figure 1:
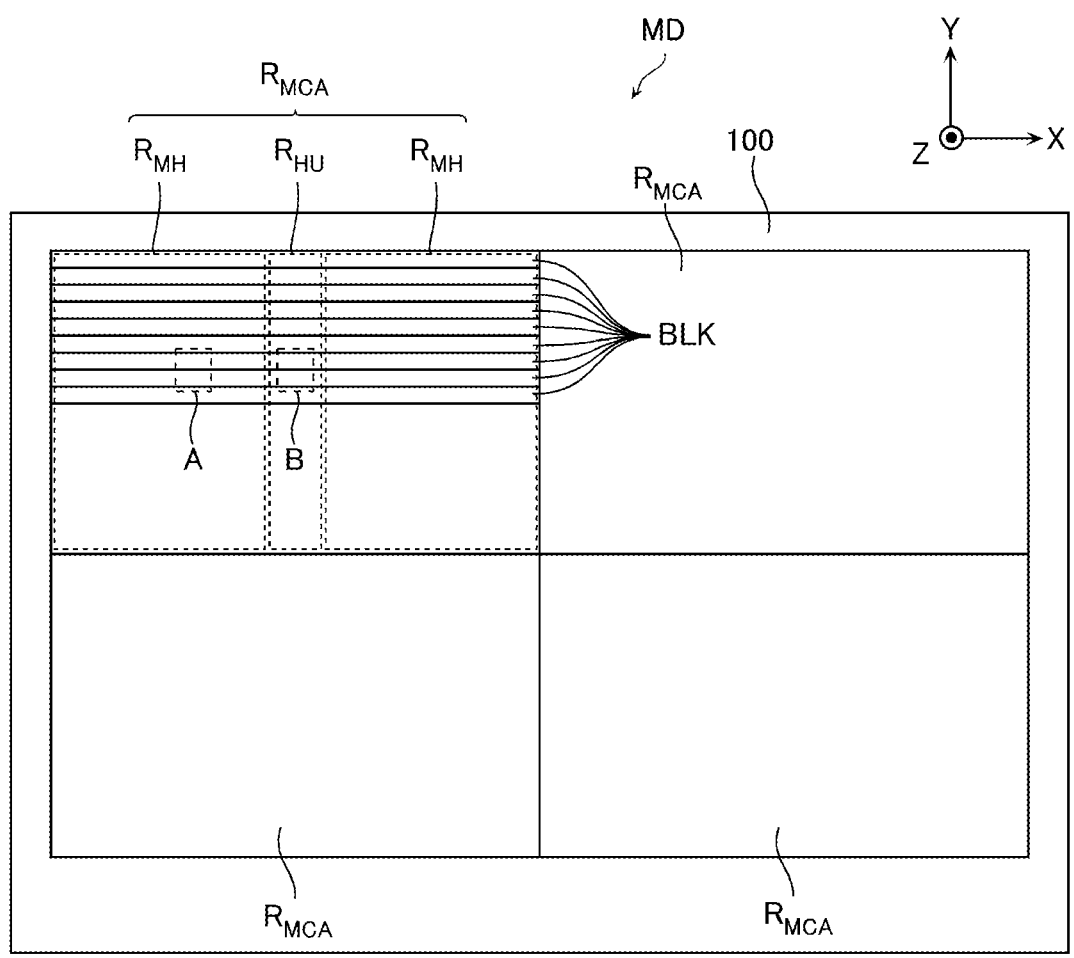
FIG. 1 is a schematic plan view of a memory die MD according to a first embodiment.

Embodiments provide a semiconductor storage device with easy high integration.

In general, according to at least one embodiment, a semiconductor storage device includes a substrate having a memory region and a hook-up region arranged in a first direction and a plurality of memory structures arranged in a second direction intersecting the first direction. Each of the plurality of memory structures includes a plurality of conductive layers arranged in a third direction intersecting a surface of the substrate and extending in the first direction over the memory region and the hook-up region, a semiconductor layer provided in the memory region and extending in the third direction to face the plurality of conductive layers, a charge storage film provided between the plurality of conductive layers and the semiconductor layer, and a plurality of contact electrodes provided in the hook-up region and extending in the third direction to have an outer peripheral surface surrounded by a part of the plurality of conductive layers, each contact electrode being connected to any of the plurality of conductive layers. The hook-up region includes a first area and a second area arranged in the first direction. The first region includes a first contact electrode and a second contact electrode, and the second region includes a third contact electrode. A length of the third contact electrode in the third direction is larger than a length of the first contact electrode in the third direction, and is smaller than a length of the second contact electrode in the third direction.

Next, a semiconductor storage device according to at least one embodiment will be described in detail with reference to the drawings. Moreover, the following embodiments are merely by way of example, and are not intended to limit the present disclosure. Further, the following drawings are schematic, and for convenience of explanation, some configurations and the like may be omitted. Further, the same reference numerals may be given to parts common to a plurality of embodiments, and the descriptions thereof may be omitted.

Further, when the term "semiconductor storage device" is used herein, it may mean a memory die, or may mean a memory system including a controller die such as a memory chip, a memory card, or a solid state drive (SSD). Furthermore, it may mean a configuration including a host computer such as a smart phone, a tablet terminal, or a personal computer.

Further, as used herein, when a first component is "electrically connected" to a second component, the first component may be directly connected to the second component, or the first component may be connected to the second component via a wiring, a semiconductor member, a transistor or the like. For example, when three transistors are connected in series, a first transistor is "electrically connected" to a third transistor even if a second transistor is in the OFF state.

Further, as used herein, when the first component is "connected between" the second component and the third component, it may mean that the first component, the second component, and the third component are connected in series and that the second component is connected to the third component via the first component.

Further, as used herein, a predetermined direction parallel to the upper surface of a substrate is referred to as the X direction, a direction parallel to the surface of the substrate and perpendicular to the X direction is referred to as the Y direction, and a direction perpendicular to the surface of the substrate is referred to as the Z direction.

Further, as used herein, a direction along a predetermined surface may be referred to as a first direction, a direction intersecting the first direction along the predetermined surface may be referred to as a second direction, and a direction intersecting the predetermined surface may be referred to as a third direction. The first direction, the second direction, and the third direction may correspond to, or may not correspond to any of the X direction, the Y direction, and the Z direction.

Further, as used herein, the terms such as "upper" and "lower" are on the basis of the substrate. For example, the orientation away from the substrate along the Z direction is referred to as "upper", and the orientation closer to the substrate along the Z direction is referred to as "lower". Further, when referring to a lower surface or a lower end with respect to a certain component, it means a surface or an end of this component at the substrate side, and when referring to an upper surface or an upper end, it means a surface or an end of this component at a side opposite to the substrate. Further, a surface intersecting the X direction or the Y direction is referred to as a side surface.

Further, as used herein, when referring to the "width", "length", "thickness", or the like in a predetermined direction with respect to a component, a member, or the like, it may mean the width, length, thickness, or the like in a cross section or the like observed by scanning electron microscopy (SEM), transmission electron microscopy (TEM), or the like.

First Embodiment

[Configuration]

Figure 2:
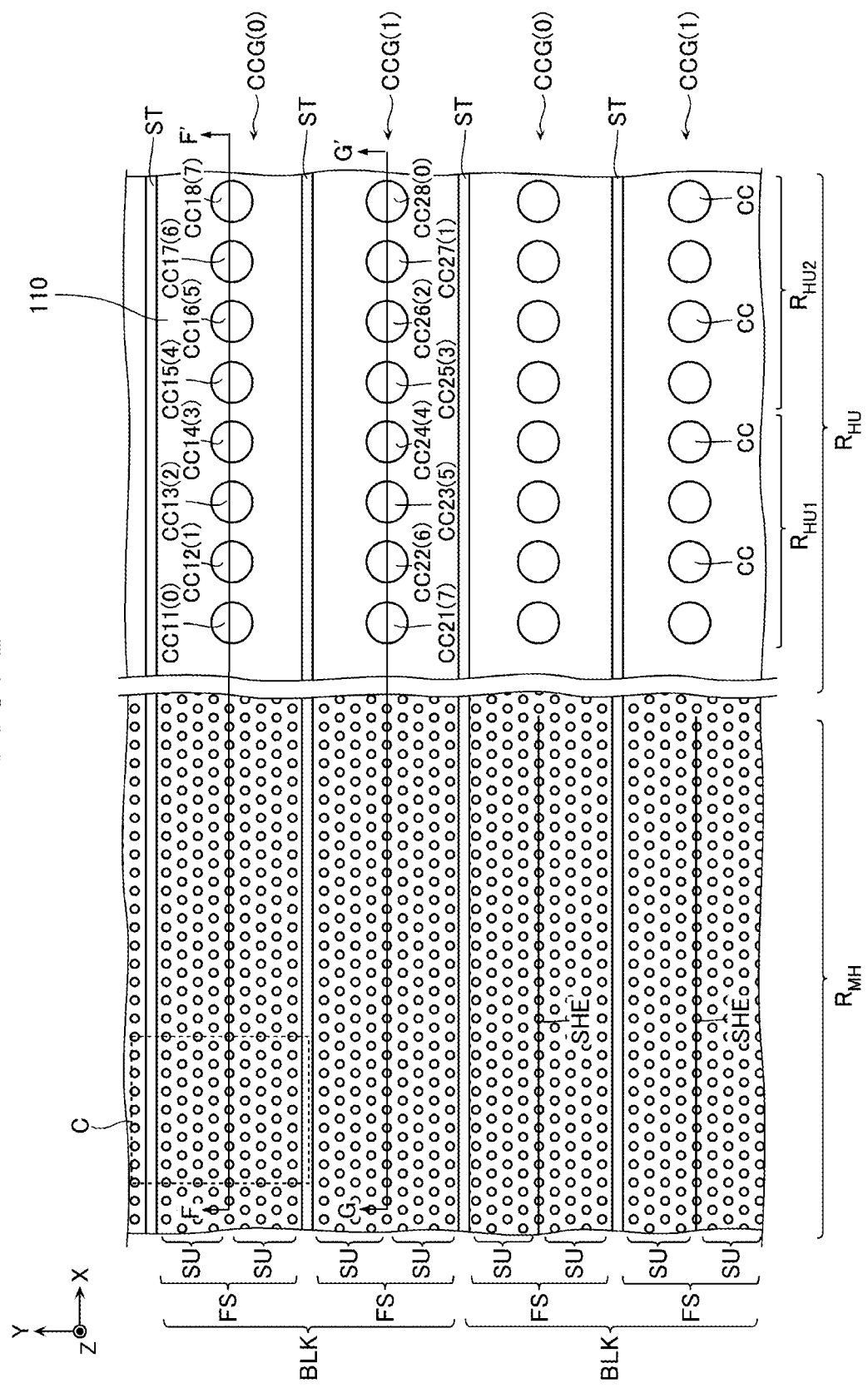
FIG. 2 is a schematic enlarged view of the portion indicated by A and the portion indicated by B in FIG. 1.
Figure 3:
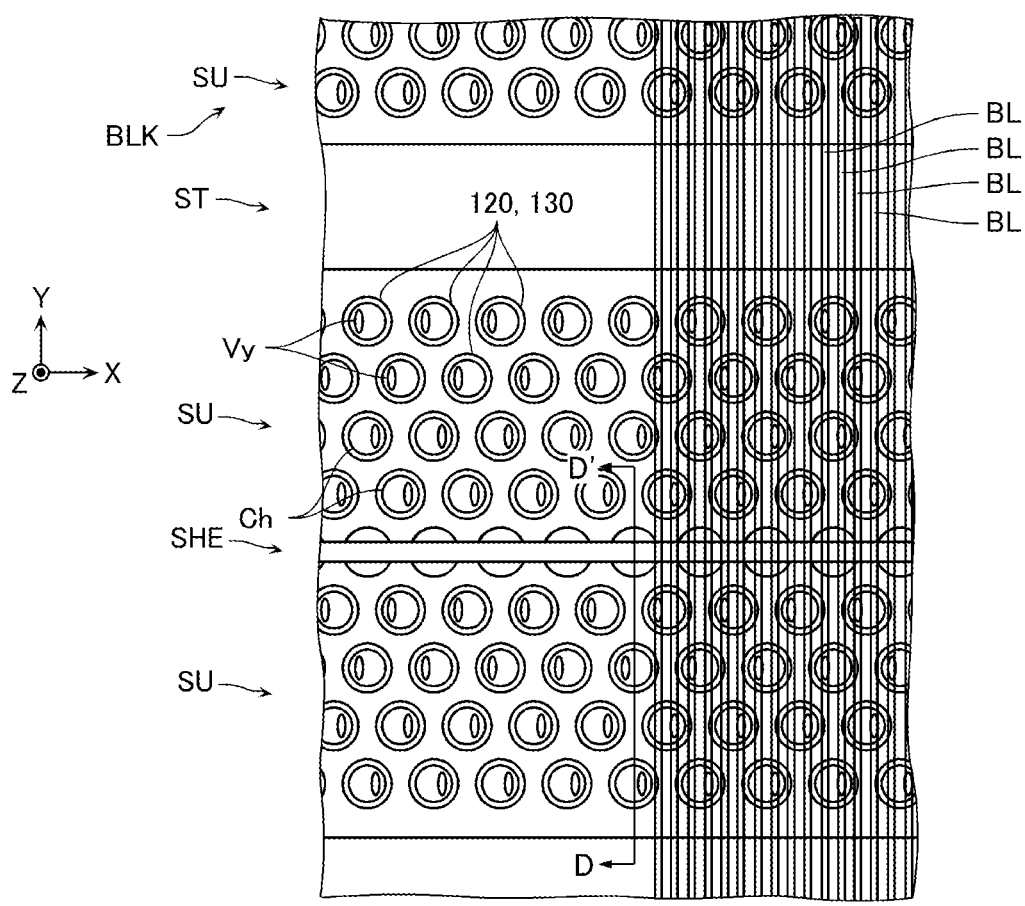
FIG. 3 is a schematic enlarged view of the portion indicated by C in FIG. 2.
Figure 4:
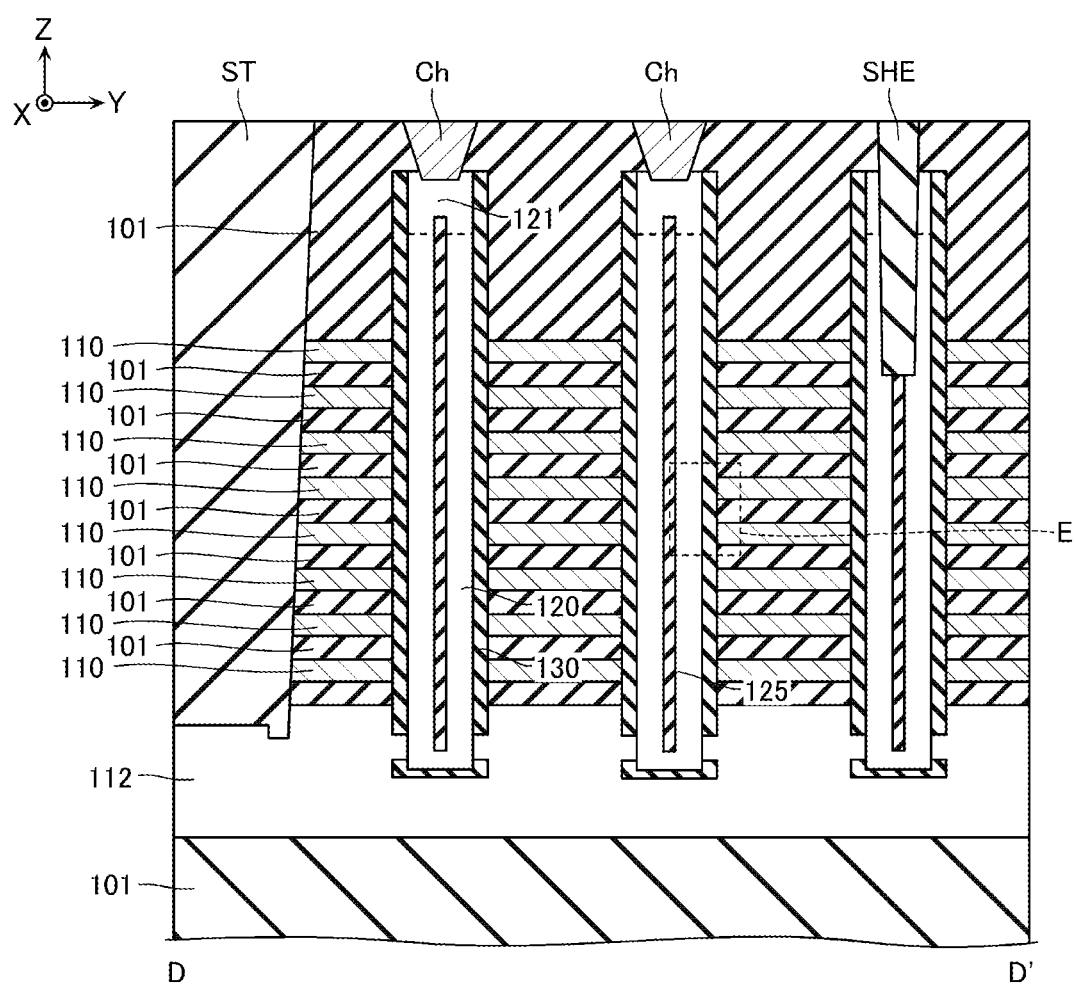
FIG. 4 is a schematic cross-sectional view of a structure illustrated in FIG. 3 taken along line D-D' and viewed along the direction of the arrow.
Figure 5:
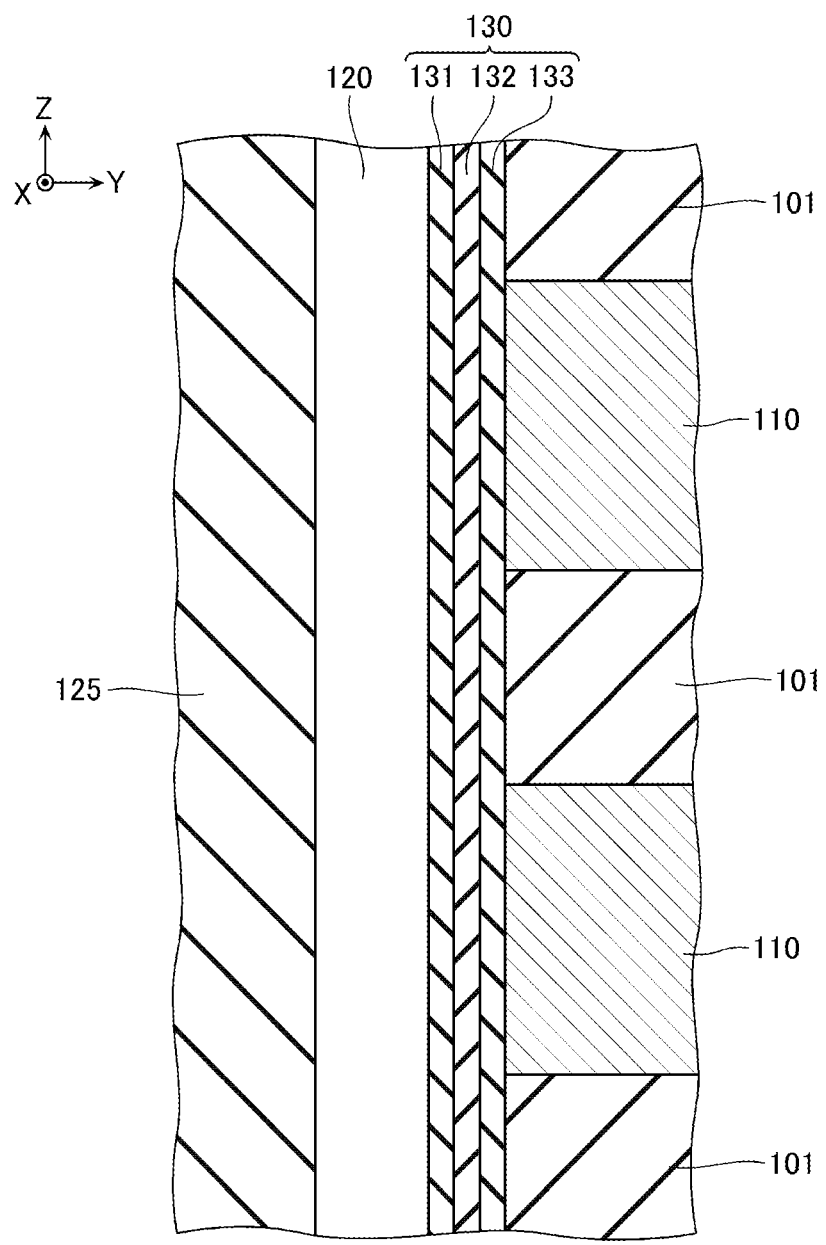
FIG. 5 is a schematic enlarged view of the portion indicated by E in FIG. 4.
Figure 6:
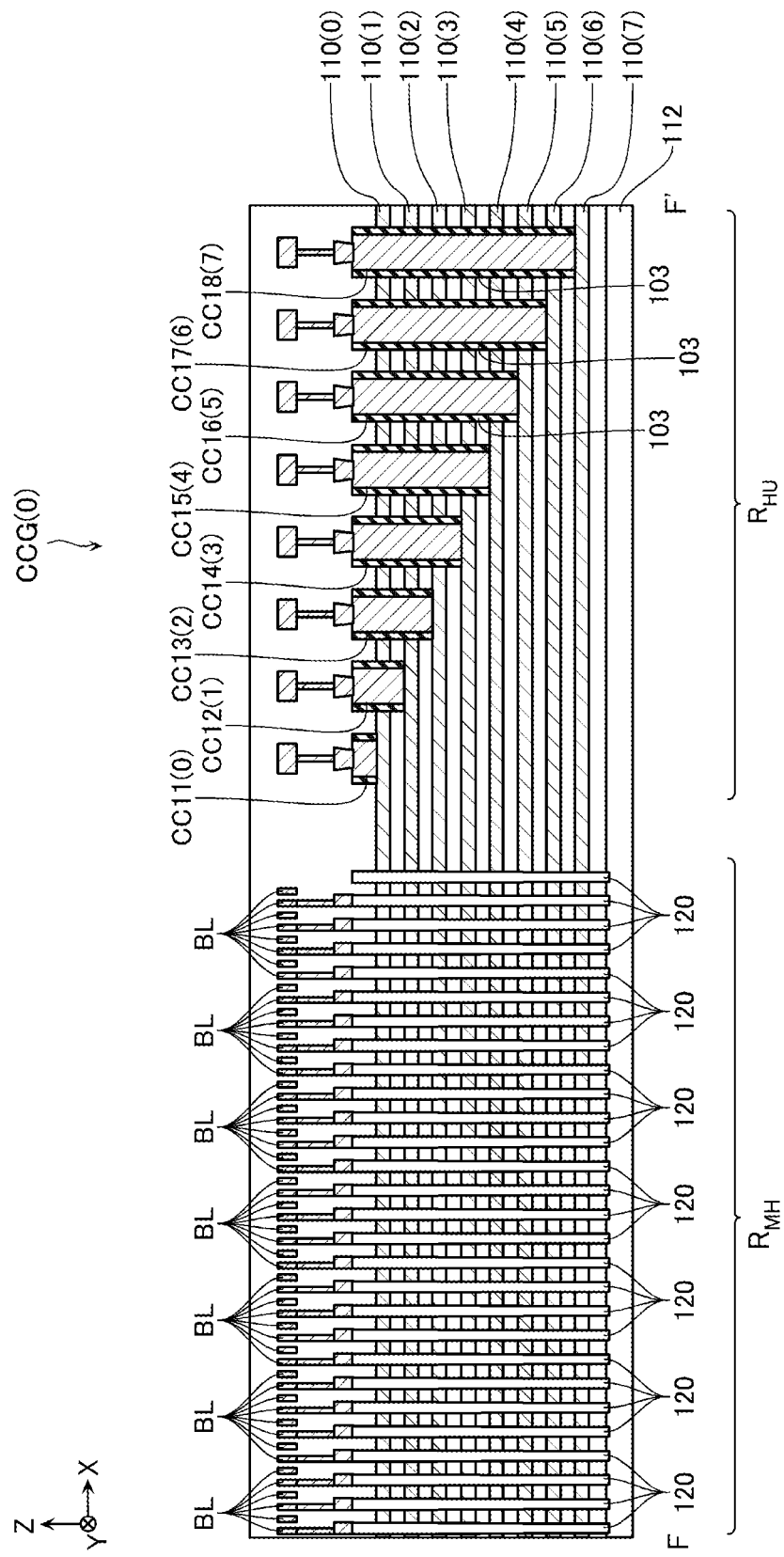
FIG. 6 is a schematic cross-sectional view of a structure illustrated in FIG. 2 taken along line F-F' and viewed along the direction of the arrow.
Figure 7:
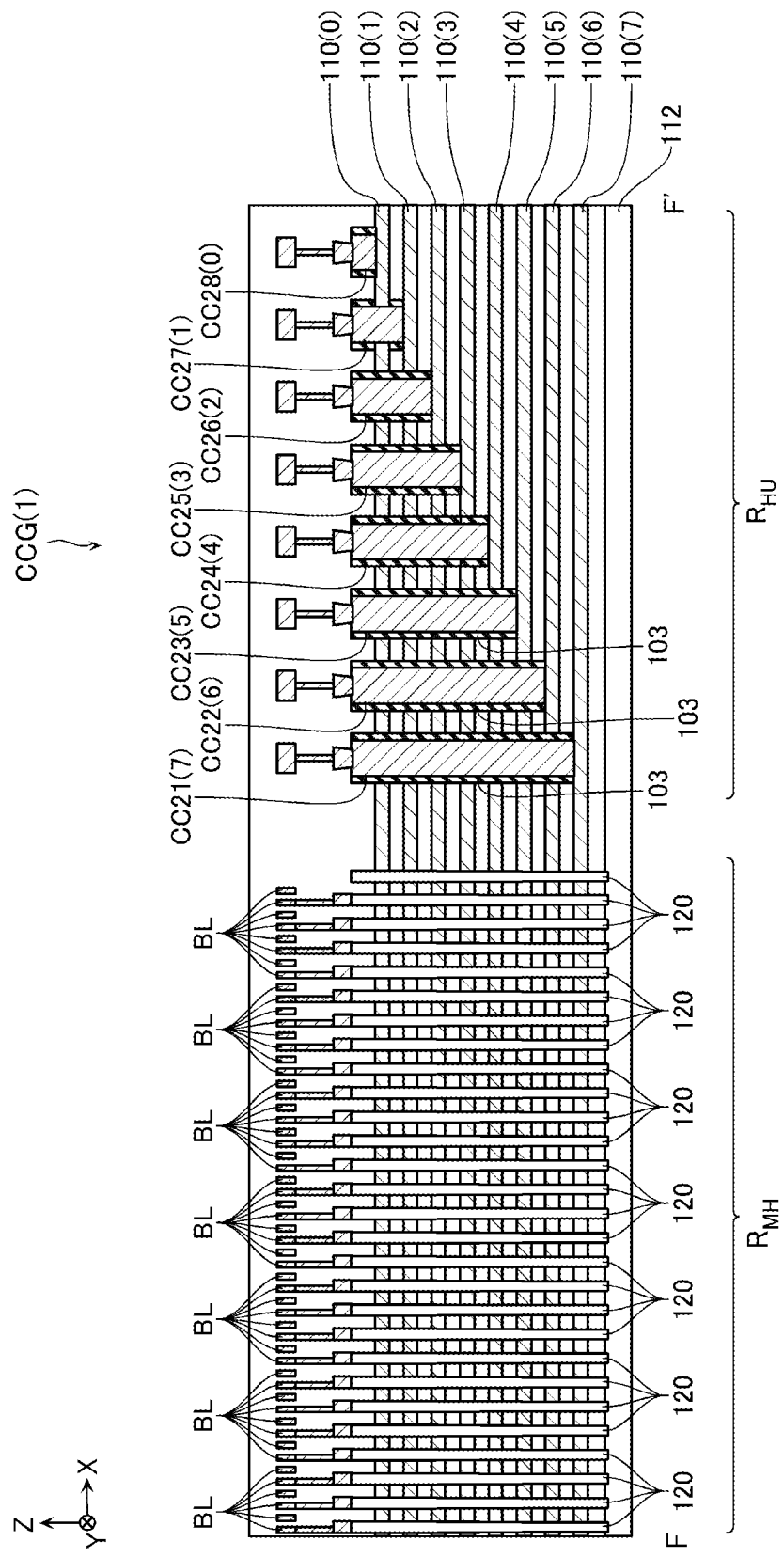
FIG. 7 is a schematic cross-sectional view of the structure illustrated in FIG. 2 taken along line G-G' and viewed along the direction of the arrow.
Figure 8:
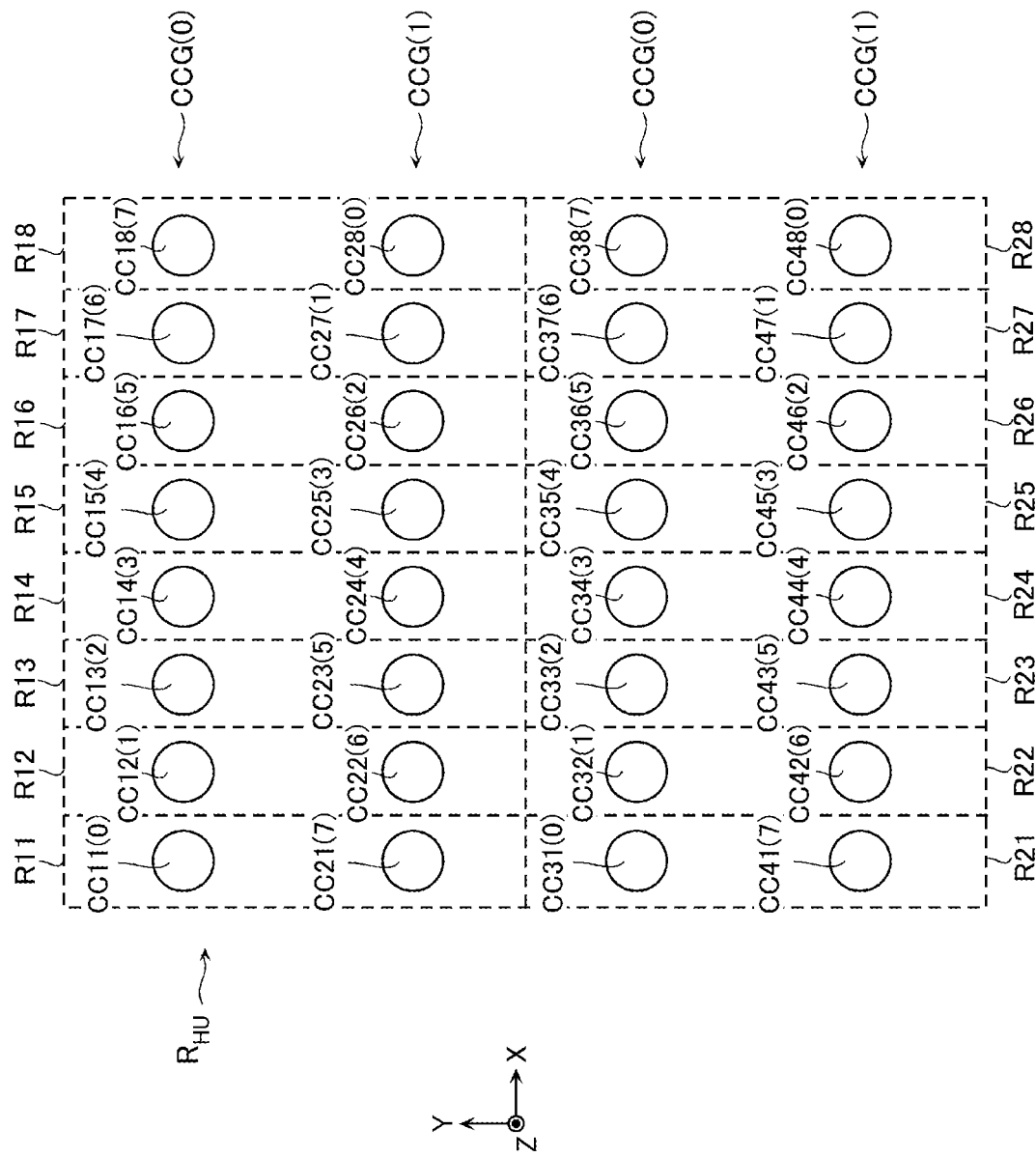
FIG. 8 is a schematic enlarged view of a hook-up region illustrated in FIG. 2.

FIG. 1 is a schematic plan view of a memory die MD. FIG. 2 is a schematic enlarged view of the portion indicated by A and the portion indicated by B in FIG. 1. FIG. 3 is a schematic enlarged view of the portion indicated by C in FIG. 2. FIG. 4 is a schematic cross-sectional view of a structure illustrated in FIG. 3 taken along line D-D' and viewed along the direction of the arrow. FIG. 5 is a schematic enlarged view of the portion indicated by E in FIG. 4. FIG. 6 is a schematic cross-sectional view of a structure illustrated in FIG. 2 taken along line F-F' and viewed along the direction of the arrow. FIG. 7 is a schematic cross-sectional view of the structure illustrated in FIG. 2 taken along line G-G' and viewed along the direction of the arrow. FIG. 8 is a schematic enlarged view of a hook-up region illustrated in FIG. 2.

For example, as illustrated in FIG. 1, the memory die MD includes a semiconductor substrate 100. The semiconductor substrate 100 is, for example, a semiconductor substrate made of P-type silicon (Si) containing a P-type impurity such as boron (B). The surface of the semiconductor substrate 100 is provided with an N-type well region containing an N-type impurity such as phosphorus (P), a P-type well region containing a P-type impurity such as boron (B), a semiconductor substrate region not provided with the N-type well region and the P-type well region, and an insulating region.

Further, the memory die MD includes four memory cell array regions $R_{MCA}$ arranged in the X direction and the Y direction. The memory cell array region $R_{MCA}$ includes two memory hole regions $R_{MH}$ (the memory hole region $R_{MH}$ is also referred to as a memory region) arranged in the X direction and a hook-up region $R_{HU}$ provided between these memory hole regions $R_{MH}$.

The memory cell array region $R_{MCA}$ is provided with a plurality of memory blocks BLK arranged in the Y direction. The memory block BLK includes, for example, two finger structures FS (the finger structure FS is also referred to as a memory structure) arranged in the Y direction, as illustrated in FIG. 2. The finger structure FS includes, for example, two string units SU arranged in the Y direction, as illustrated in FIG. 2.

An inter-block insulating layer ST such as a silicon oxide ($SiO_2$) is provided between the two finger structures FS adjacent to each other in the Y direction. Further, for example, as illustrated in FIGS. 2 and 3, an inter-string-unit insulating layer SHE such as a silicon oxide ($SiO_2$) is provided between the two string units SU adjacent to each other in the Y direction.

The memory hole region $R_{MH}$ of the memory block BLK includes, for example, a plurality of conductive layers 110 arranged in the Z direction, a plurality of semiconductor layers 120 extending in the Z direction, and a plurality of gate insulating films 130 provided respectively between the plurality of conductive layers 110 and the plurality of semiconductor layers 120, as illustrated in FIG. 4.

The conductive layer 110 is a substantially plate-shaped conductive layer extending in the X direction. The conductive layer 110 may include a stacked film of a barrier conductive film such as a titanium nitride (TiN) and a metal film such as tungsten (W). Further, the conductive layer 110 may contain, for example, polycrystalline silicon containing an impurity such as phosphorus (P) or boron (B). An insulating layer 101 such as a silicon oxide ($SiO_2$) is provided between the plurality of conductive layers 110 arranged in the Z direction. Moreover, the conductive layer 110 functions as a gate electrode and a word line of a memory cell, or a gate electrode and a select gate line of a select transistor.

A semiconductor layer 112 is provided below the conductive layer 110. The semiconductor layer 112 may contain, for example, polycrystalline silicon containing an impurity such as phosphorus (P) or boron (B). Further, the insulating layer 101 such as silicon oxide ($SiO_2$) is provided between the semiconductor layer 112 and the conductive layer 110. Moreover, the semiconductor layer 112 functions as a part of a source line.

For example, as illustrated in FIG. 3, the semiconductor layers 120 are arranged in a predetermined pattern in the X direction and the Y direction. The semiconductor layer 120 functions as a channel region for a plurality of memory cells and select transistors. The semiconductor layer 120 is, for example, a semiconductor layer such as polycrystalline silicon (Si). For example, as illustrated in FIG. 4, the semiconductor layer 120 has a substantially cylindrical shape, and is provided in a center portion thereof with an insulating layer 125 such as a silicon oxide. Further, the outer peripheral surface of each semiconductor layer 120 is surrounded by the conductive layers 110 to face the conductive layers 110.

An impurity region 121 containing an N-type impurity such as phosphorus (P) is provided at the upper end of the semiconductor layer 120. In the example of FIG. 4, the boundary between the upper end of the semiconductor layer 120 and the lower end of the impurity region 121 is indicated by the broken line. The impurity region 121 is connected to a bit line BL via a contact Ch and a contact Vy (FIG. 3).

The lower end of the semiconductor layer 120 is connected to the semiconductor layer 112.

The gate insulating film 130 has a substantially cylindrical shape covering the outer peripheral surface of the semiconductor layer 120. The gate insulating film 130 includes, for example, a tunnel insulating film 131, a charge storage film 132, and a block insulating film 133 which are stacked between the semiconductor layer 120 and the conductive layers 110, as illustrated in FIG. 5. The tunnel insulating film 131 and the block insulating film 133 are, for example, insulating films such as a silicon oxide ($SiO_2$). The charge storage film 132 is, for example, a film capable of storing charges such as a silicon nitride ($Si_3N_4$). The tunnel insulating film 131, the charge storage film 132, and the block insulating film 133 have a substantially cylindrical shape, and extend in the Z direction along the outer peripheral surface of the semiconductor layer 120 excluding a contact portion between the semiconductor layer 120 and the semiconductor layer 112.

Moreover, FIG. 5 shows the example in which the gate insulating film 130 includes the charge storage film 132 such as a silicon nitride. Alternatively, the gate insulating film 130 may include, for example, a floating gate such as polycrystalline silicon containing an N-type or P-type impurity.

The hook-up region $R_{HU}$ of the memory block BLK includes, for example, a part of the conductive layer 110 and a plurality of contact electrodes CC arranged in a matrix in the X direction and the Y direction, as illustrated in FIG. 2.

Moreover, with regard to the plurality of contact electrodes CC illustrated in FIG. 2 among the plurality of contact electrodes CC arranged in the hook-up region $R_{HU}$, the contact electrode CC which is the $a^{th}$ one (a is an integer of 1 or more) counted from the +Y direction to the −Y direction and is the $b^{th}$ one (b is an integer of 1 or more) counted from the −X direction to the +X direction may be referred to as a contact electrode CCab. For example, the contact electrode CC which is the second one counted from the +Y direction to the −Y direction and is the fourth one counted from the −X direction to the +X direction may be referred to as a contact electrode CC24.

A row of eight contact electrodes CC arranged in the X direction may be referred to as a contact electrode row CCG. Further, each region corresponding to the contact electrode row CCG may be referred to as a contact electrode region. As illustrated in FIG. 2, contact electrode rows CCG(0) and CCG(1) are alternately arranged in the Y direction in the hook-up region $R_{HU}$.

As illustrated in FIGS. 6 and 7, the plurality of contact electrodes CC extend in the Z direction and are connected at the lower ends thereof to the conductive layers 110. The contact electrode CC may include, for example, a stacked film of a barrier conductive film such as a titanium nitride (TiN) and a metal film such as tungsten (W). Further, the outer peripheral surface of the contact electrode CC is provided with an insulating layer 103 such as a silicon oxide ($SiO_2$).

Moreover, in the following description, the $n^{th}$ conductive layer 110 (n is an integer of 1 or more) counted from above may be referred to as a conductive layer 110(n−1). Further, one of the plurality of contact electrodes CC that is connected to a conductive layer 110(n) may be referred to as a contact electrode CC(n). Further, the conductive layer 110 (n−1) may be referred to as the $n^{th}$ conductive layer 110. As illustrated in FIGS. 4, 6 and 7, the plurality of conductive layers 110(n) are equidistantly arranged in the Z direction. Therefore, n of the contact electrode CC(n) represents the level of the length (depth) of the contact electrode CC in the Z direction.

As illustrated in FIG. 6, the contact electrode row CCG(0) includes contact electrodes CC11(0), CC12(1), CC13(2), CC14(3), CC15(4), CC16(5), CC17(6), and CC18(7) in order from the one closest to the memory hole region $R_{MH}$. In this way, in the contact electrode row CCG(0), the depths of the contact electrodes CC become gradually deeper as the distance from the memory hole region $R_{MH}$ increases (that is, the lengths of the contact electrodes CC in the Z direction increase).

As illustrated in FIG. 7, the contact electrode row CCG(1) includes contact electrodes CC21(7), CC22(6), CC23(5), CC24(4), CC25(3), CC26(2), CC27(1), and CC28(0) in order from the one closest to the memory hole region $R_{MH}$. In this way, in the contact electrode row CCG(1), the depths of the contact electrodes CC become gradually shallower as the distance from the memory hole region $R_{MH}$ increases (that is, the lengths of the contact electrodes CC in the Z direction decrease).

As illustrated in FIG. 8, the plurality of contact electrodes CC11(0), CC12(1), CC13(2), CC14(3), CC15(4), CC16(5), CC17(6), and CC18(7) of the contact electrode row CCG(0) are aligned respectively with the plurality of contact electrodes CC21(7), CC22(6), CC23(5), CC24(4), CC25(3), CC26(2), CC27(1), and CC28(0) of the contact electrode row CCG(l) in the Y direction.

Further, a plurality of contact electrodes CC31(0), CC32 (1), CC33(2), CC34(3), CC35(4), CC36(5), CC37(6), and CC38(7) of the contact electrode row CCG(0) are aligned respectively with a plurality of contact electrodes CC41(7), CC42(6), CC43(5), CC44(4), CC45(3), CC46(2), CC47(1), and CC48(0) of the contact electrode row CCG(1) in the Y direction.

A region including a fixed number m (m is an integer of 2 or more) of contact electrodes CC may be referred to as a unit region. In the example of FIG. 8, a region having a fixed area including two contact electrodes CC arranged in the Y direction is defined as a unit region. The hook-up region $R_{HU}$ is virtually divided into a plurality of unit regions.

In FIG. 8, a unit region R11 is a region including two contact electrodes CC11(0) and CC21(7). A unit region R12 is a region including two contact electrodes CC12(1) and CC22(6). A unit region R13 is a region including two contact electrodes CC13(2) and CC23(5). A unit region R14 is a region including two contact electrodes CC14(3) and CC24 (4). A unit region R15 is a region including two contact electrodes CC15(4) and CC25(3). A unit region R16 is a region including two contact electrodes CC16(5) and CC26 (2). A unit region R17 is a region including two contact electrodes CC17(6) and CC27(1). A unit region R18 is a region including two contact electrodes CC18(7) and CC28 (0).

Further, a unit region R21 is a region including two contact electrodes CC31(0) and CC41(7). A unit region R22 is a region including two contact electrodes CC32(1) and CC42(6). A unit region R23 is a region including two contact electrodes CC33(2) and CC43(5). A unit region R24 is a region including two contact electrodes CC34(3) and CC44 (4). A unit region R25 is a region including two contact electrodes CC35(4) and CC45(3). A unit region R26 is a region including two contact electrodes CC36(5) and CC46 (2). A unit region R27 is a region including two contact electrodes CC37(6) and CC47(1). A unit region R28 is a region including two contact electrodes CC38(7) and CC48 (0).

For example, the average value of the depth level "0" of the contact electrode CC11(0) and the depth level "7" of the contact electrode CC21(7) arranged in the unit region R11 is "3.5". Similarly, the average value of the depth levels n of the two contact electrodes CC arranged in the unit regions R12 to R18 and R21 to R28 is "3.5". That is, the average values of the lengths in the Z direction of the two contact electrodes CC arranged in all unit regions R11 to R18 and R21 to R28 are the same.

Moreover, as illustrated in FIG. 2, the hook-up region $R_{HU}$ in which the plurality of contact electrodes CC are arranged is divided into a first region $R_{HU1}$ and a second region $R_{HU2}$ arranged in the X direction. For example, the first region $R_{HU1}$ is a region including the contact electrodes CC11 to CC14, CC21 to CC24, . . . , and the second region $R_{HU2}$ is a region including the contact electrode CC15 to CC18, CC25 to CC28, . . . .

Further, the number of contact electrodes CC provided in the plurality of unit regions is defined as m (m is an integer of 2 or more). Then, the average value of the lengths in the Z direction of m contact electrodes CC having the first to the $m^{th}$ largest lengths in Z direction among the plurality of contact electrodes CC is defined as "the first length". Further, the average value of the lengths in the Z direction of m contact electrodes CC having the first to the $m^{th}$ smallest lengths in Z direction among the plurality of contact electrodes CC is defined as "the second length".

For example, in the example of FIG. 8, the number m of contact electrodes CC provided in the plurality of unit regions is "2". Then, the average value of the lengths in the Z direction of two contact electrodes having the first and second largest lengths in the Z direction (for example, the contact electrodes CC18(7) and CC17(6)) is "6.5". Thus, "the first length" is "6.5". Further, the average value of the lengths in the Z direction of two contact electrodes having the first and second smallest lengths in the Z direction (for example, the contact electrodes CC11(0) and CC12(1)) is "0.5". Thus, "the second length" is "0.5".

As described above, each average value of the lengths (each average value of the depth levels) in the Z direction of the two contact electrodes CC in each of the unit regions R11 to R18 and R21 to R28 is "3.5". Accordingly, each average value of the lengths in the Z direction of the two contact electrodes CC in each of the unit regions R11 to R18 and R21 to R28 is smaller than the "first length" and is larger than the "second length".

[Manufacturing Method]

Next, a method of manufacturing the memory die MD will be described with reference to FIGS. 9 to 42. FIGS. 11, 14, 23, 32, and 39 are schematic plan views illustrating the manufacturing method, and show the plane corresponding to FIG. 2. FIGS. 9, 10, 12, 13, 15, 17, 19, 21, 24, 26, 28, 30, 33, 35, 37, and 40 to 42 are schematic cross-sectional views illustrating the manufacturing method, and illustrate the cross-section corresponding to FIG. 6. FIGS. 9, 10, 16, 18, 20, 22, 25, 27, 29, 31, 34, 36, and 38 are schematic cross-sectional views illustrating the manufacturing method, and illustrate the cross-section corresponding to FIG. 7.

Figure 9:
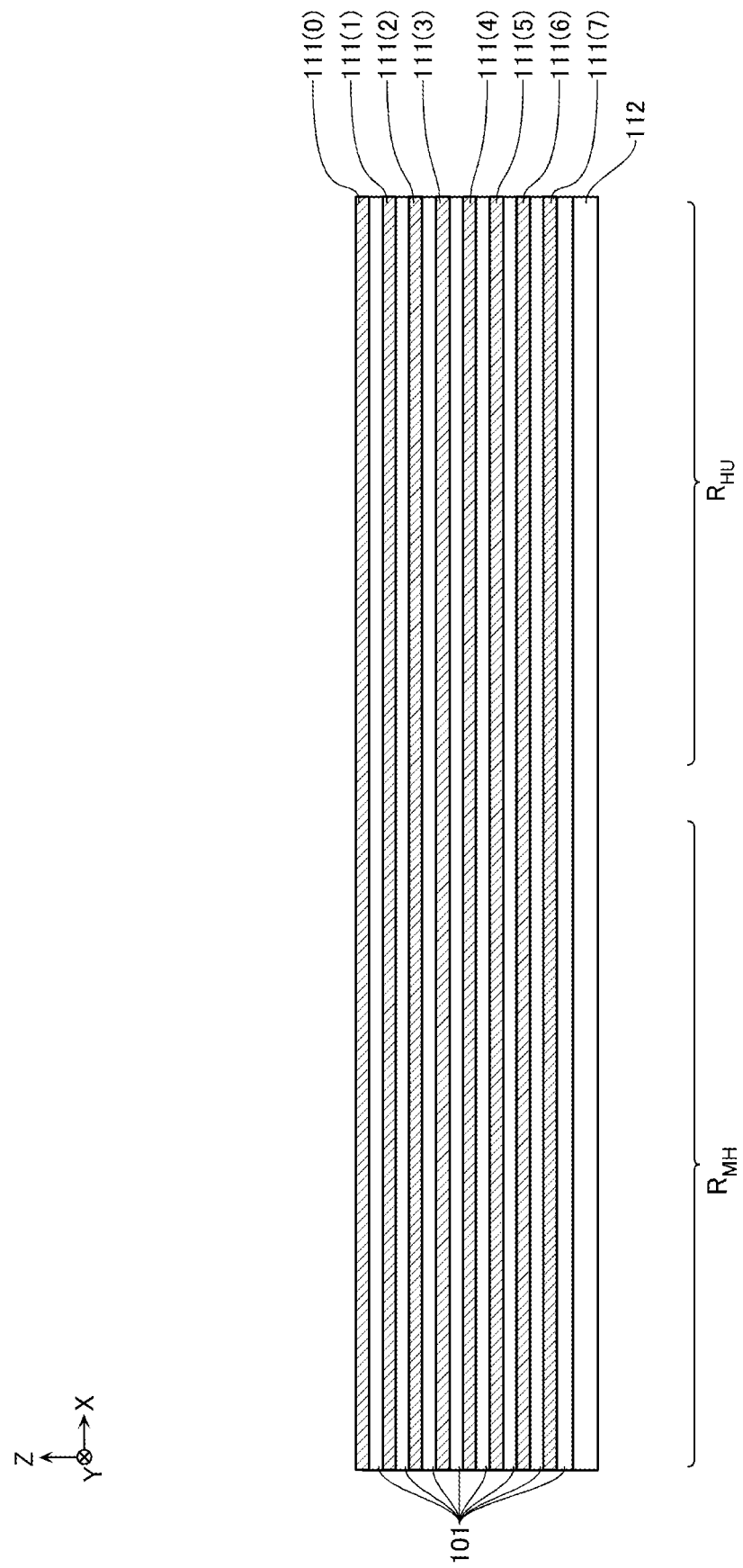
FIG. 9 is a schematic cross-sectional view illustrating a method of manufacturing a semiconductor storage device according to the first embodiment.

In the manufacture of the memory die MD according to the present embodiment, for example, as illustrated in FIG. 9, the semiconductor layer 112 is formed. Further, the plurality of insulating layers 101 and a plurality of sacrifice layers 111 are alternately formed above the semiconductor layer 112. This step is performed by a method such as, for example, chemical vapor deposition (CVD).

Figure 10:
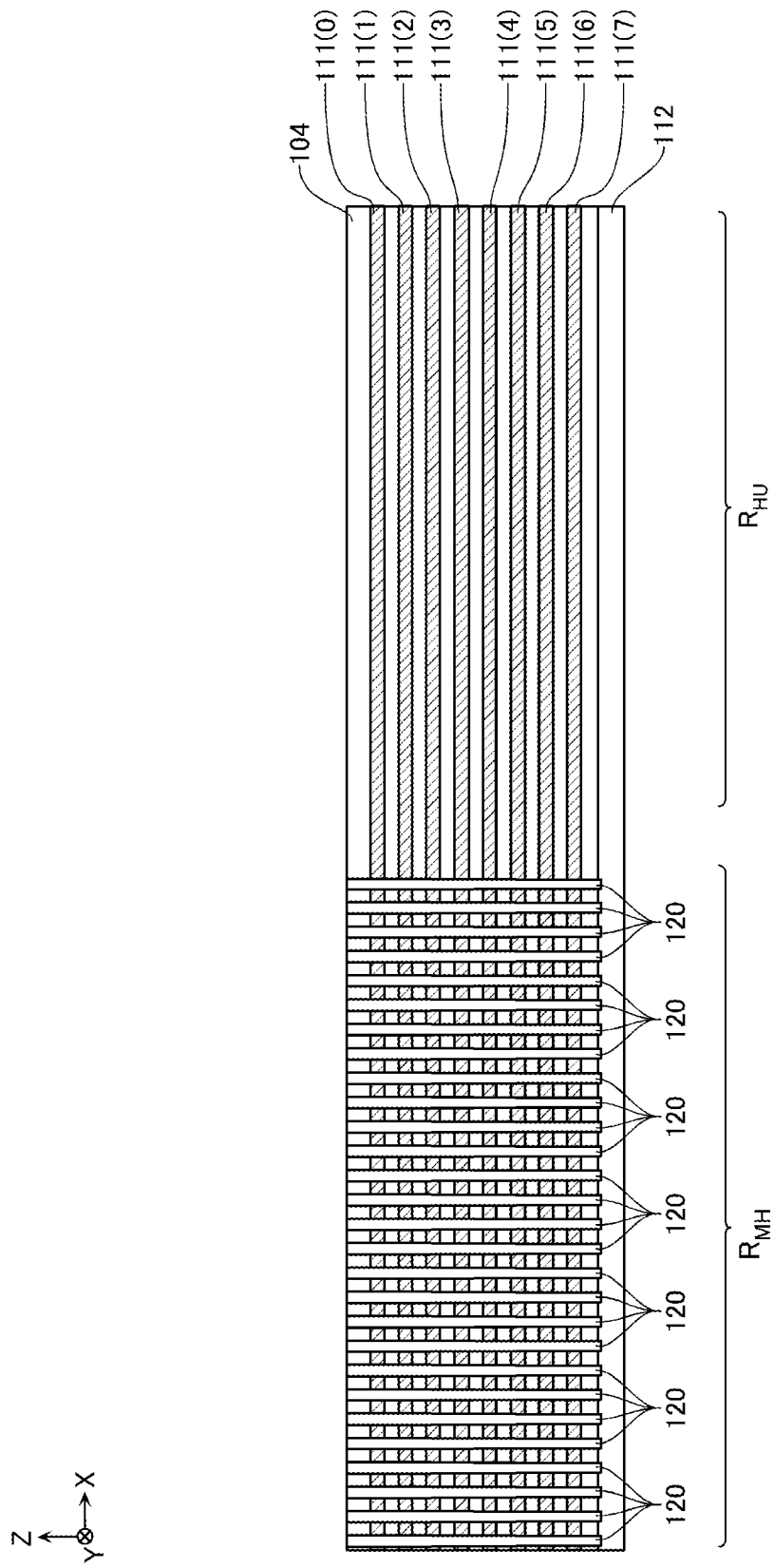
FIG. 10 is a schematic cross-sectional view illustrating the manufacturing method.

Next, for example, as illustrated in FIG. 10, the plurality of semiconductor layers 120 are formed. In this step, for example, an insulating layer 104 such as a silicon oxide ($SiO_2$) is formed on the upper surface of the structure described with reference to FIG. 9 by a method such as CVD. Next, through-holes are formed to penetrate the insulating layer 104, the plurality of insulating layers 101, and the plurality of sacrifice layers 111 by a method such as reactive ion etching (RIE). Further, the gate insulating film 130 (FIG. 5) and the semiconductor layer 120 are formed on the inner peripheral surface of the through-hole by a method such as CVD.

Figure 11:
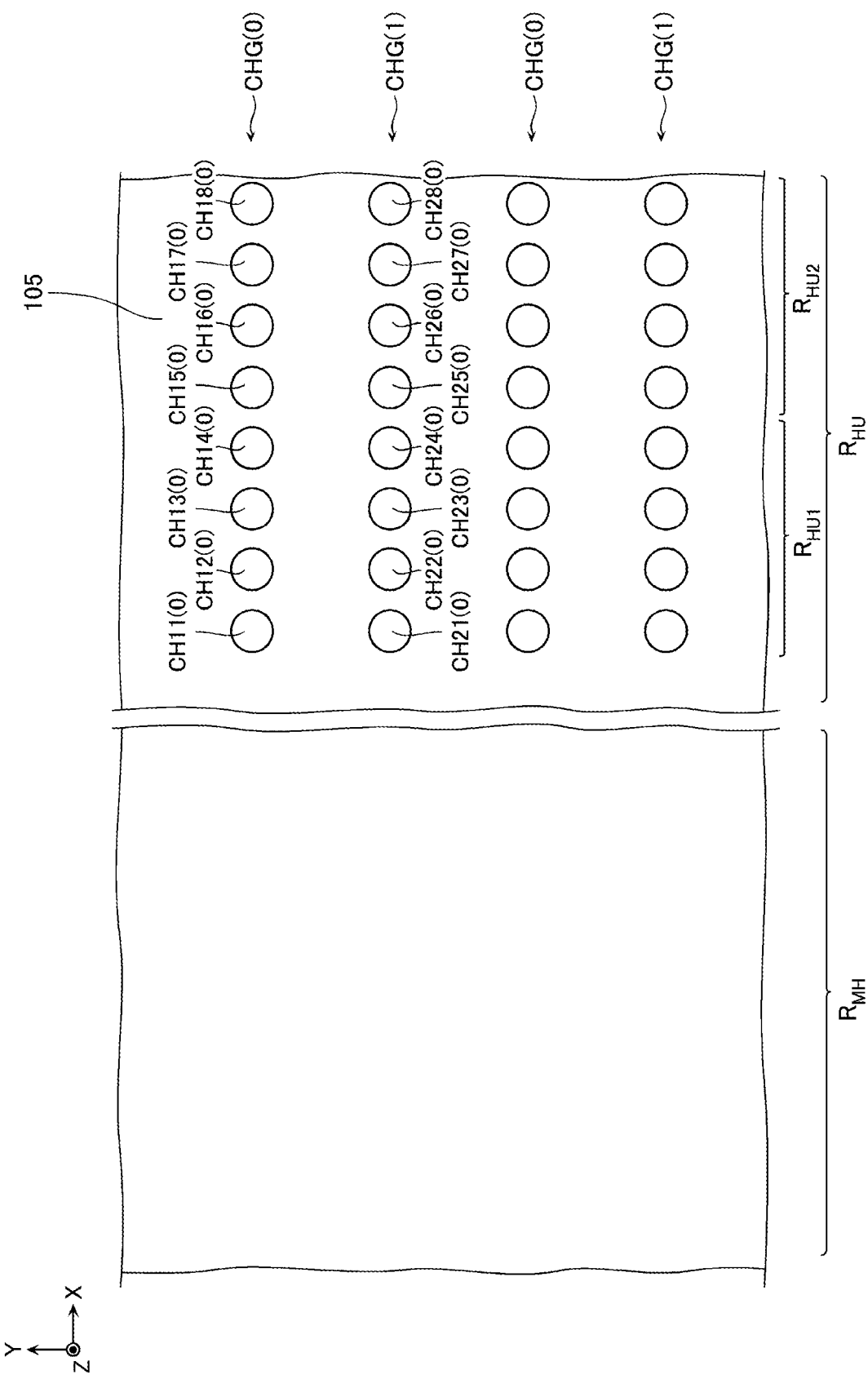
FIG. 11 is a schematic plan view illustrating the manufacturing method.
Figure 12:
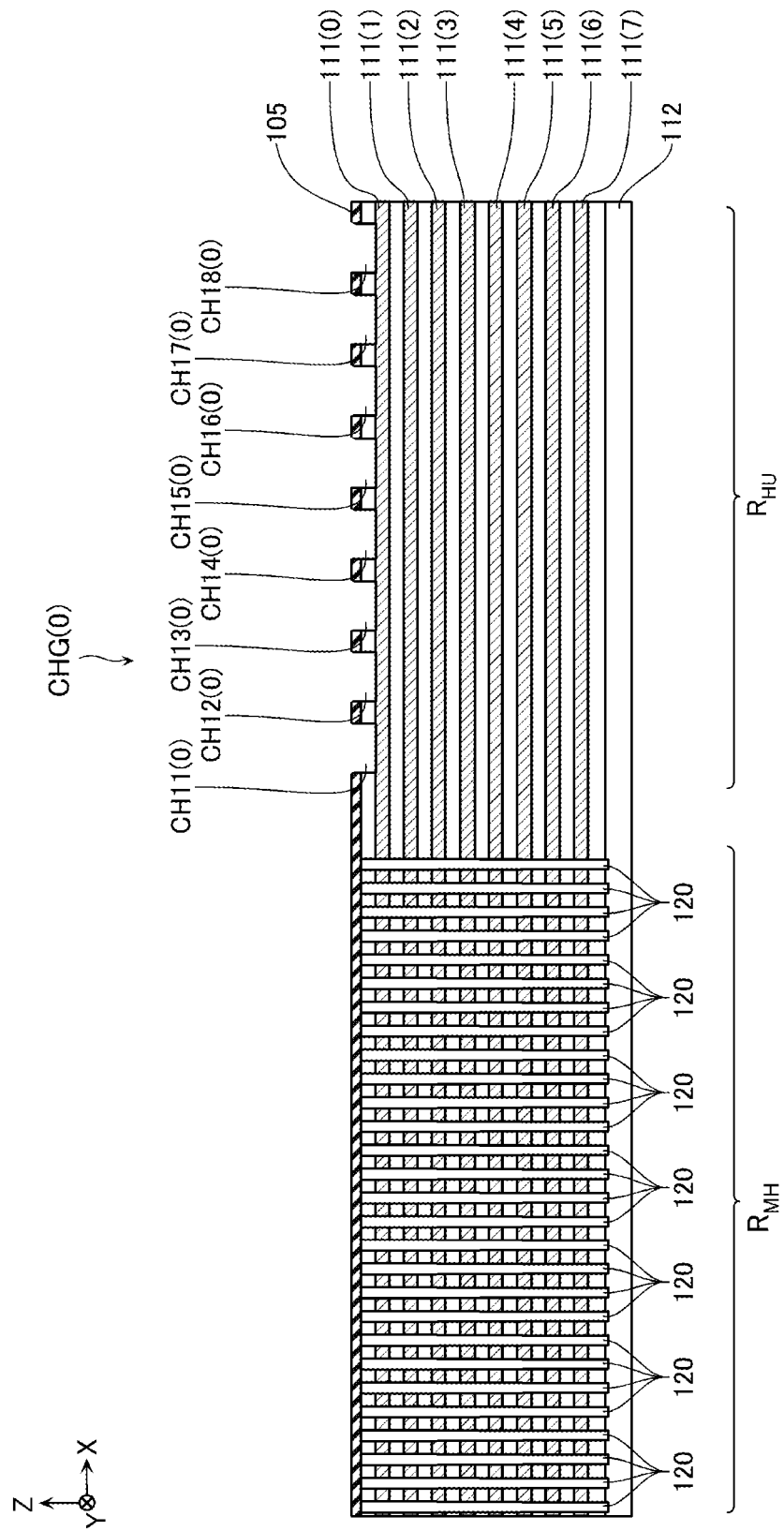
FIG. 12 is a schematic cross-sectional view illustrating the manufacturing method.

Next, for example, as illustrated in FIGS. 11 and 12, a plurality of contact holes CH(0) are formed at positions corresponding to the contact electrodes CC. For example, a hard mask 105 is formed on the upper surface of the structure described with reference to FIG. 10. Next, through-holes are formed to penetrate the hard mask 105 and the insulating layer 104 and to expose the upper surface of the sacrifice layer 111 by a method such as RIE.

Moreover, in the following description, the sacrifice layer 111 (n is an integer of 1 or more) counted from above may be referred to as a sacrifice layer 111(n−1). Further, one of a plurality of contact holes CH that exposes the upper surface of a sacrifice layer 111(n) and penetrates all sacrifice layers 111 provided above that may be referred to as a contact hole CH(n). Further, the sacrifice layer 111(n−1) may be referred to as the $n^{th}$ sacrifice layer 111. As illustrated in FIG. 12 and others, the plurality of sacrifice layers 111(n) are equidistantly arranged in the Z direction. Therefore, n of the contact hole CH(n) represents the level of the length (depth) of the contact hole CH in the Z direction.

Further, with regard to the plurality of contact holes CH illustrated in FIG. 11 among the plurality of contact holes CH arranged in the hook-up region $R_{HU}$, the contact hole CH which is the $a^{th}$ one (a is an integer of 1 or more) counted from the +Y direction to the −Y direction and is the $b^{th}$ one (b is an integer of 1 or more) counted from the −X direction to the +X direction may be referred to as a contact hole CHab.

A row of eight contact holes CH arranged in the X direction may be referred to as a contact hole row CHG. As illustrated in FIG. 11, two contact hole rows CHG(0) and CHG(1) are alternately arranged in the Y direction in the hook-up region $R_{HU}$. Further, the contact hole row CHG(0) is formed at the same position as the contact electrode row CCG(0), and the contact hole row CHG(1) is formed at the same position as the contact electrode row CCG(1).

Next, a resist pattern for processing the contact holes CH is created using lithography (also referred to as a photo engraving process (PEP)).

Figure 13:
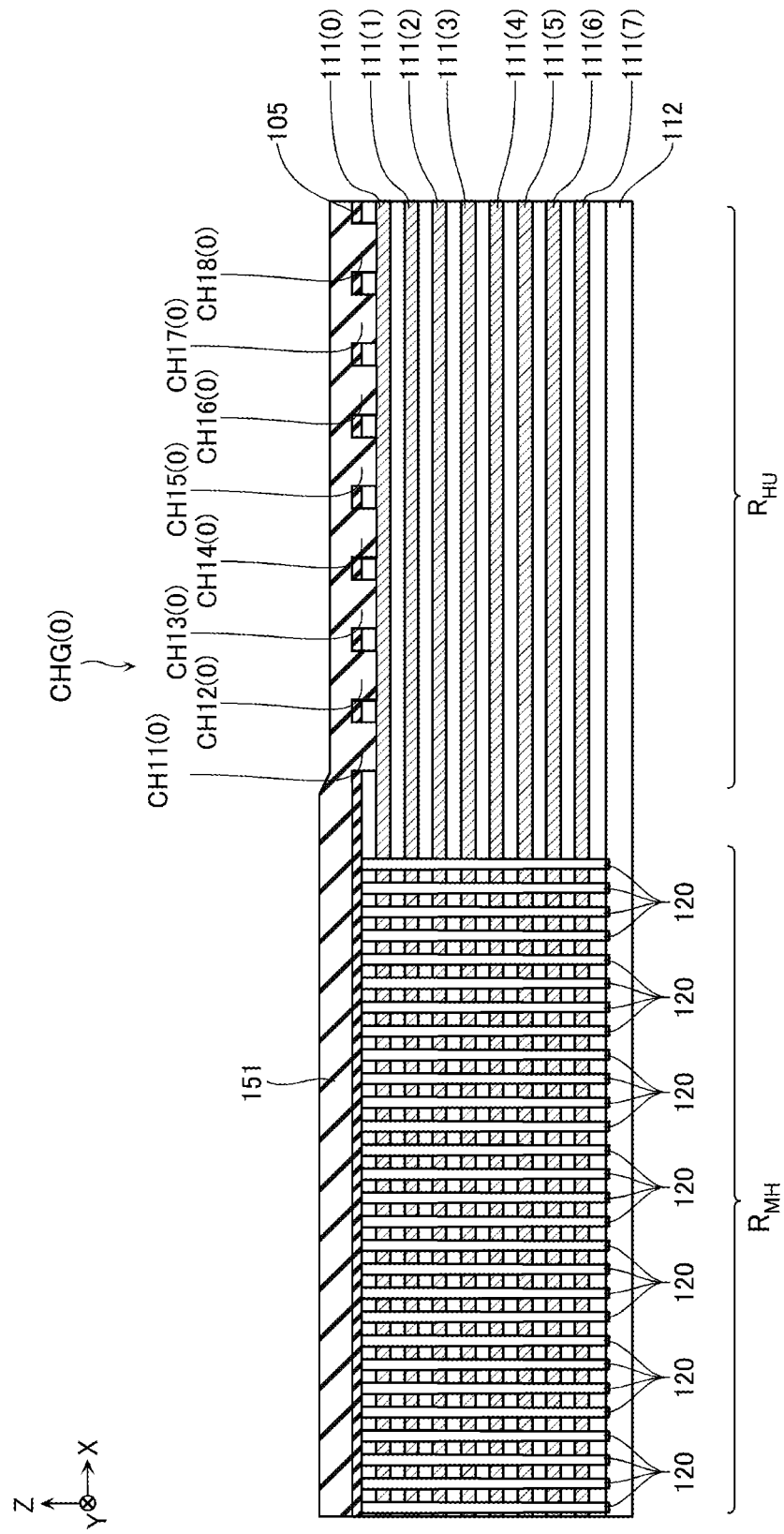
FIG. 13 is a schematic cross-sectional view illustrating the manufacturing method.

For example, as illustrated in FIG. 13, a resist 151 is applied to the upper surface of the structure described with reference to FIG. 12.

Moreover, FIGS. 12 and 13 show the cross section corresponding to the contact hole row CHG(0). The structure of the cross section corresponding to the contact hole row CHG(1) is the same as the structure of the cross section illustrated in FIGS. 12 and 13. Therefore, the illustration of a cross-sectional view corresponding to the contact hole row CHG(1) is omitted.

Figure 14:
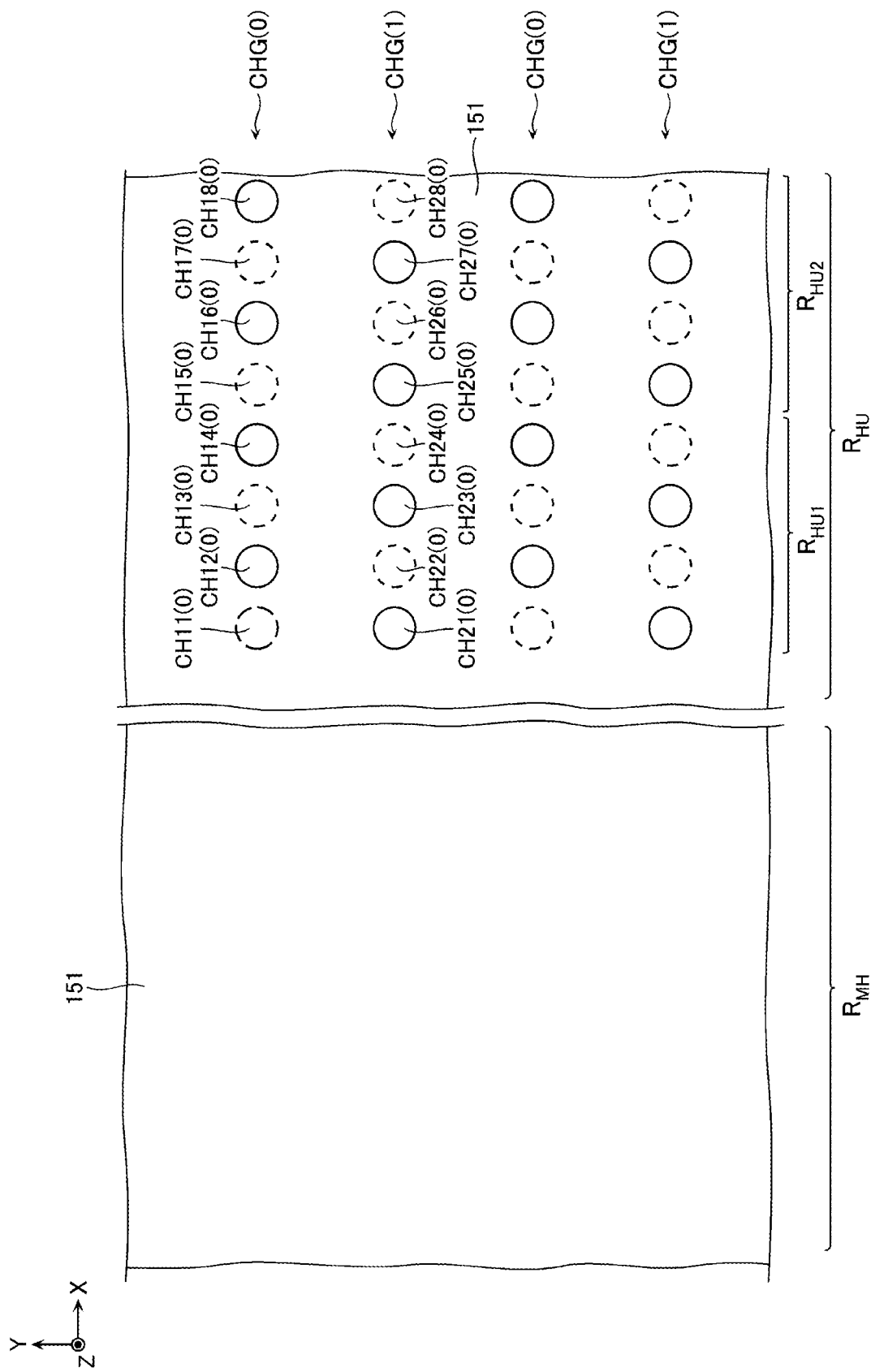
FIG. 14 is a schematic plan view illustrating the manufacturing method.
Figure 15:
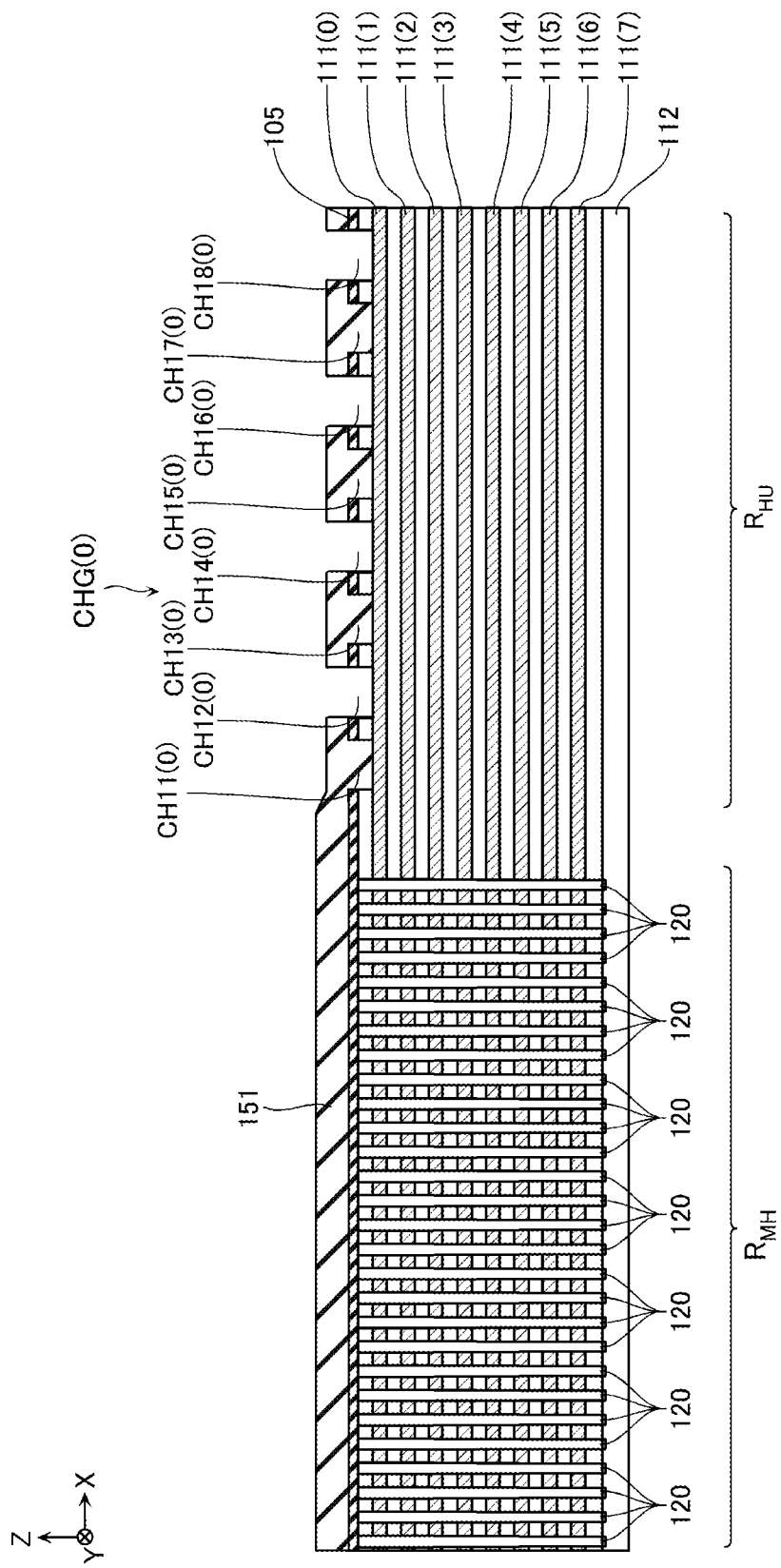
FIG. 15 is a schematic cross-sectional view illustrating the manufacturing method.
Figure 16:
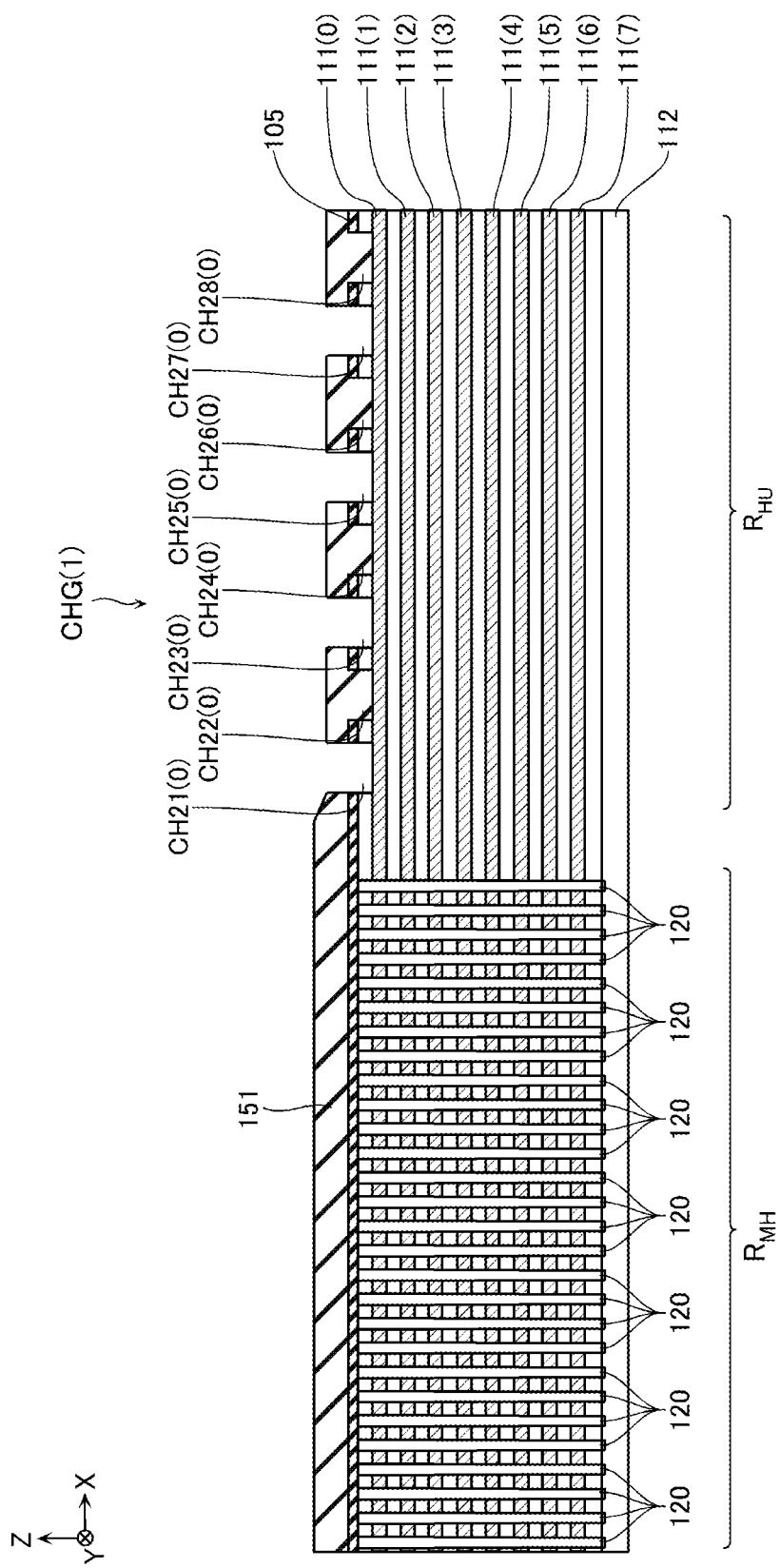
FIG. 16 is a schematic cross-sectional view illustrating the manufacturing method.

Next, for example, as illustrated in FIGS. 14 to 16, an exposure device (not illustrated) exposes the positions of contact holes CH12(0), CH14(0), CH16(0), CH18(0), CH21 (0), CH23(0), CH25(0), CH27(0), CH32(0), CH34(0), CH36(0), CH38(0), CH41(0), CH43(0), CH45(0), and CH47(0) based on a photomask.

Then, by developing the resist 151 with a developer corresponding thereto, the resist at the positions of the contact holes CH12(0), CH14(0), CH16(0), CH18(0), CH21 (0), CH23(0), CH25(0), CH27(0), CH32(0), CH34(0), CH36(0), CH38(0), CH41(0), CH43(0), CH45(0), and CH47(0) is removed. Thus, these contact holes are opened.

Figure 17:
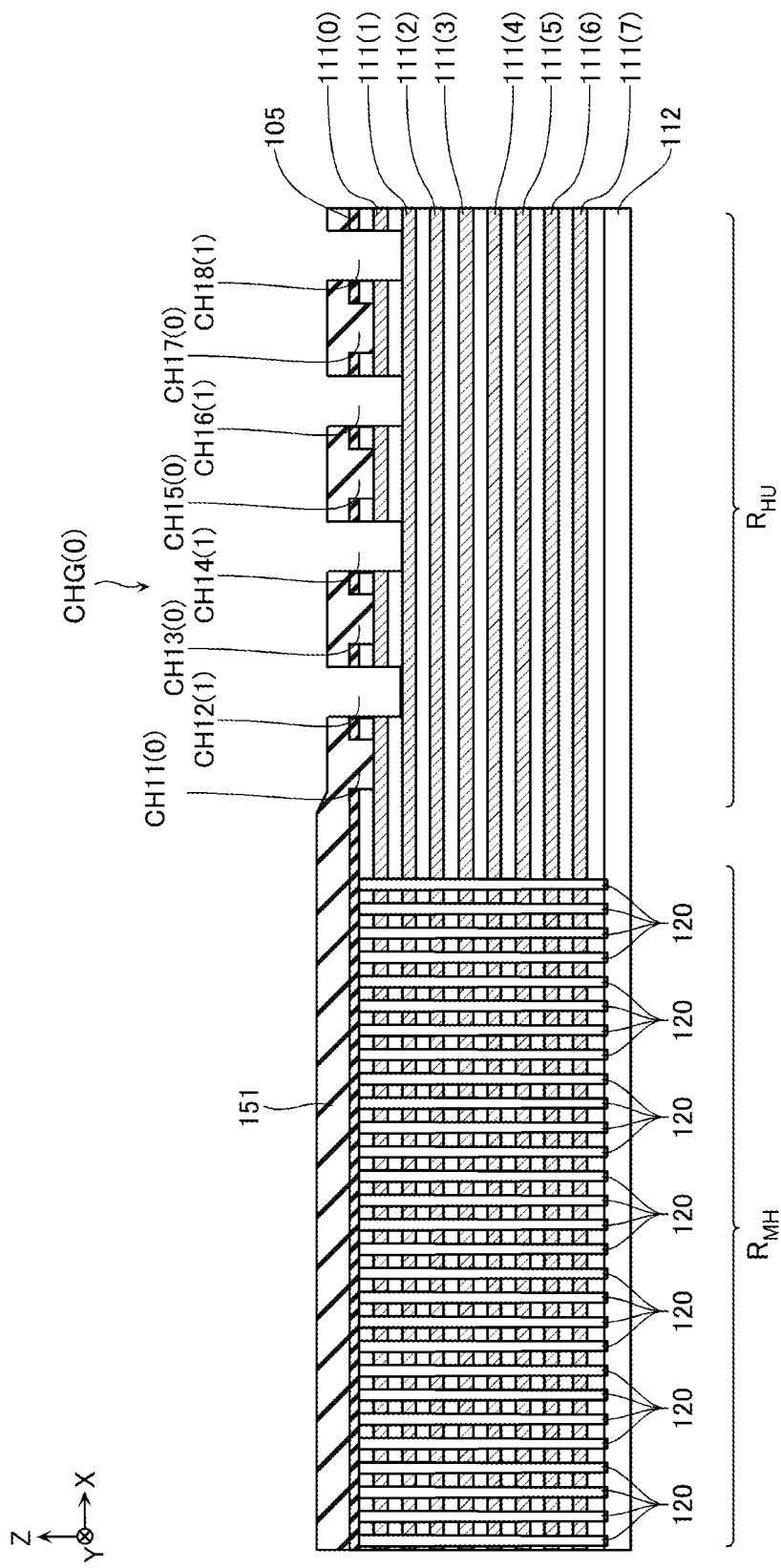
FIG. 17 is a schematic cross-sectional view illustrating the manufacturing method.
Figure 18:
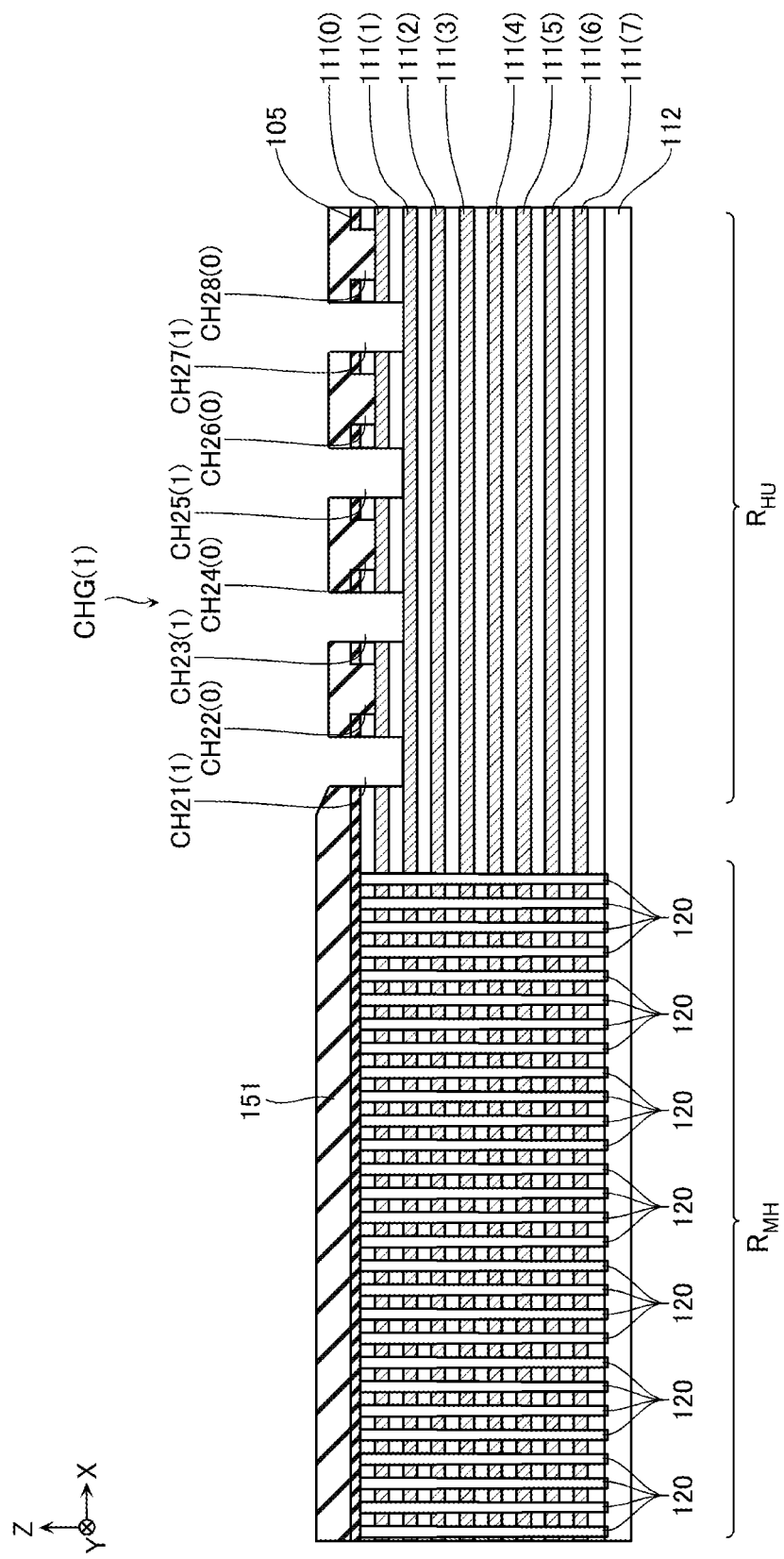
FIG. 18 is a schematic cross-sectional view illustrating the manufacturing method.

Next, for example, as illustrated in FIGS. 17 and 18, the sacrifice layers 111 and the insulating layers 101 are removed one by one with respect to the opened contact holes CH12(0), CH14(0), CH16(0), CH18(0), CH21(0), CH23(0), CH25(0), and CH27(0) among the contact holes CH. Thus, contact holes CH12(1), CH14(1), CH16(1), CH18(1), CH21 (1), CH23(1), CH25(1), and CH27(1) are formed to reach the second sacrifice layer 111(1). This step is performed by a method such as, for example, RIE.

Moreover, the sacrifice layers 111 and the insulating layers 101 are also removed one by one with respect to the contact holes CH32(0), CH34(0), CH36(0), CH38(0), CH41 (0), CH43(0), CH45(0), and CH47(0).

Figure 19:
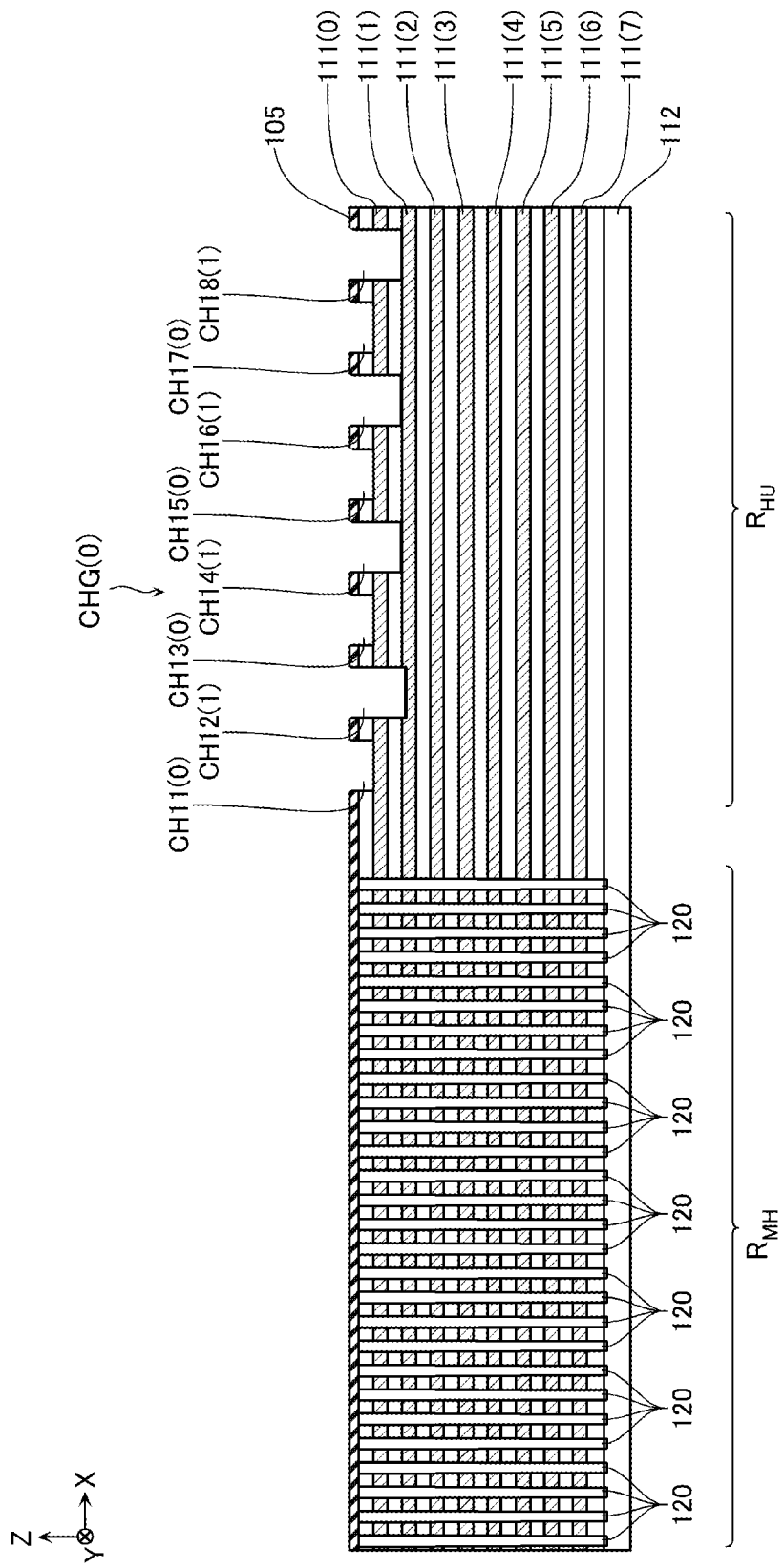
FIG. 19 is a schematic cross-sectional view illustrating the manufacturing method.
Figure 20:
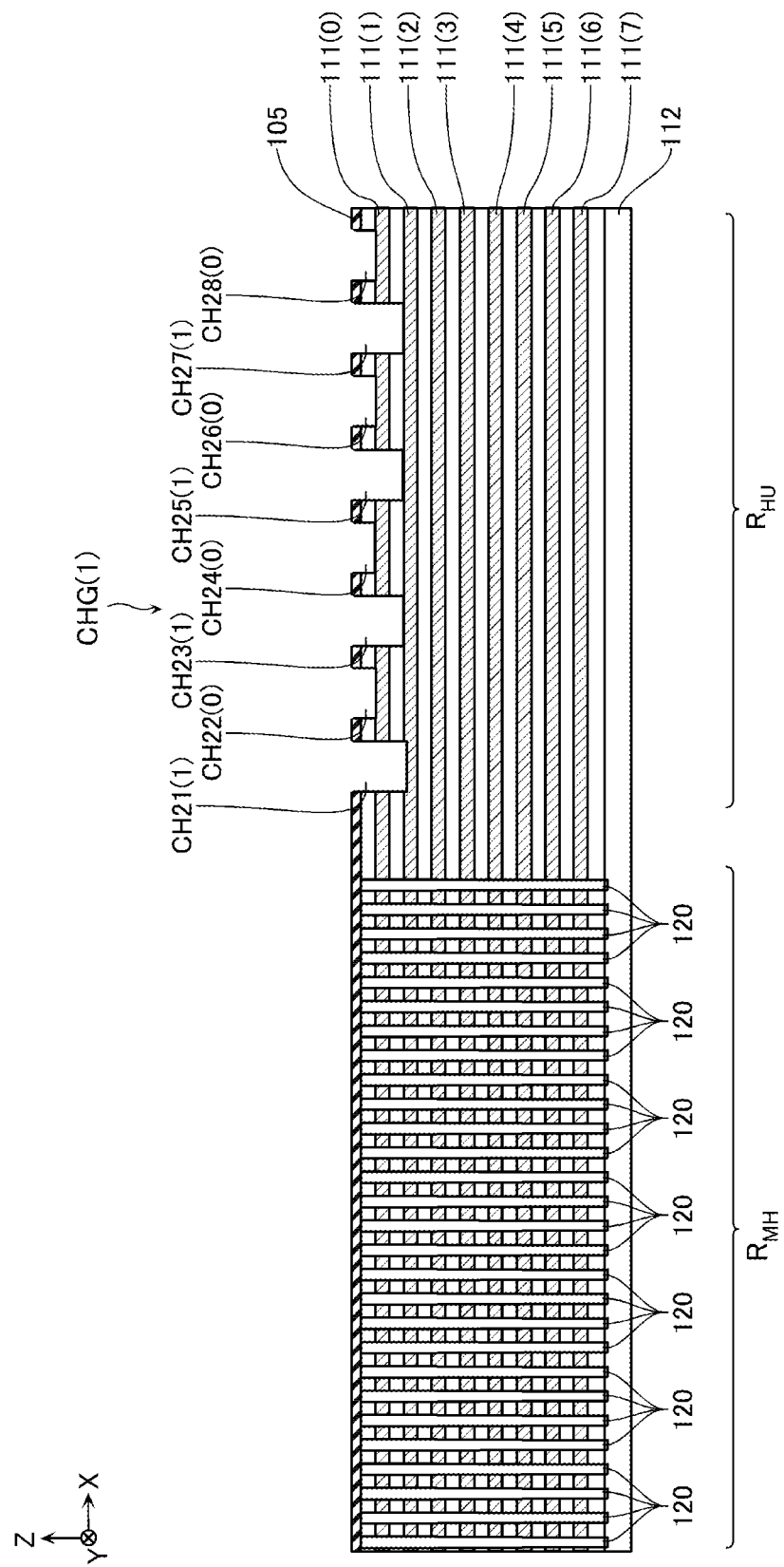
FIG. 20 is a schematic cross-sectional view illustrating the manufacturing method.

Then, as illustrated in FIGS. 19 and 20, the resist 151 is removed.

Figure 21:
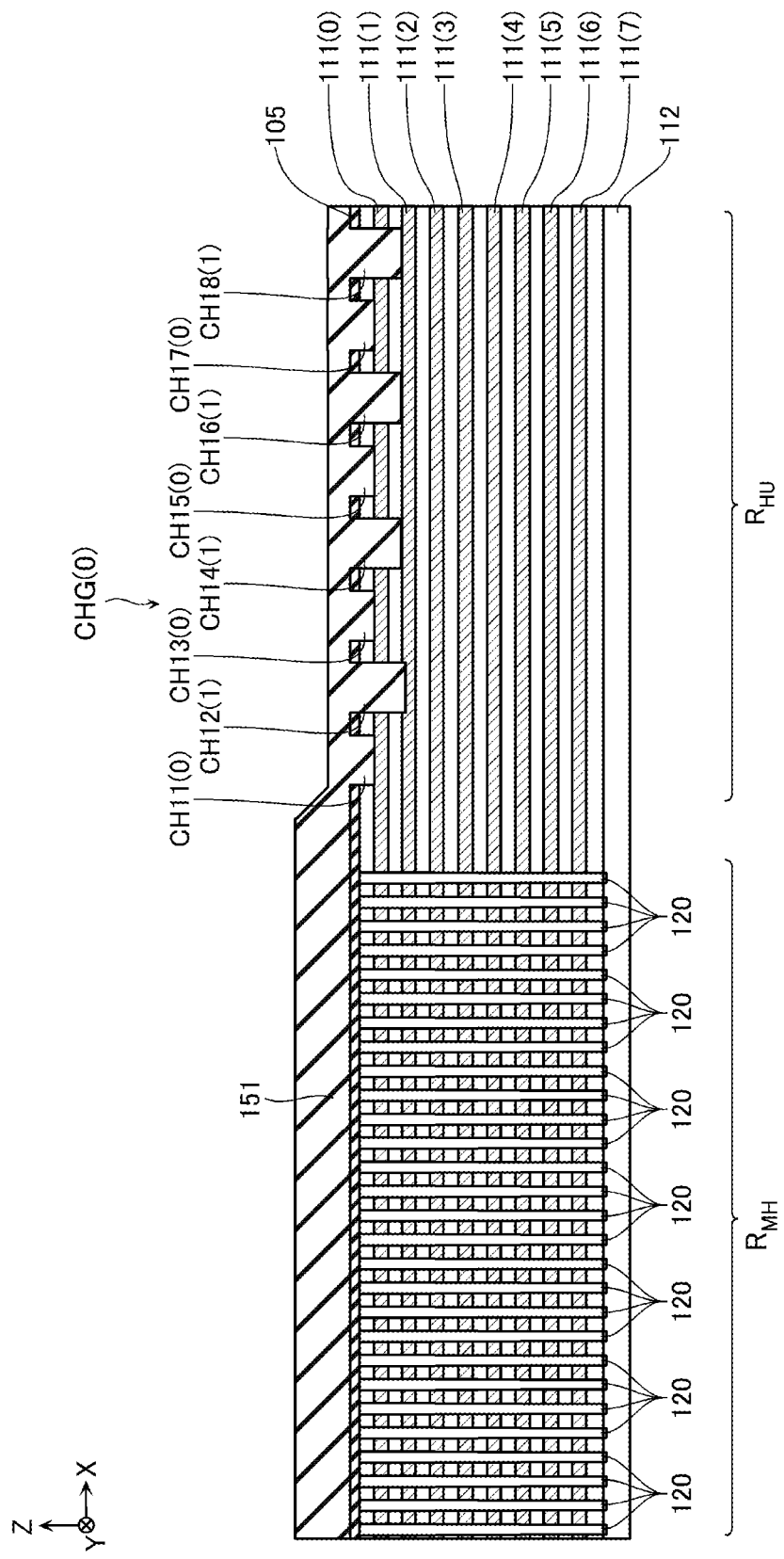
FIG. 21 is a schematic cross-sectional view illustrating the manufacturing method.
Figure 22:
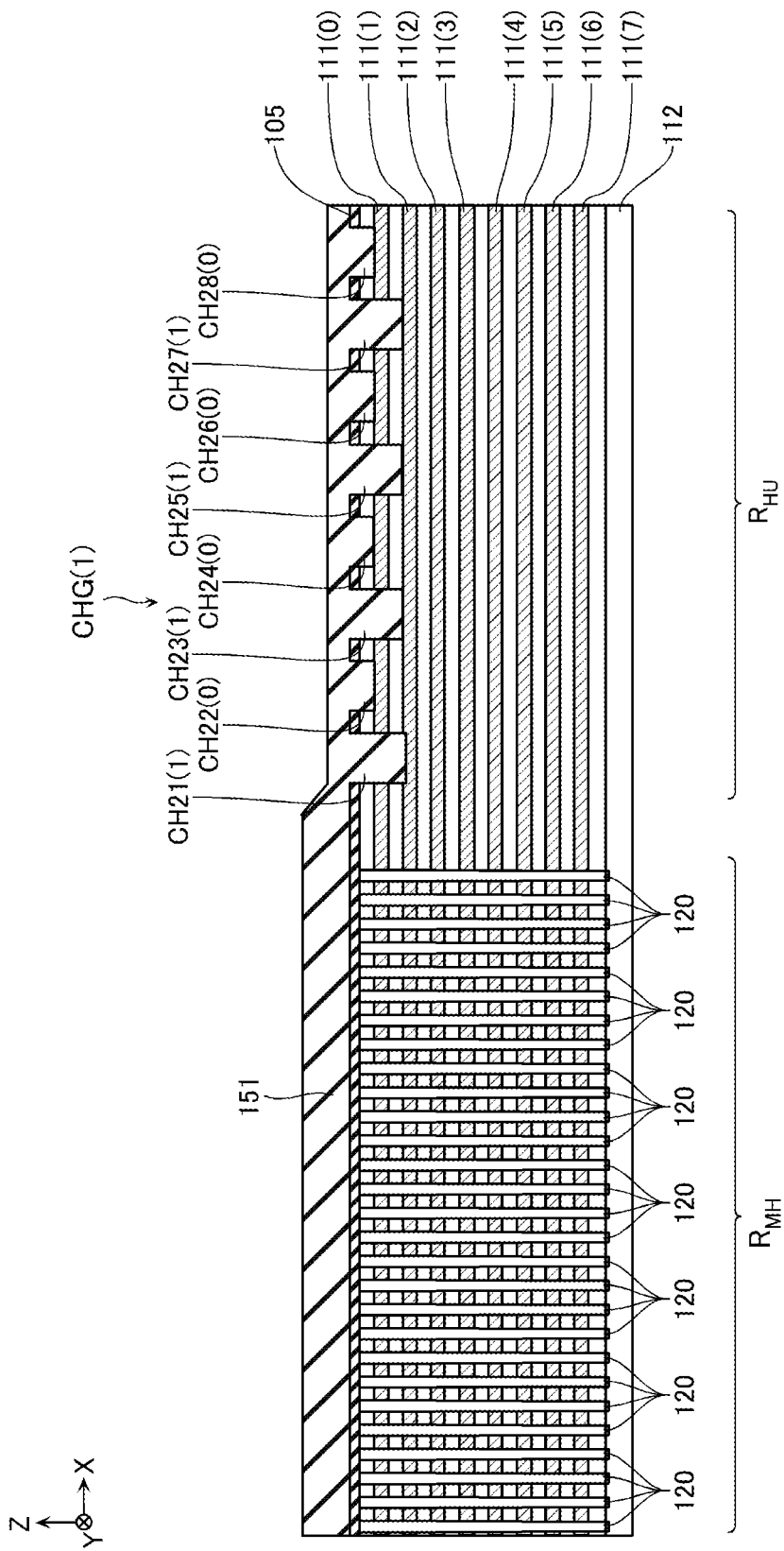
FIG. 22 is a schematic cross-sectional view illustrating the manufacturing method.

Next, as illustrated in FIGS. 21 and 22, the resist 151 is applied to the upper surface of the structure described with reference to FIGS. 19 and 20.

Figure 23:
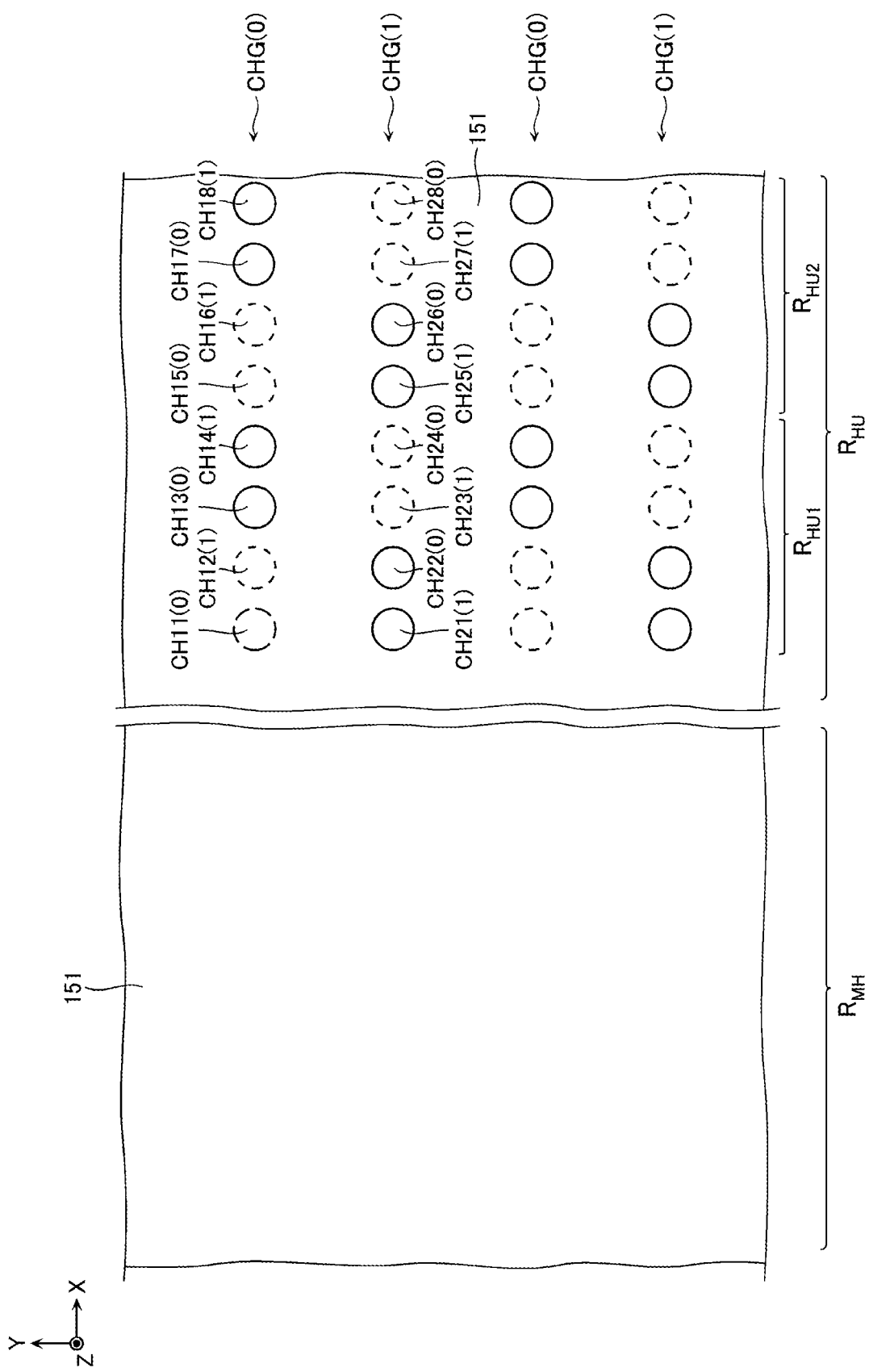
FIG. 23 is a schematic plan view illustrating the manufacturing method.
Figure 24:
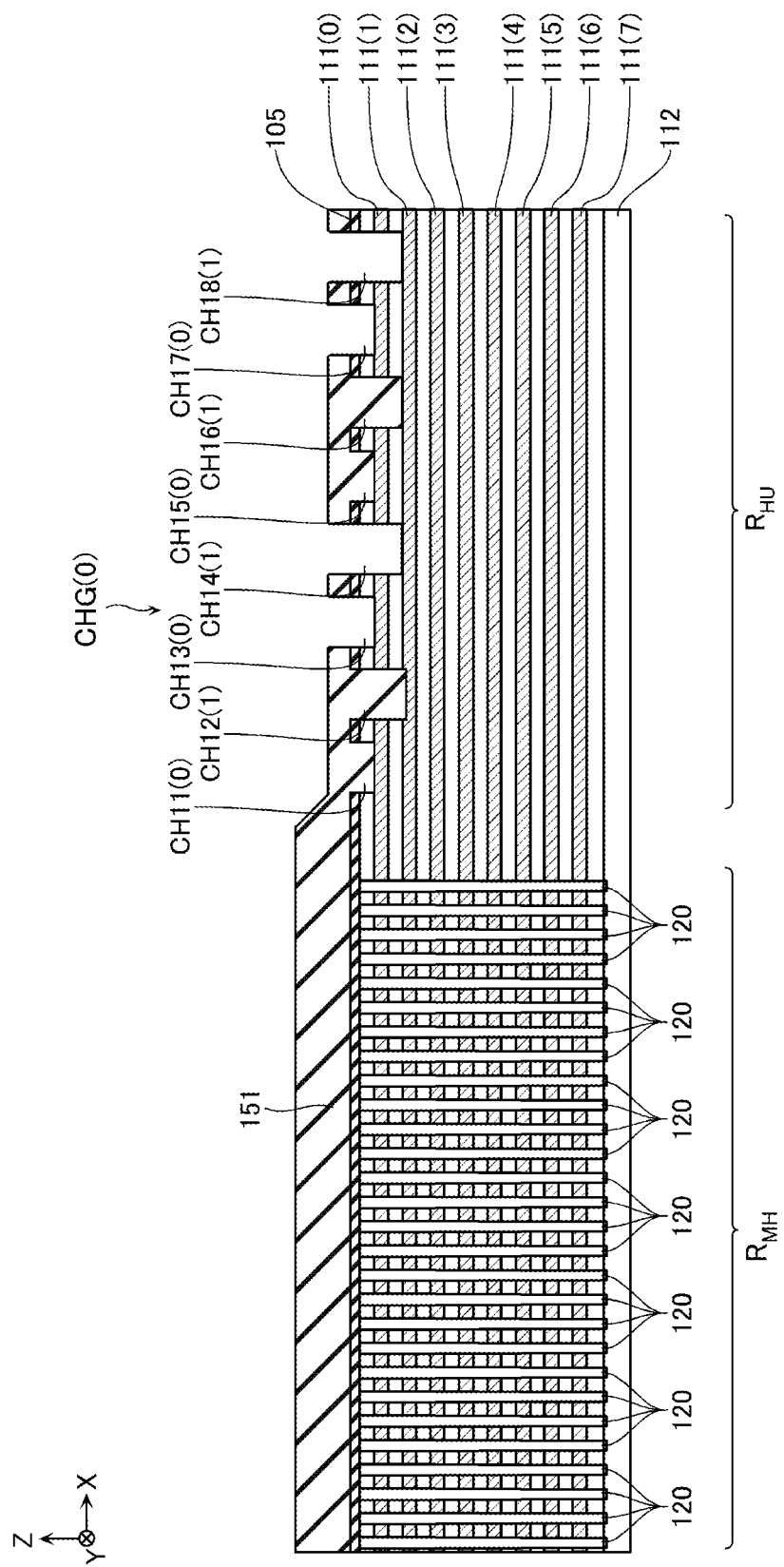
FIG. 24 is a schematic cross-sectional view illustrating the manufacturing method.
Figure 25:
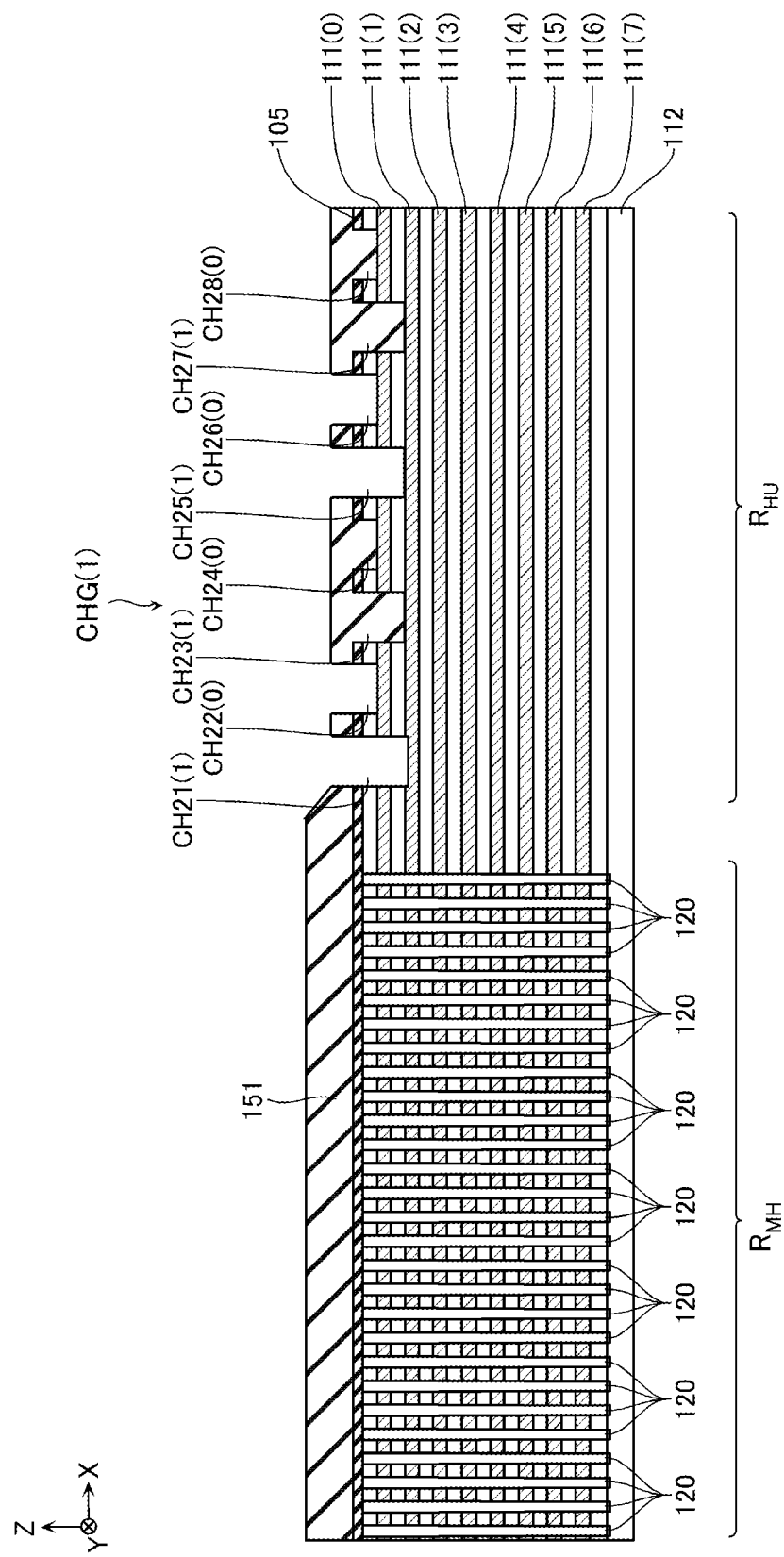
FIG. 25 is a schematic cross-sectional view illustrating the manufacturing method.

Next, for example, as illustrated in FIGS. 23 to 25, the exposure device (not illustrated) exposes the positions of contact holes CH13(0), CH14(1), CH17(0), CH18(1), CH21 (1), CH22(0), CH25(1), CH26(0), CH33(0), CH34(1), CH37(0), CH38(1), CH41(1), CH42(0), CH45(1), and CH46(0) based on a photomask.

Then, by developing the resist 151 with a developer corresponding thereto, the resist at the positions of the contact holes CH13(0), CH14(1), CH17(0), CH18(1), CH21 (1), CH22(0), CH25(1), CH26(0), CH33(0), CH34(1), CH37(0), CH38(1), CH41(1), CH42(0), CH45(1), and CH46(0) is removed. Thus, these contact holes are opened.

Figure 26:
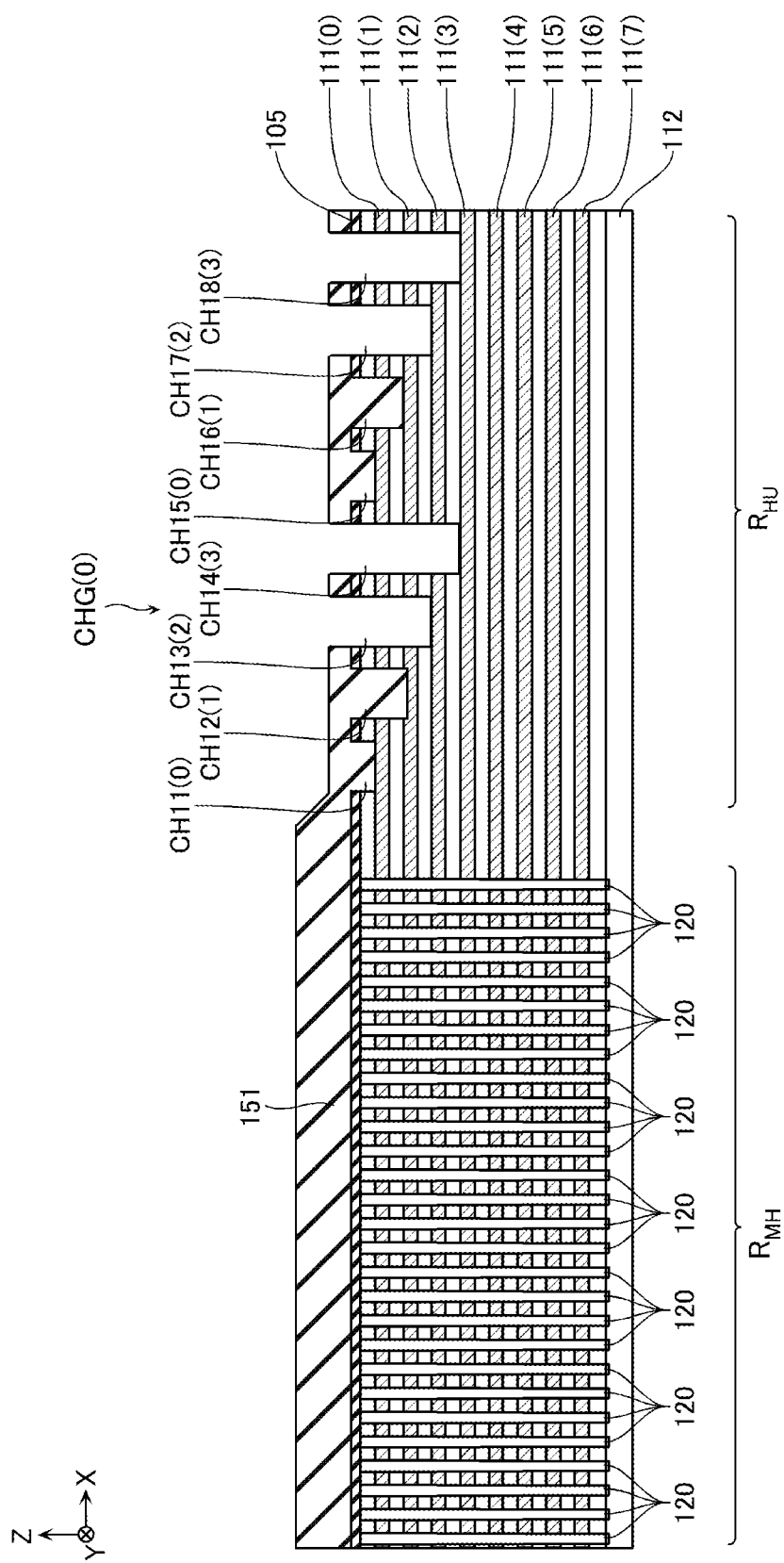
FIG. 26 is a schematic cross-sectional view illustrating the manufacturing method.
Figure 27:
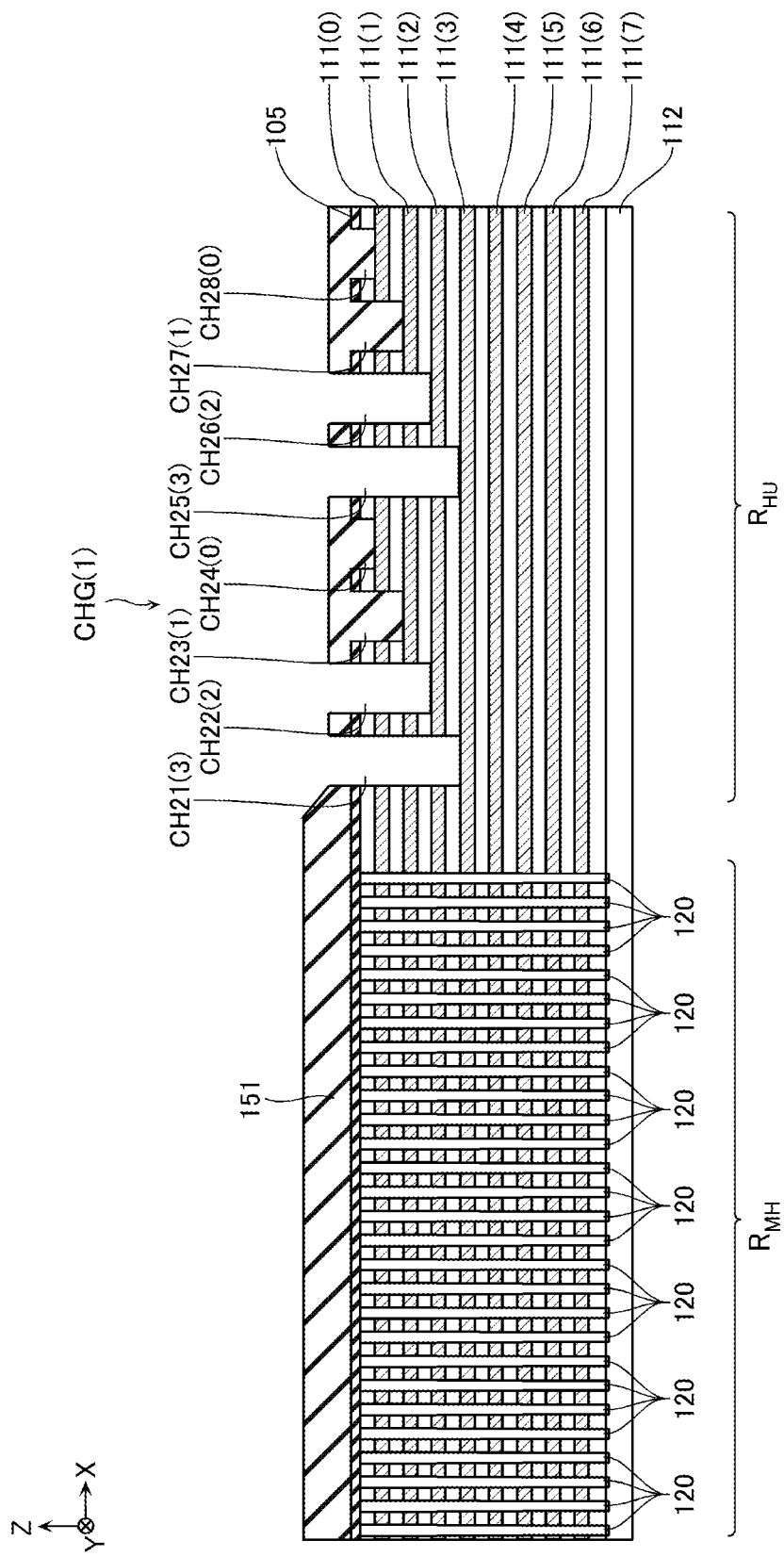
FIG. 27 is a schematic cross-sectional view illustrating the manufacturing method.

Next, for example, as illustrated in FIGS. 26 and 27, the sacrifice layers 111 and the insulating layers 101 are removed two by two with respect to the opened contact holes CH13(0), CH14(1), CH17(0), CH18(1), CH21(1), CH22(0), CH25(1), and CH26(0) among the contact holes CH. Thus, contact holes CH13(2), CH14(3), CH17(2), CH18(3), CH21 (3), CH22(2), CH25(3), and CH26(2) are formed to reach the third and fourth sacrifice layers 111(2) and 111(3). This step is performed by, for example, RIE.

Moreover, the sacrifice layers 111 and the insulating layers 101 are also removed two by two with respect to the contact holes CH33(0), CH34(1), CH37(0), CH38(1), CH41 (1), CH42(0), CH45(1), and CH26(0).

Figure 28:
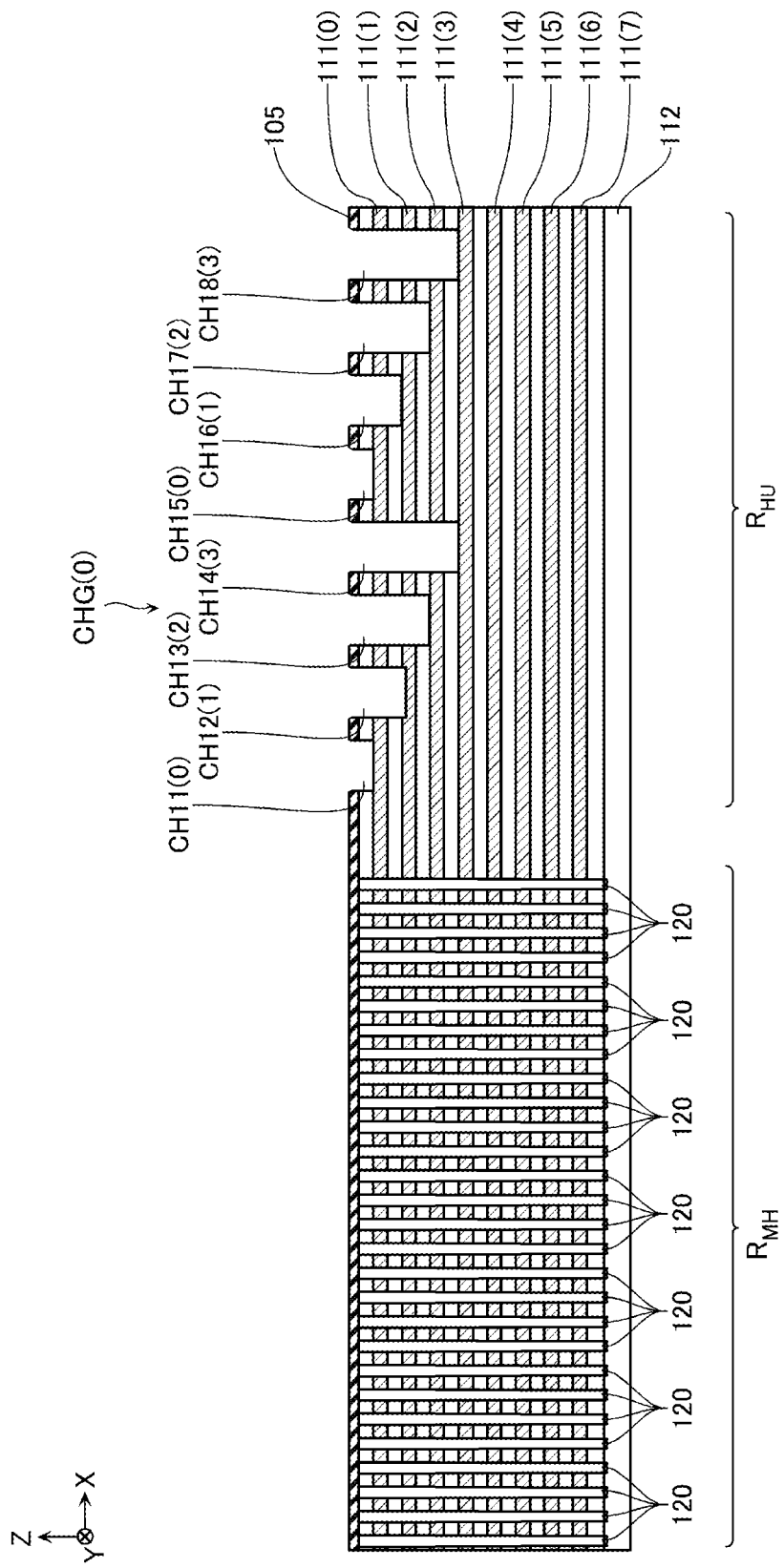
FIG. 28 is a schematic cross-sectional view illustrating the manufacturing method.
Figure 29:
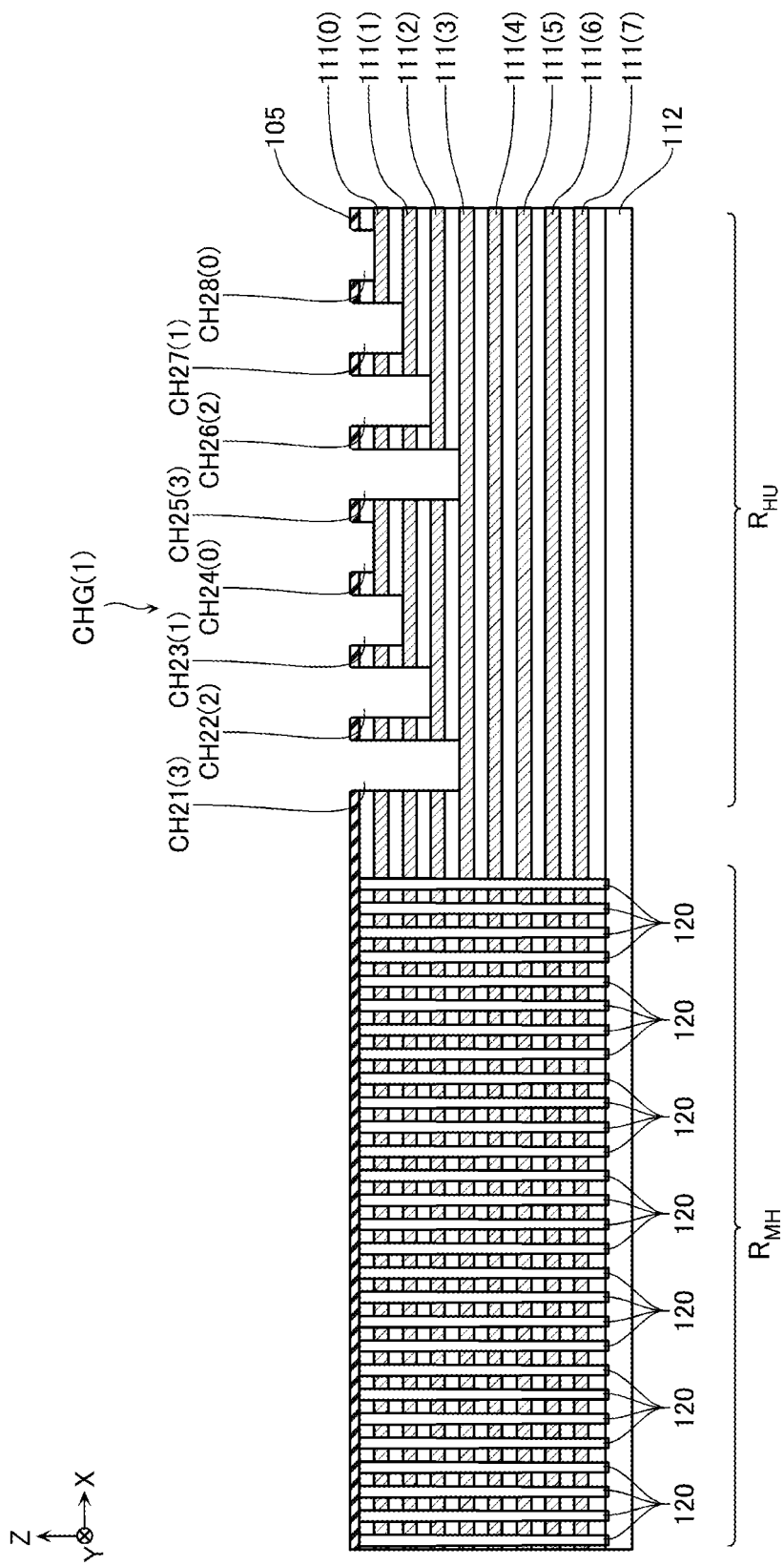
FIG. 29 is a schematic cross-sectional view illustrating the manufacturing method.

Then, as illustrated in FIGS. 28 and 29, the resist 151 is removed.

Figure 30:
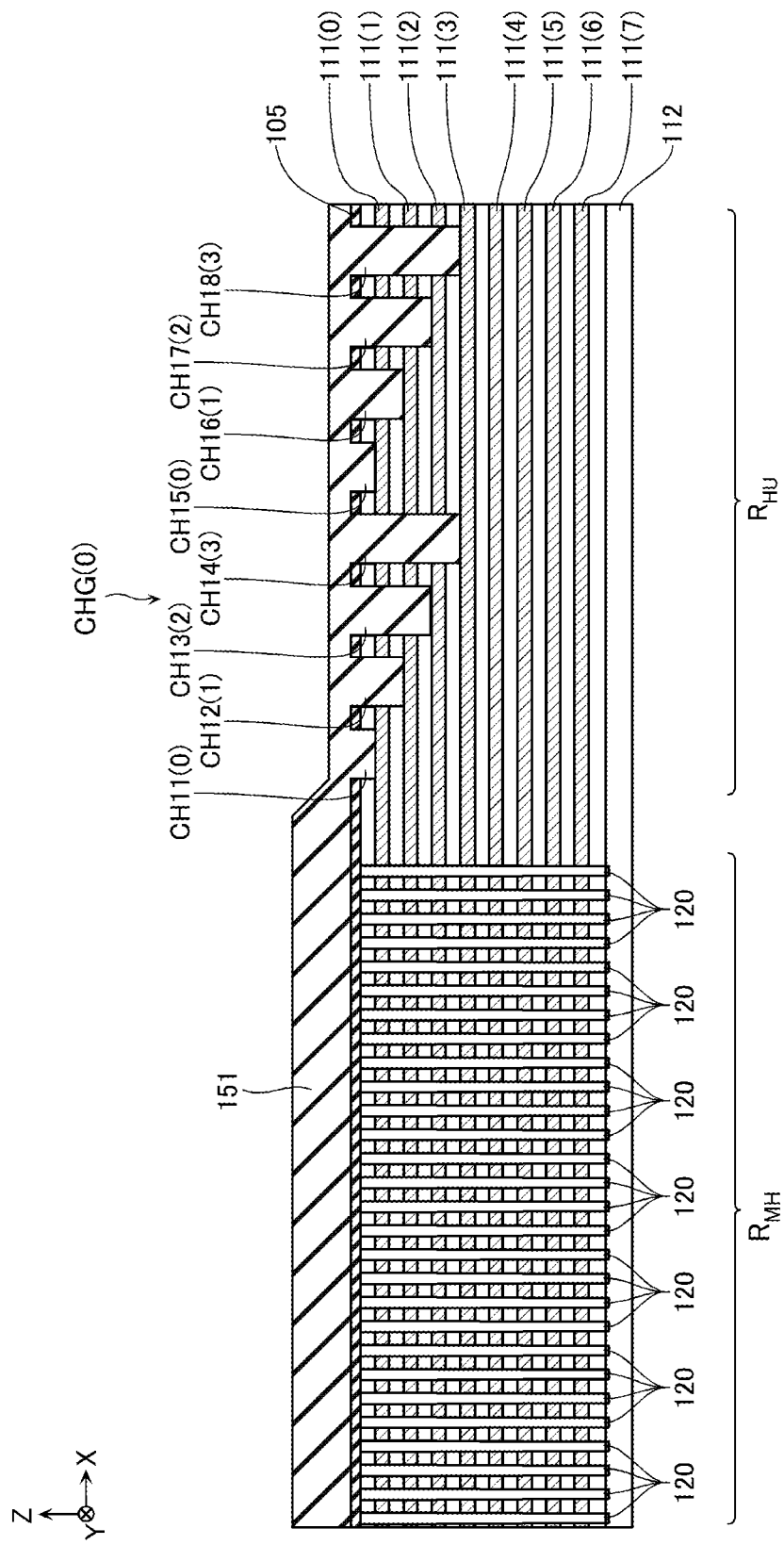
FIG. 30 is a schematic cross-sectional view illustrating the manufacturing method.
Figure 31:
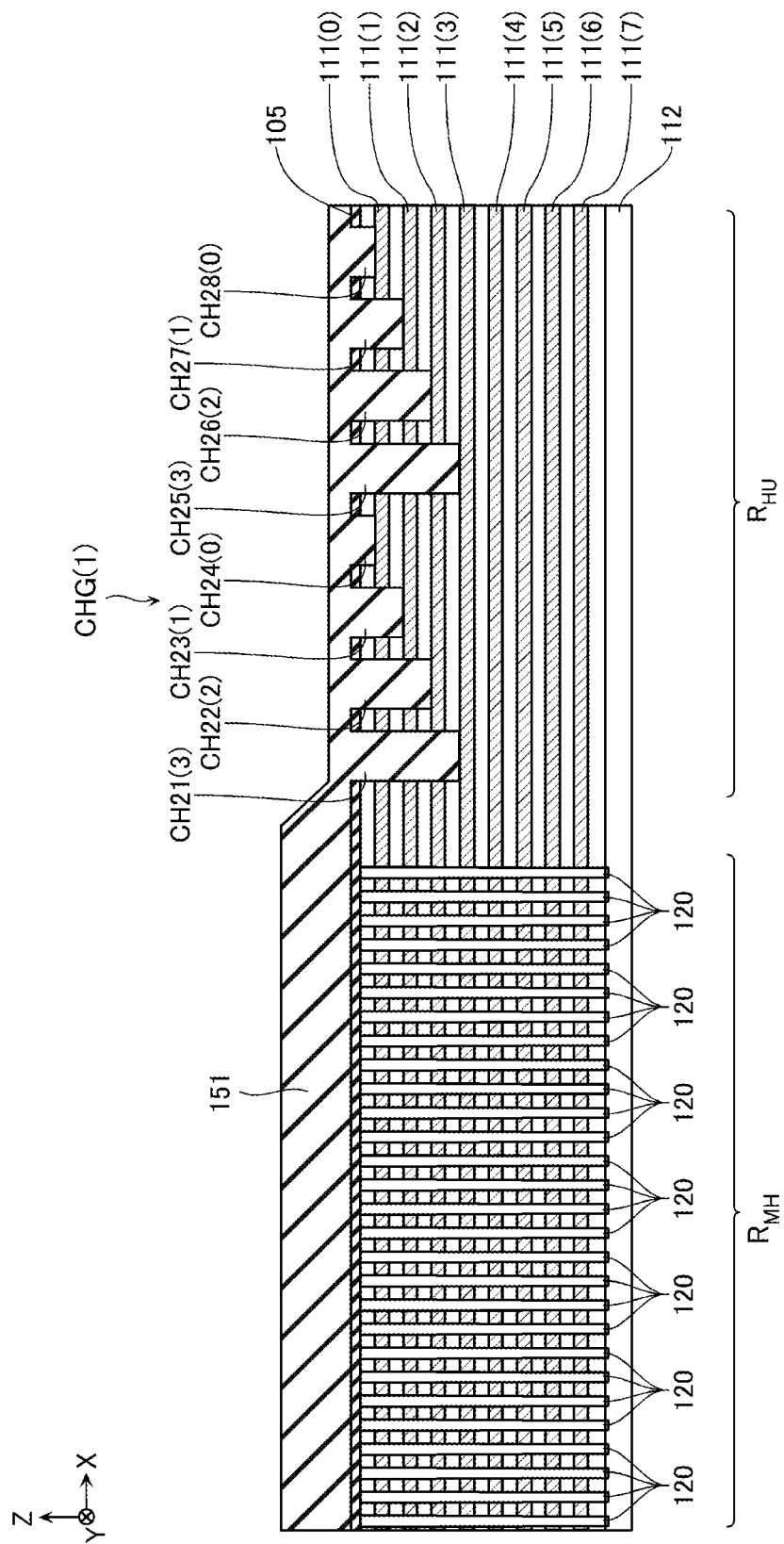
FIG. 31 is a schematic cross-sectional view illustrating the manufacturing method.

Next, as illustrated in FIGS. 30 and 31, the resist 151 is applied to the upper surface of the structure described with reference to FIGS. 28 and 29.

Figure 32:
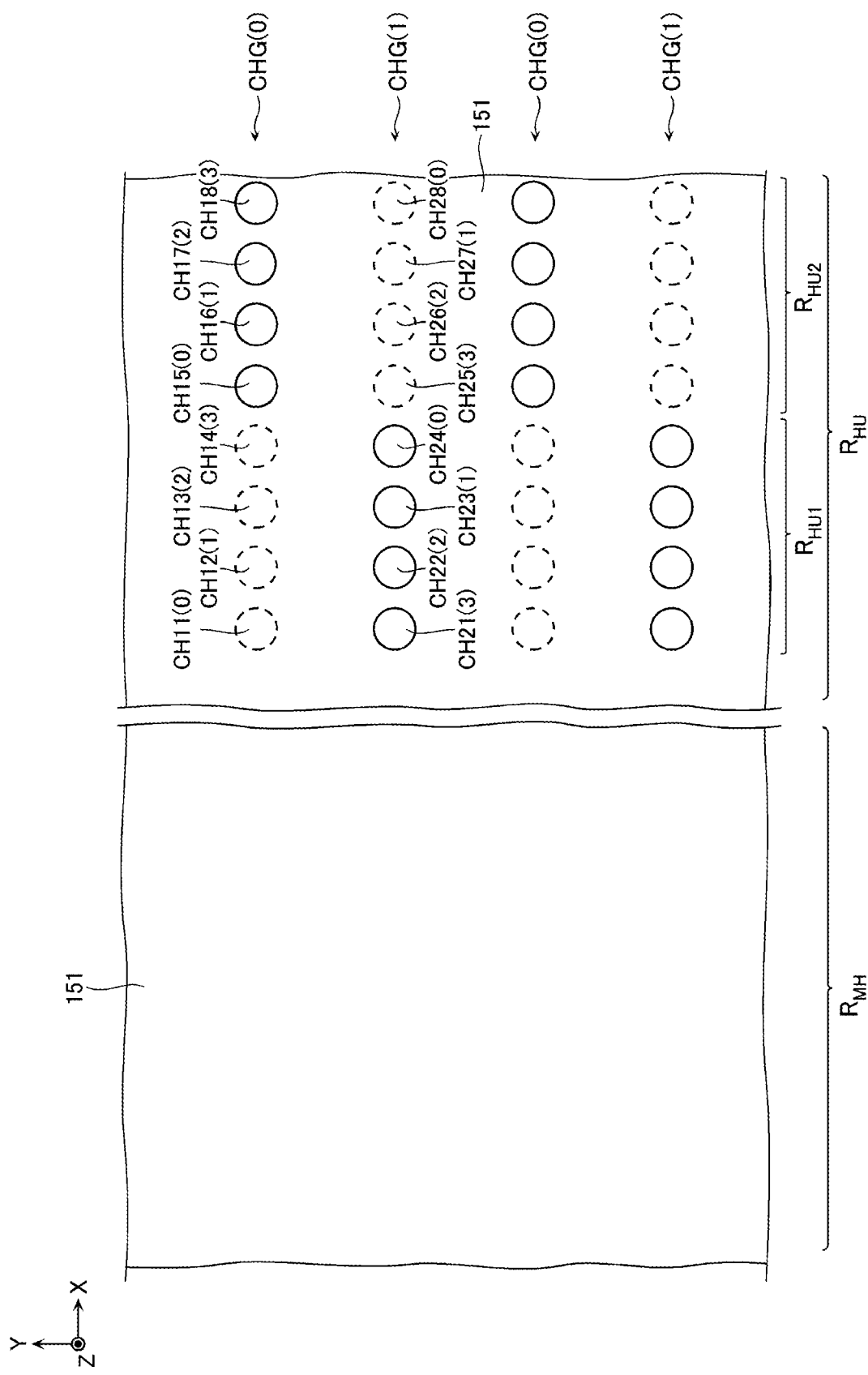
FIG. 32 is a schematic plan view illustrating the manufacturing method.
Figure 33:
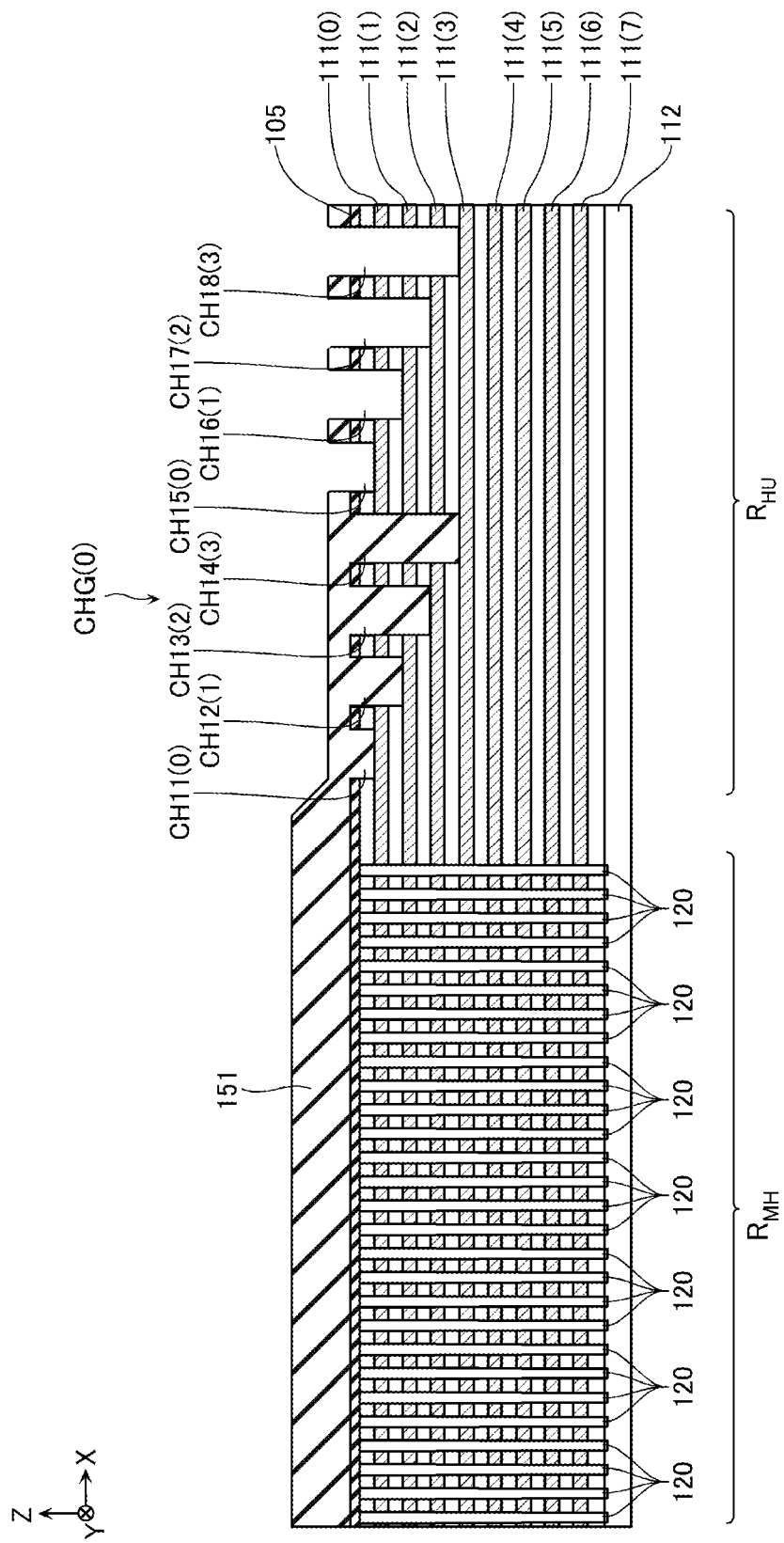
FIG. 33 is a schematic cross-sectional view illustrating the manufacturing method.
Figure 34:
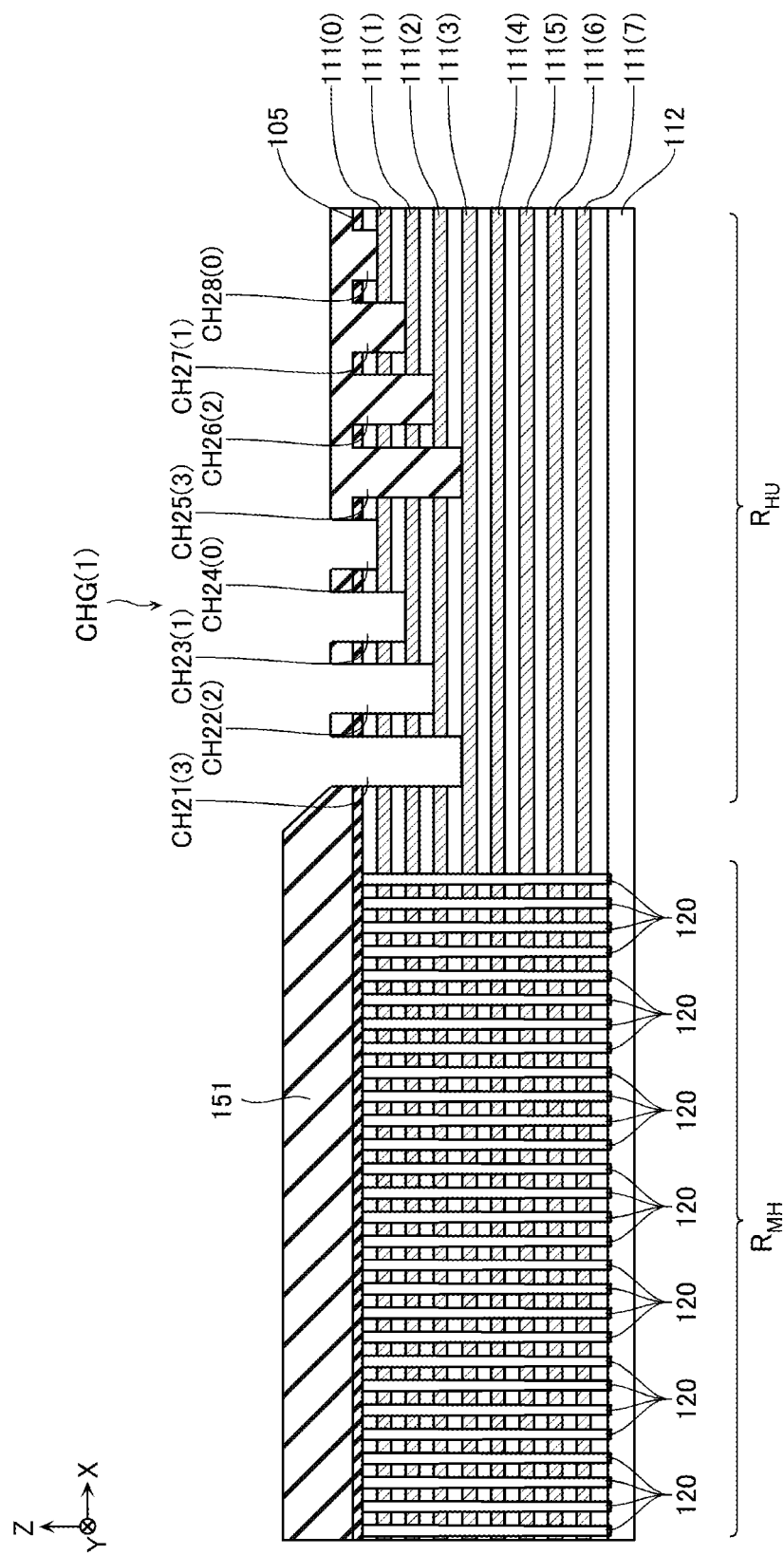
FIG. 34 is a schematic cross-sectional view illustrating the manufacturing method.

Next, for example, as illustrated in FIGS. 32 to 34, the exposure device (not illustrated) exposes the positions of contact holes CH15(0), CH16(1), CH17(2), CH18(3), CH21 (3), CH22(2), CH23(1), CH24(0), CH35(0), CH36(1), CH37(2), CH38(3), CH41(3), CH42(2), CH43(1), and CH44(0) based on a photomask.

Then, by developing the resist 151 with a developer corresponding thereto, the resist at the positions of the contact holes CH15(0), CH16(1), CH17(2), CH18(3), CH21 (3), CH22(2), CH23(1), CH24(0), CH35(0), CH36(1), CH37(2), CH38(3), CH41(3), CH42(2), CH43(1), and CH44(0) is removed. Thus, these contact holes are opened.

Figure 35:
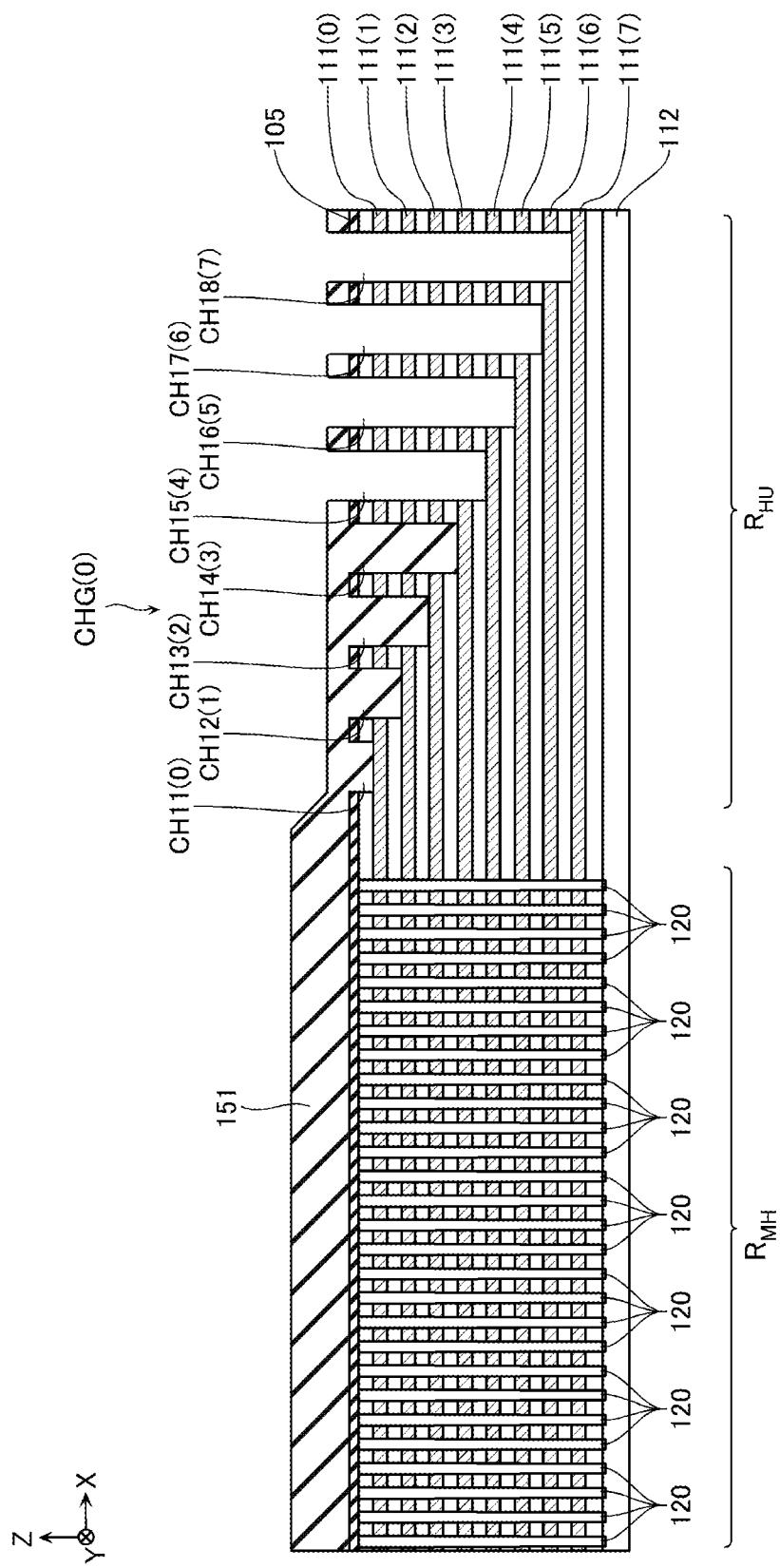
FIG. 35 is a schematic cross-sectional view illustrating the manufacturing method.
Figure 36:
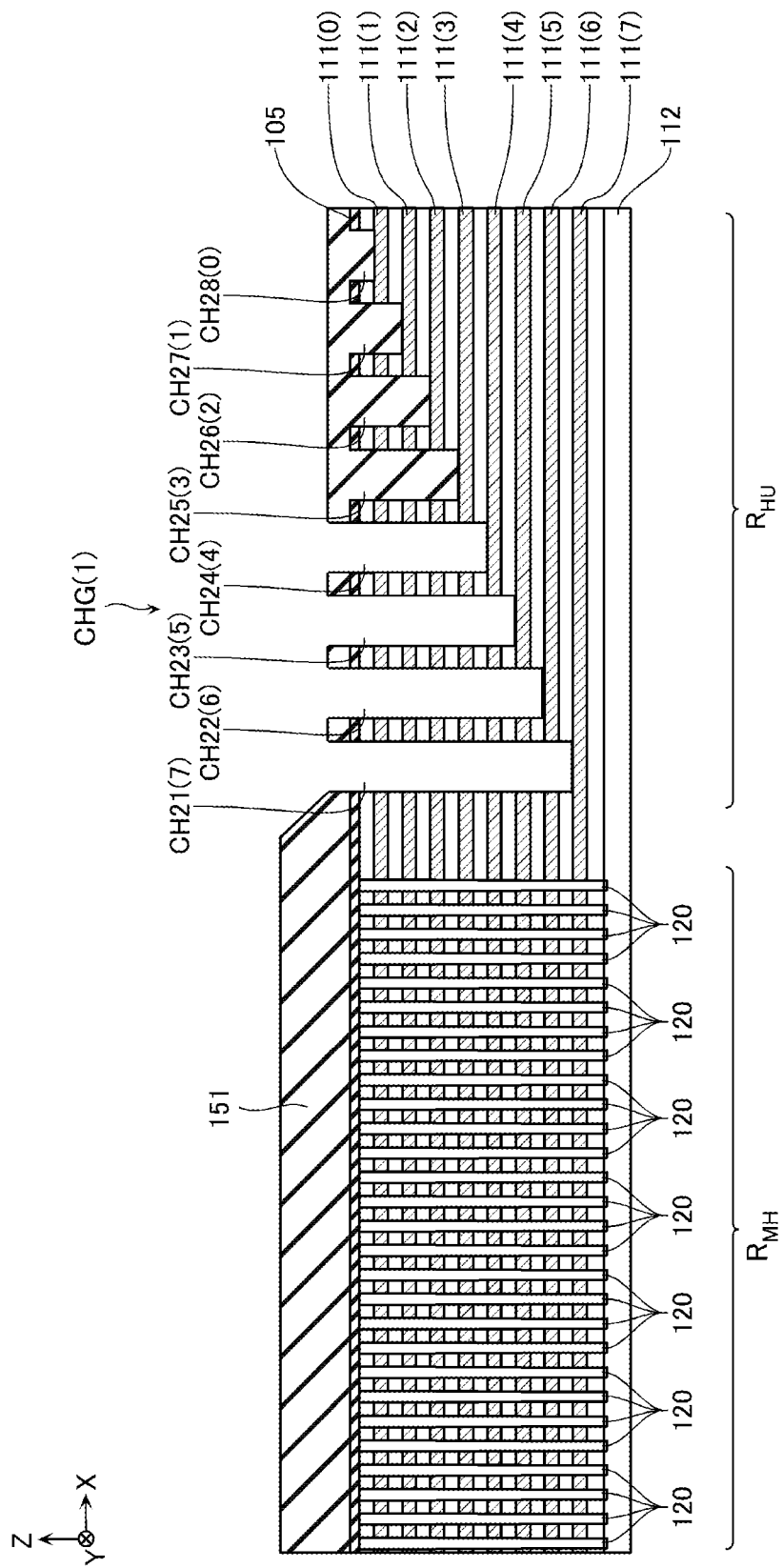
FIG. 36 is a schematic cross-sectional view illustrating the manufacturing method.

Next, for example, as illustrated in FIGS. 35 and 36, the sacrifice layers 111 and the insulating layers 101 are removed four by four with respect to the opened contact holes CH15(0), CH16(1), CH17(2), CH18(3), CH21(3), CH22(2), CH23(1), and CH24(0) among the contact holes CH. Thus, contact holes CH15(4), CH16(5), CH17(6), CH18(7), CH21(7), CH22(6), CH23(5), and CH24(4) are formed to reach the fifth to the eighth sacrifice layers 111(4) and 111(7). This step is performed by, for example, RIE.

Moreover, the sacrifice layers 111 and the insulating layers 101 are also removed four by four with respect to the contact holes CH35(0), CH36(*l*), CH37(2), CH38(3), CH41 (3), CH42(2), CH43(1), and CH44(0).

Figure 37:
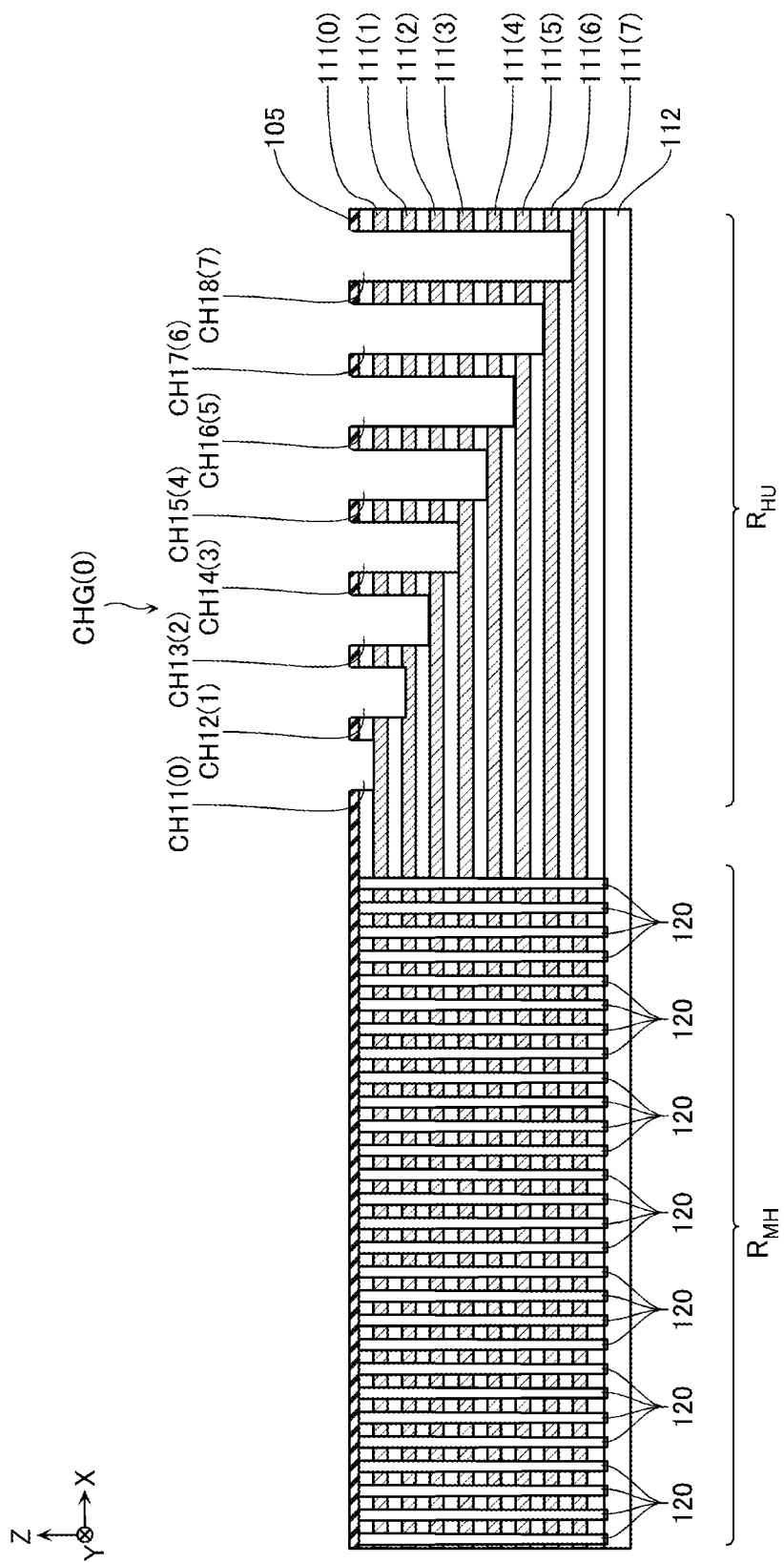
FIG. 37 is a schematic cross-sectional view illustrating the manufacturing method.
Figure 38:
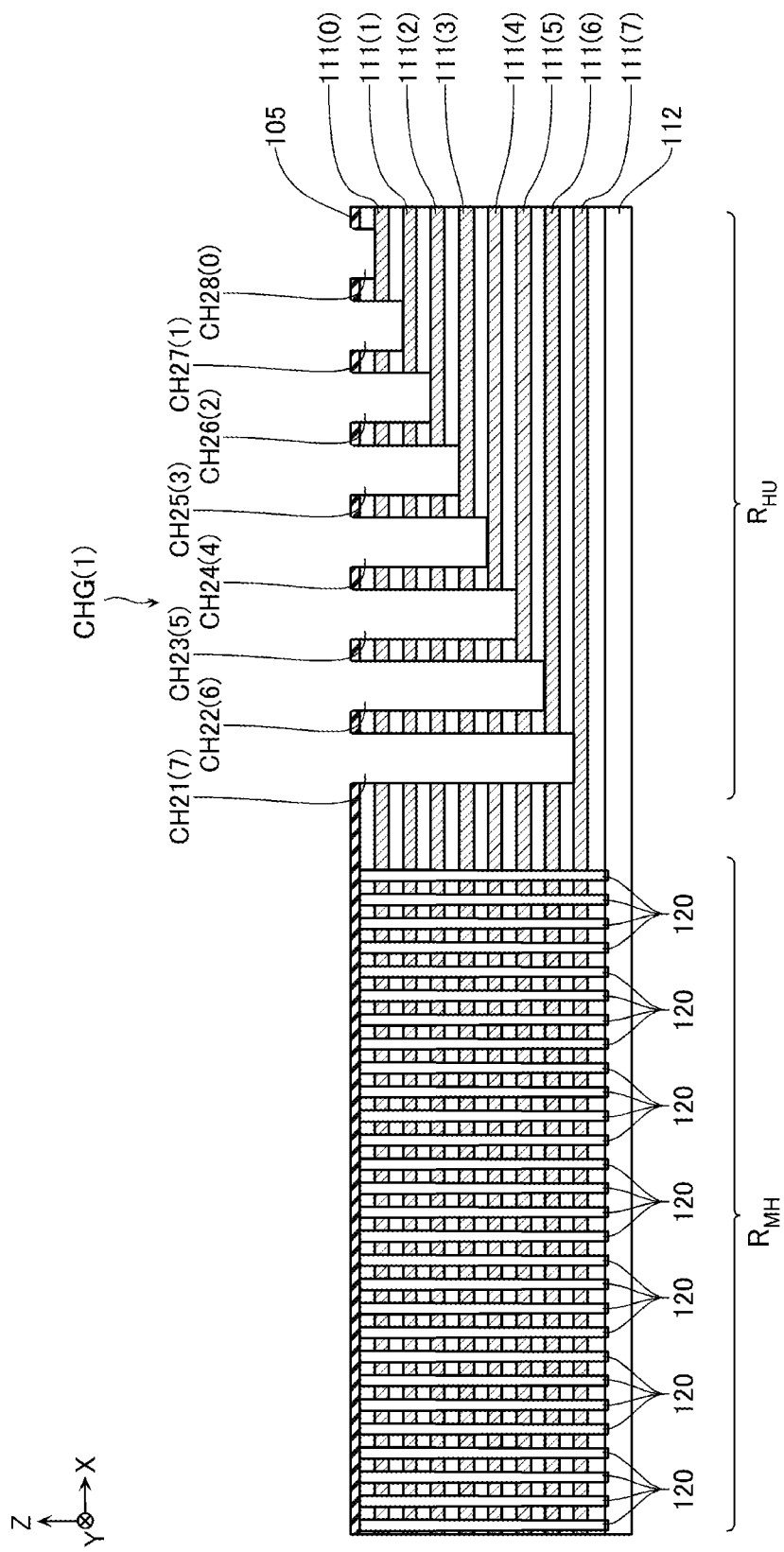
FIG. 38 is a schematic cross-sectional view illustrating the manufacturing method.
Figure 39:
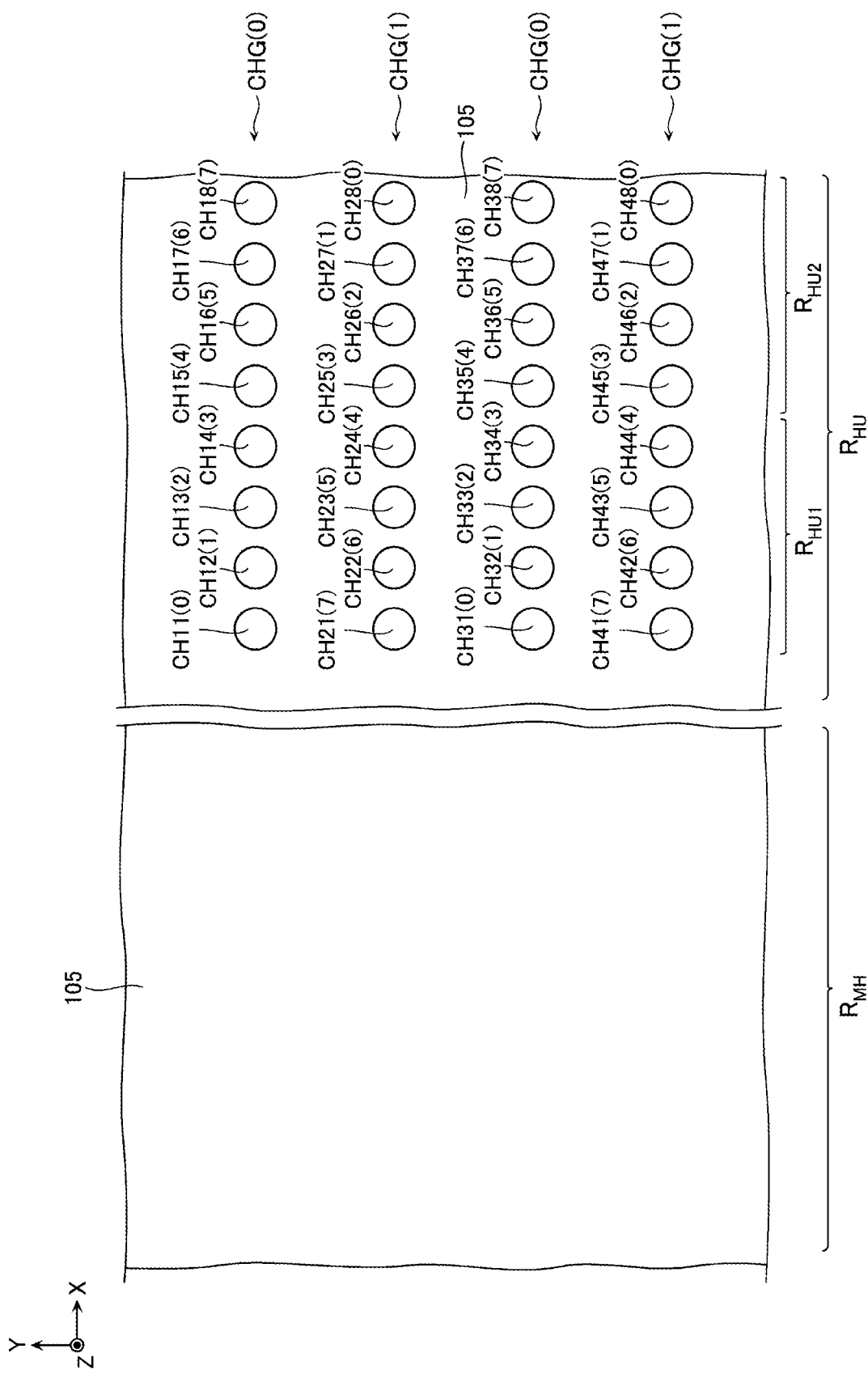
FIG. 39 is a schematic plan view illustrating the manufacturing method.

Then, as illustrated in FIGS. 37 and 38, the resist 151 is removed. As illustrated in FIG. 39, the contact hole rows CHG(0) and CHG(1) are alternately arranged in the Y direction in the hook-up region $R_{HU}$. Then, in the contact hole row CHG(0), the depths of the contact holes CH become deeper by one layer at a time as the distance from the memory hole region $R_{MH}$ increases. Further, in the contact hole row CHG(1), the depths of the contact holes CH become shallower by one layer at a time as the distance from the memory hole region $R_{MH}$ increases.

Figure 40:
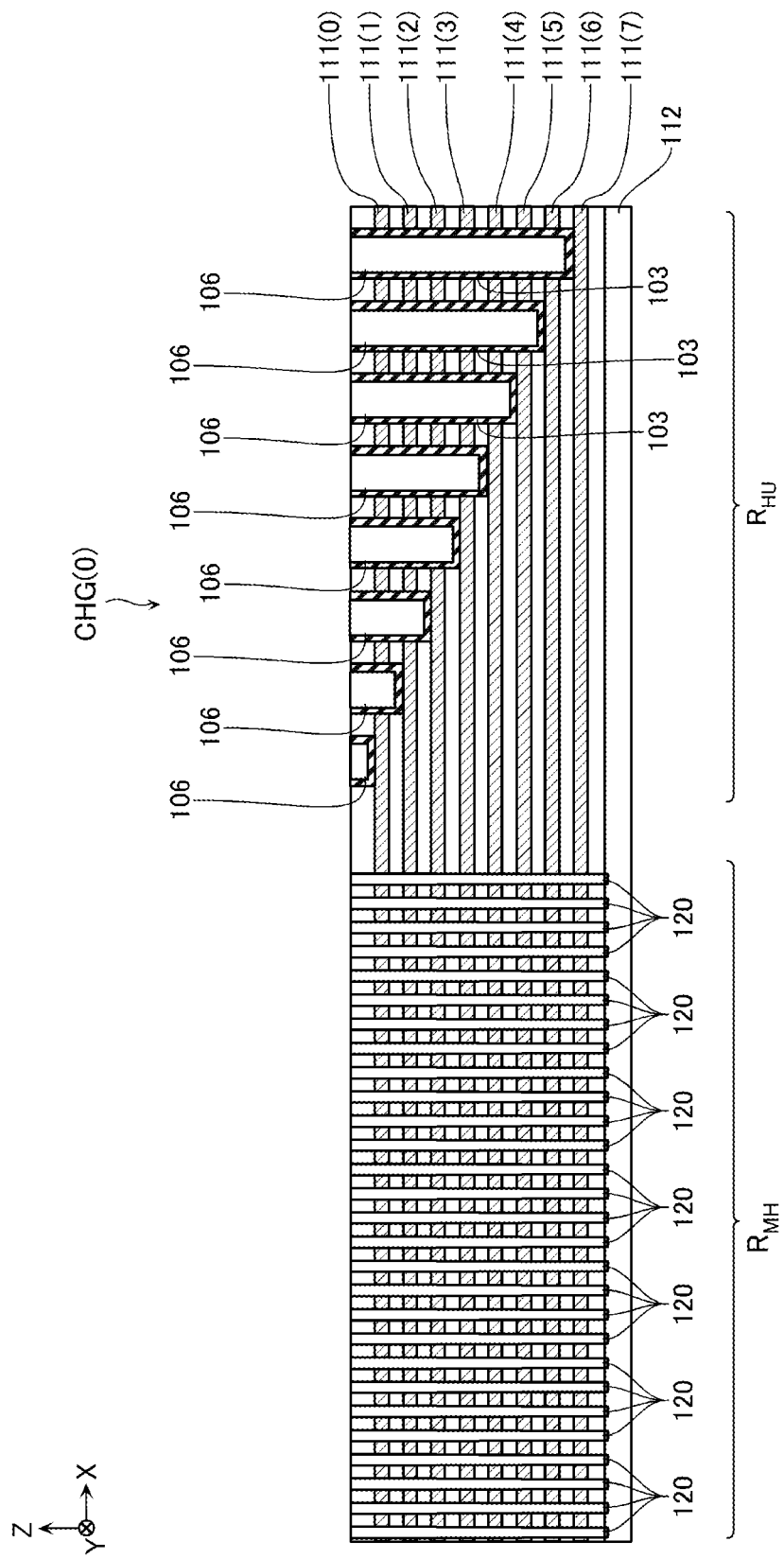
FIG. 40 is a schematic cross-sectional view illustrating the manufacturing method.

Next, for example, as illustrated in FIG. 40, the insulating layer 103 and a sacrifice layer 106 are formed inside the contact holes CH11(0) to CH18(7). This step is performed by, for example, CVD.

Figure 41:
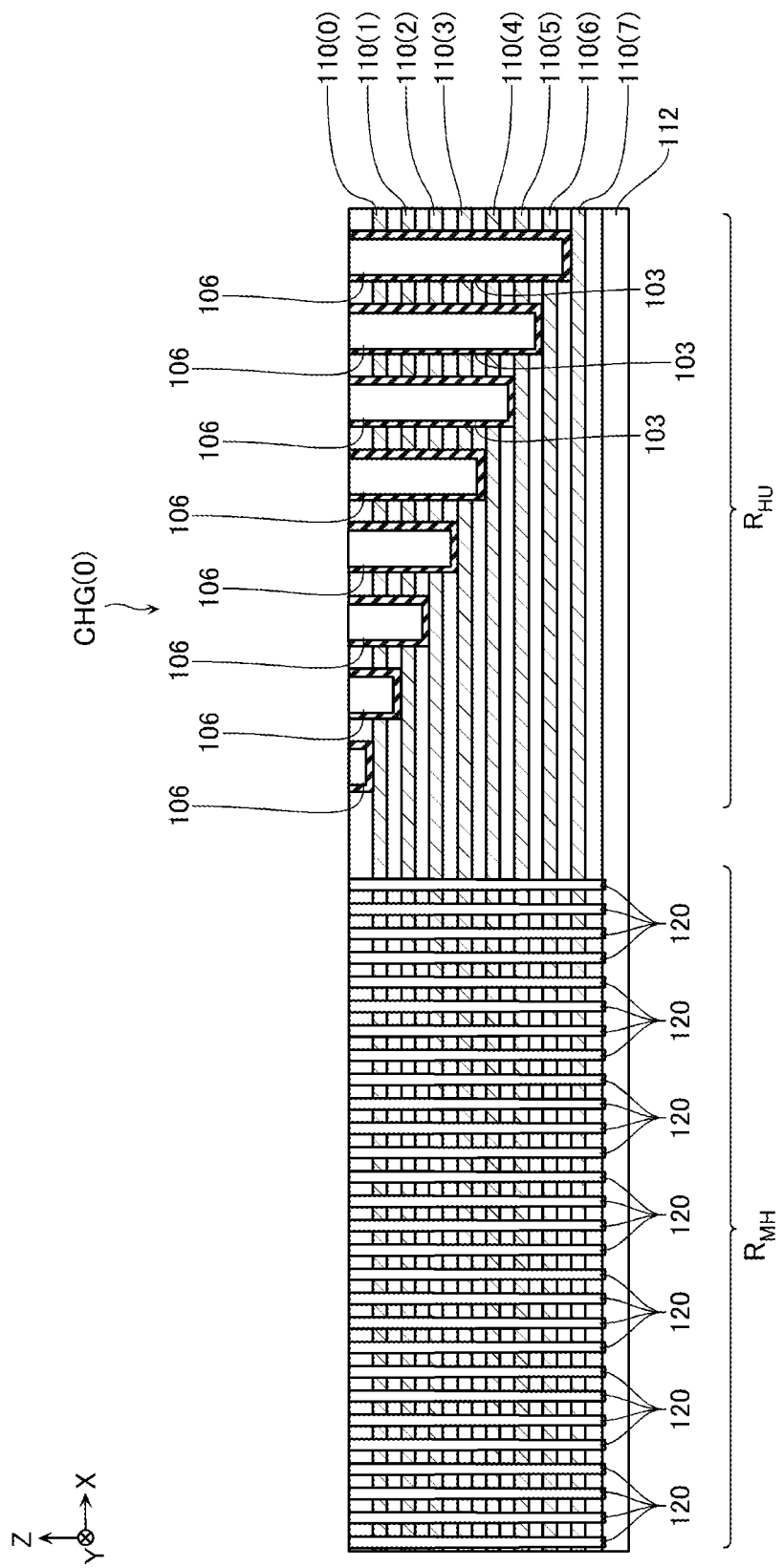
FIG. 41 is a schematic cross-sectional view illustrating the manufacturing method.

Next, for example, as illustrated in FIG. 41, the conductive layers 110 are formed. In this step, for example, grooves are formed to penetrate the plurality of insulating layers 101 and the plurality of sacrifice layers 111 at positions corresponding to the inter-block insulating layers ST (FIG. 2) by a method such as RIE. Next, the plurality of sacrifice layers 111 are removed by a method such as wet etching through the grooves. Next, the plurality of conductive layers 110 are formed by a method such as CVD.

Figure 42:
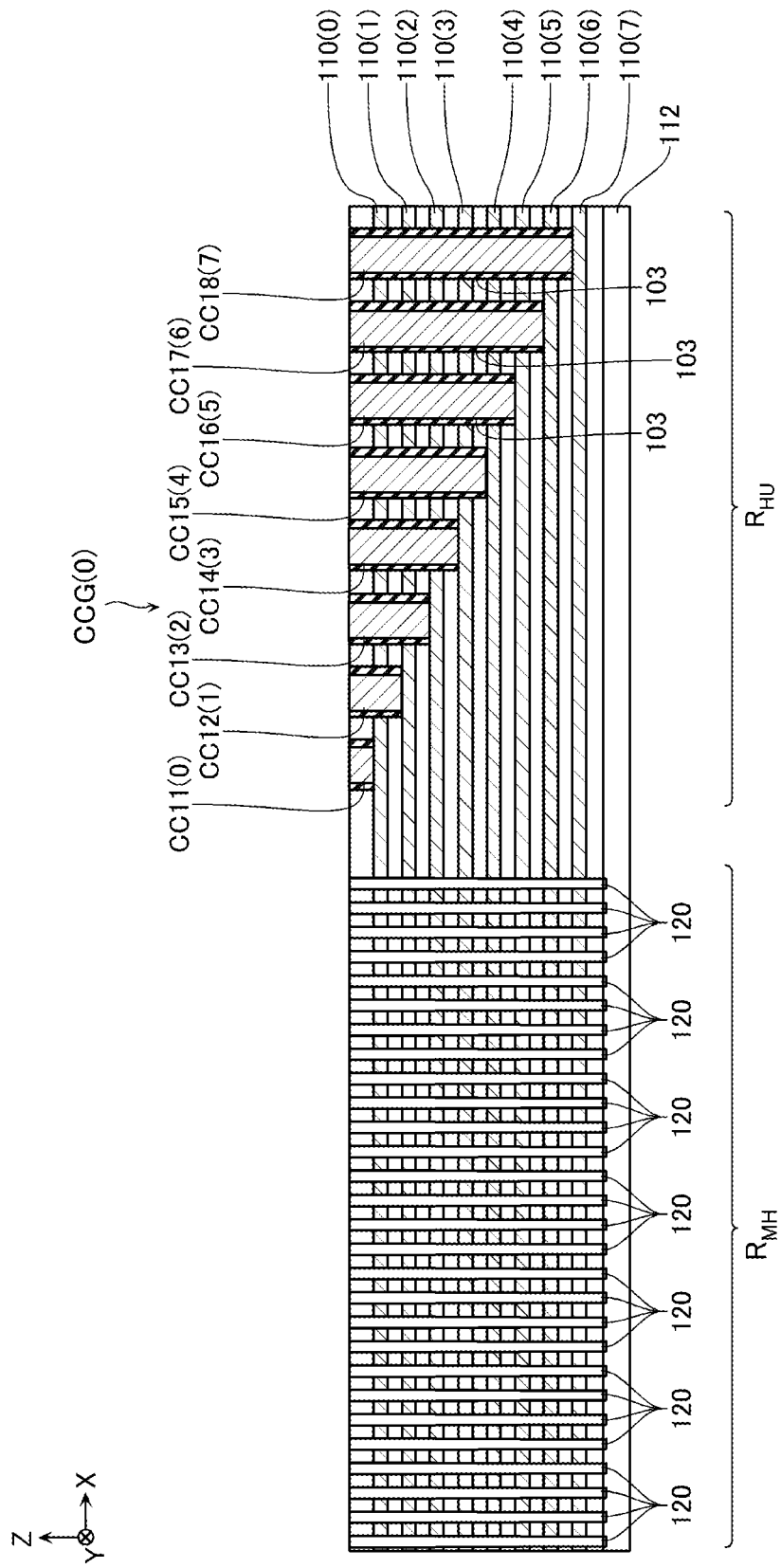
FIG. 42 is a schematic cross-sectional view illustrating the manufacturing method.

Next, for example, as illustrated in FIG. 42, the contact electrodes CC11(0) to CC18(7) are formed. In this step, for example, the sacrifice layer 106 is removed. Next, a part of the insulating layer 103 is removed by a method such as RIE to expose the upper surface of each of the conductive layers 110(0) to 110(7). Next, the contact electrode CC11(0) to the contact electrode CC18(7) are formed by a method such as CVD.

Thereafter, the semiconductor storage device described with reference to FIGS. 1 to 8 is formed by forming the bit line BL and the like.

Moreover, the steps of forming the contact hole row CHG(0) and the contact electrode row CCG(0) have been described based on FIGS. 40 to 42. The steps of forming the contact hole row CHG(1) and the contact electrode row CCG(1) are also the same as those described with reference to FIGS. 40 to 42. Therefore, the cross-sectional view corresponding to the contact hole row CHG(1) and the contact electrode row CCG(1) and the description thereof are omitted.

Comparative Example

[Configuration]

Figure 43:
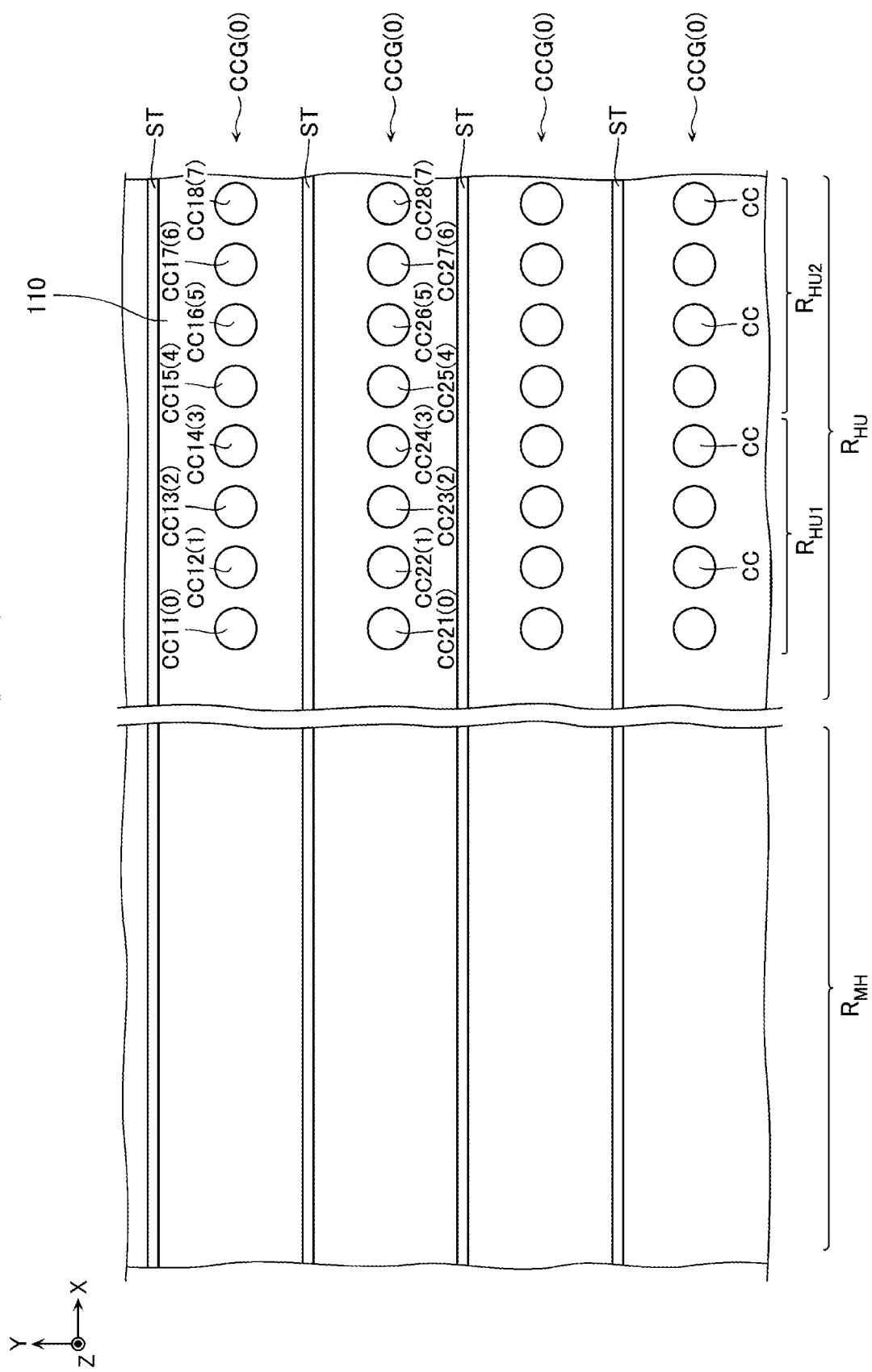
FIG. 43 is a schematic plan view of a semiconductor storage device according to a comparative example.
Figure 44:
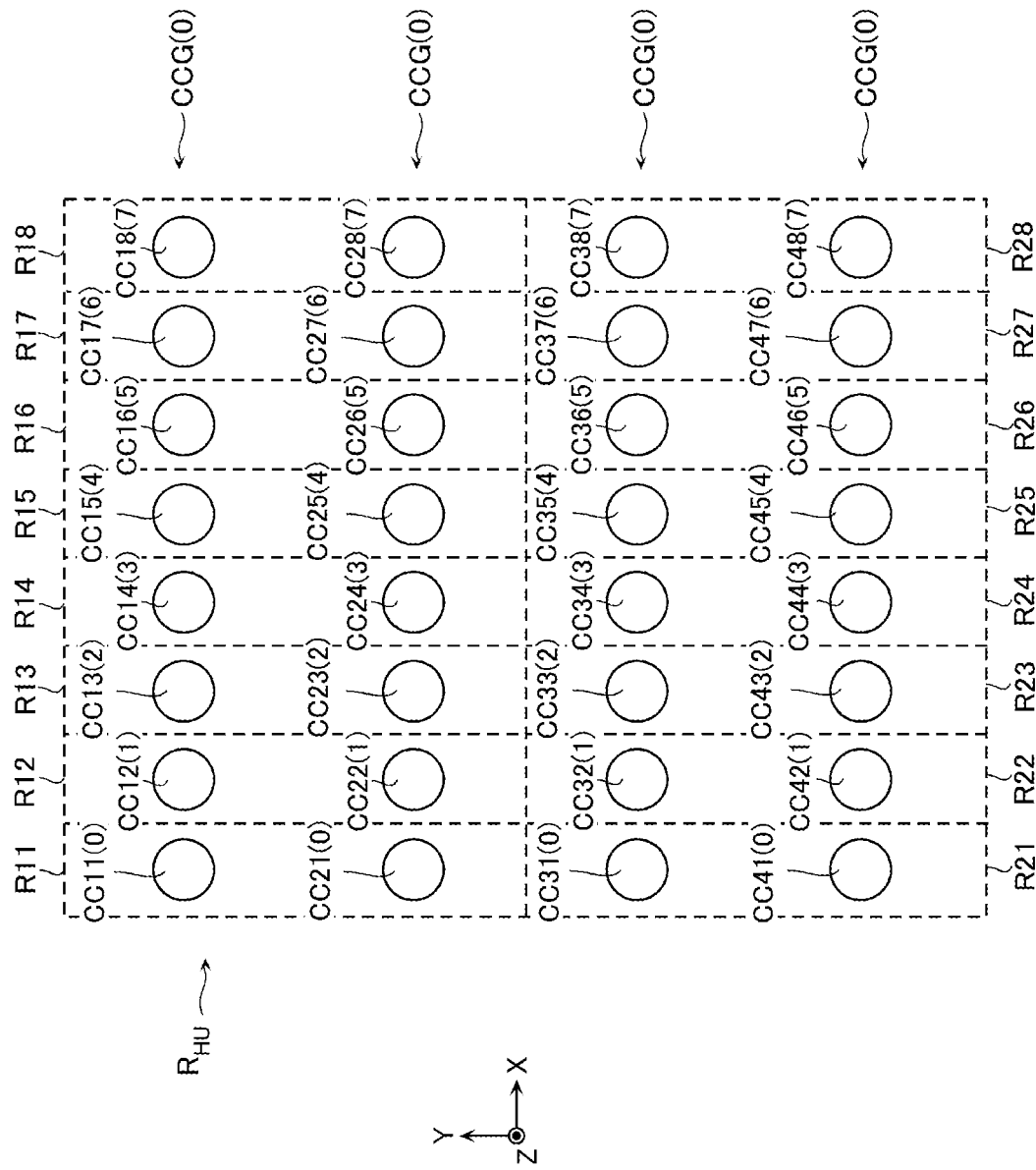
FIG. 44 is a schematic enlarged view of a hook-up region illustrated in FIG. 43.

Next, a configuration of a semiconductor storage device according to a comparative example will be described with reference to FIGS. 43 and 44. FIG. 43 is a schematic plan view of the semiconductor storage device according to the comparative example. FIG. 44 is a schematic enlarged view of a hook-up region illustrated in FIG. 43.

Moreover, with regard to the plurality of contact electrodes CC illustrated in FIGS. 43 and 44 among the plurality of contact electrodes CC arranged in the hook-up region $R_{HU}$, the contact electrode CC which is the $a^{th}$ one (a is an integer of 1 or more) counted from the +Y direction to the −Y direction and is the $b^{th}$ one (b is an integer of 1 or more) counted from the −X direction to the +X direction may be referred to as a contact electrode CCab.

In the semiconductor storage device according to the first embodiment, as illustrated in FIGS. 2 and 8, the two contact electrode rows CCG(0) and CCG(1) are alternately arranged in the Y direction. Meanwhile, in the semiconductor storage device according to the comparative example, as illustrated in FIGS. 43 and 44, only the contact electrode rows CCG(0) are arranged in the Y direction.

In all of the plurality of contact electrode rows CCG(0), contact electrodes CC(0), CC(1), CC(2), CC(3), CC(4), CC(5), CC(6), and CC(7) are arranged in the X direction in order from the one closest to the memory hole region $R_{MH}$. That is, in all of the plurality of contact electrode rows CCG(0), the depths of the contact holes CH become deeper by one layer at a time as the distance from the memory hole region $R_{MH}$ increases.

In the comparative example, a region including a fixed number m (m is an integer of 2 or more) of contact electrodes CC may be referred to as a unit region. In the example of FIG. 44, a region having a fixed area including two contact electrodes CC arranged in the Y direction is defined as a unit region. The hook-up region $R_{HU}$ is virtually divided into a plurality of unit regions.

In FIG. 44, the unit region R11 is a region including two contact electrodes CC11(0) and CC21(0). The unit region R12 is a region including two contact electrodes CC12(1) and CC22(1). The unit region R13 is a region including two contact electrodes CC13(2) and CC23(2). The unit region R14 is a region including two contact electrodes CC14(3) and CC24(3). The unit region R15 is a region including two contact electrodes CC15(4) and CC25(4). The unit region R16 is a region including two contact electrodes CC16(5) and CC26(5). The unit region R17 is a region including two contact electrodes CC17(6) and CC27(6). The unit region R18 is a region including two contact electrodes CC18(7) and CC28(7).

Further, the unit region R21 is a region including two contact electrodes CC31(0) and CC41(0). The unit region R22 is a region including two contact electrodes CC32(1) and CC42(1). The unit region R23 is a region including two contact electrodes CC33(2) and CC43(2). The unit region R24 is a region including two contact electrodes CC34(3) and CC44(3). The unit region R25 is a region including two contact electrodes CC35(4) and CC45(4). The unit region R26 is a region including two contact electrodes CC36(5) and CC46(5). The unit region R27 is a region including two contact electrodes CC37(6) and CC47(6). The unit region R28 is a region including two contact electrodes CC38(7) and CC48(7).

All average values of the depth levels n of the two contact electrodes CC arranged in the unit regions R11 and R21 are "0". All average values of the depth levels n of the two contact electrodes CC arranged in the unit regions R12 and R22 are "1". All average values of the depth levels n of the two contact electrodes CC arranged in the unit regions R13 and R23 are "2". All average values of the depth levels n of the two contact electrodes CC arranged in the unit regions R14 and R24 are "3".

All average values of the depth levels n of the two contact electrodes CC arranged in the unit regions R15 and R25 are "4". All average values of the depth levels n of the two contact electrodes CC arranged in the unit regions R16 and R26 are "5". All average values of the depth levels n of the two contact electrodes CC arranged in the unit regions R17 and R27 are "6". All average values of the depth levels n of the two contact electrodes CC arranged in the unit regions R18 and R28 are "7".

Moreover, in the semiconductor storage device according to the comparative example, for example, as illustrated in FIG. 44, the number m of contact electrodes CC provided in the plurality of unit regions is "2". Then, the average value of the lengths in the Z direction of two contact electrodes having the first and second largest lengths in the Z direction (for example, the contact electrodes CC18(7) and CC17(6)) is "6.5". Thus, "the first length" is "6.5". Further, the average value of the lengths in the Z direction of two contact electrodes having the first and second smallest lengths in the Z direction (for example, the contact electrodes CC11(0) and CC12(1)) is "0.5". Thus, "the second length" is "0.5".

As described above, the maximum value of each average value of the lengths (each average value of the depth levels) in the Z direction of two contact electrodes CC in each unit region is the average value "7" of the lengths in the Z direction of the two contact electrodes CC18 and CC28 in the unit region R18 and the two contact electrodes CC38 and CC48 in the unit region R28. Accordingly, the average value of the lengths in the Z direction of the two contact electrodes CC18 and CC28 in the unit region R18 and the two contact electrodes CC38 and CC48 in the unit region R28 is larger than "6.5" which is "the first length". Further, the minimum value of each average value of the lengths in the Z direction of two contact electrodes CC in each unit region is the average value "0" of the lengths in the Z direction of the two contact electrodes CC11 and CC21 in the unit region R11 and the two contact electrodes CC31 and CC41 in the unit region R21. Accordingly, the average value of the lengths in the Z direction of the two contact electrodes CC11 and CC21 in the unit region R11 and the two contact electrodes CC31 and CC41 in the unit region R21 is smaller than "0.5" which is the "second length".

[Manufacturing Method]

Figure 45:
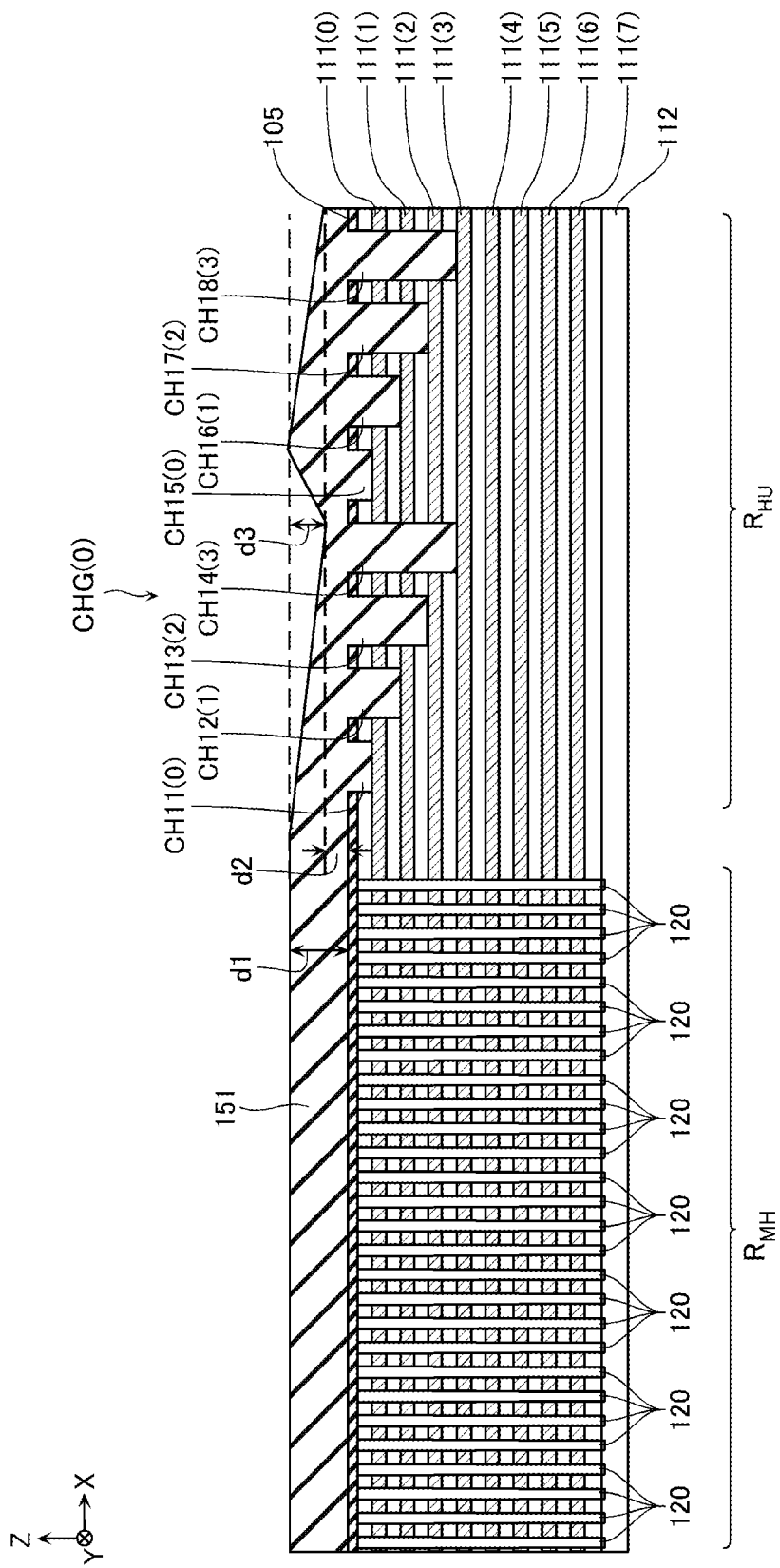
FIG. 45 is a schematic cross-sectional view illustrating a method of manufacturing the semiconductor storage device according to the comparative example.
Figure 46:
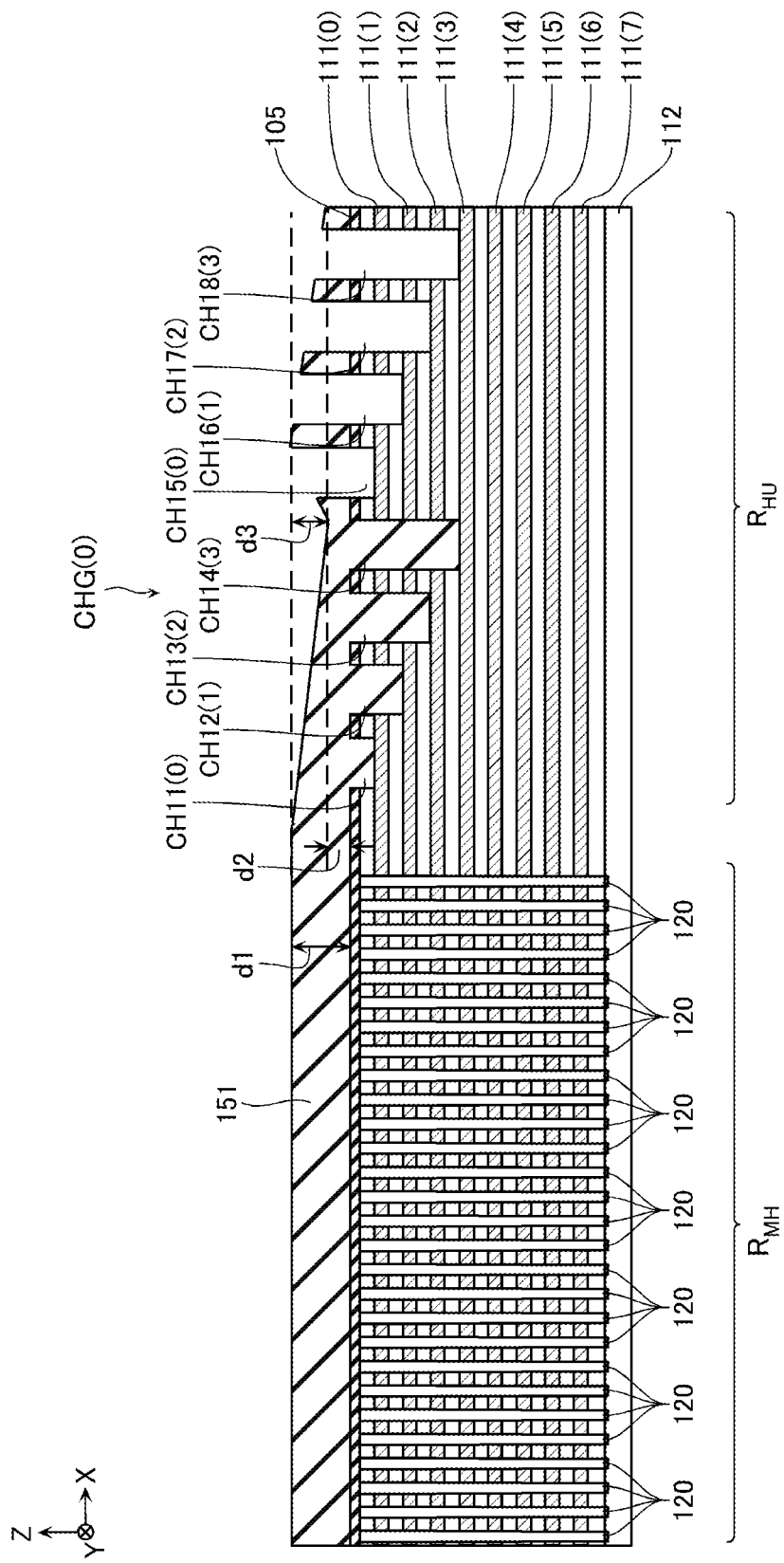
FIG. 46 is a schematic cross-sectional view illustrating the manufacturing method.

Next, a method of manufacturing the semiconductor storage device according to the comparative example will be described with reference to FIGS. 45 and 46. FIGS. 45 and 46 are schematic cross-sectional views illustrating a method of manufacturing the semiconductor storage device according to the comparative example.

In the manufacture of the semiconductor storage device according to the comparative example, the same steps as the steps of forming the contact hole row CHG(0) and the contact electrode row CCG(0) in the process from the step described with reference to FIG. 9 to the step described with reference to FIG. 42 are performed.

The structures illustrated in FIGS. 45 and 46 correspond to the structures described with reference to FIGS. 30 and 33, respectively. The resist 151 illustrated in FIGS. 30 and 33 has a constant film thickness (thickness in the Z direction) and a flat upper surface in the hook-up region $R_{HU}$. Meanwhile, the resist 151 illustrated in FIGS. 45 and 46 has a variation in the film thickness (thickness in the Z direction) and thus a level difference d3 created on the upper surface thereof in the hook-up region $R_{HU}$.

Specifically, for example, in the structures illustrated in FIGS. 45 and 46, the film thickness of the resist 151 in the memory hole region $R_{MH}$ is d1. The film thickness of the resist 151 becomes gradually thinner as the distance from the memory hole region $R_{MH}$ increases. The film thickness of the resist 151 above the contact hole CH14(3) is d2. The film thickness of the resist 151 becomes rapidly thicker from above the contact hole CH14(3) toward above the contact hole CH15(0). Then, the film thickness of the resist 151 again becomes gradually thinner as the distance from the memory hole region $R_{MH}$ increases. The level difference d3 is created as a variation in the film thickness of the resist 151 as described above.

In the semiconductor storage device according to the comparative example, the same contact hole rows CHG(0) are arranged in the Y direction. Thus, there occurs a deviation in the depths of the contact holes CH. That is, the contact hole CH having a shallow hole depth is arranged in a region close to the memory hole region $R_{MH}$ (for example, the unit regions R11, R21, R15, and R25), and the contact hole CH having a deep hole depth is arranged in a region away from the memory hole region $R_{MH}$ (for example, the unit regions R14, R24, R18, and R28). In this case, when the resist 151 is applied, the contact hole CH having a deep hole depth has a larger suction amount of the resist 151 than the contact hole CH having a shallow hole depth. As a result, the film thickness of the resist 151 above the contact hole CH having a deep hole depth is thinner than the film thickness of the resist 151 above the contact hole CH having a shallow hole depth.

In this way, because the film thickness of the resist 151 varies due to a deviation in the depths of the contact holes CH, the optimum focus of the exposure device is shifted between a thick portion and a thin portion of the resist 151. Thus, the process margin of lithography with respect to the focus shift of the exposure device is deteriorated. As a result, there is a risk of the contact hole CH being not opened or the uniformity of the dimension of the contact hole CH being deteriorated. Further, there is a possibility that the film thickness of the resist 151 will be insufficient at a location of the contact hole CH having a deep hole depth. In particular, as the number of conductive layers 110 increases, the contact hole CH becomes deeper, and the film thickness of the resist 151 tends to be insufficient.

On the other hand, in the semiconductor storage device according to the first embodiment, the contact hole row CHG(0) in which the depths of the contact holes CH become deeper by one layer at a time as the distance from the memory hole region $R_{MH}$ increases, and the contact hole row CHG(1) in which the depths of the contact holes CH become shallower by one layer at a time as the distance from the memory hole region $R_{MH}$ increases, are alternately arranged in the Y direction. Accordingly, there is no deviation in the depths of the contact holes CH for each unit region, and the film thickness of the resist 151 is uniform.

For example, as illustrated in FIG. 32, all average values of the depth levels n of the two contact holes CH arranged in all unit regions R11 to R18 and R21 to R28 (see FIG. 8) are the same value of "1.5". Further, the diameters of all contact holes CH are the same or substantially the same. In this case, the suction amount of the resist 151 in the two contact holes CH arranged in each of the unit regions R11 to R18 and R21 to R28 is the same or substantially the same in each of the unit regions R11 to R18 and R21 to R28. As a result, the film thickness of the resist 151 is the same or substantially the same in the hook-up region $R_{HU}$.

Accordingly, it is possible to avoid a deterioration in the process margin of lithography. As a result, it is possible to prevent the occurrence of unopened contact holes CH or deterioration in the uniformity of the dimension of the contact holes CH. Further, it is possible to prevent the resist 151 from having an insufficient film thickness.

Second Embodiment

[Configuration]

Figure 47:
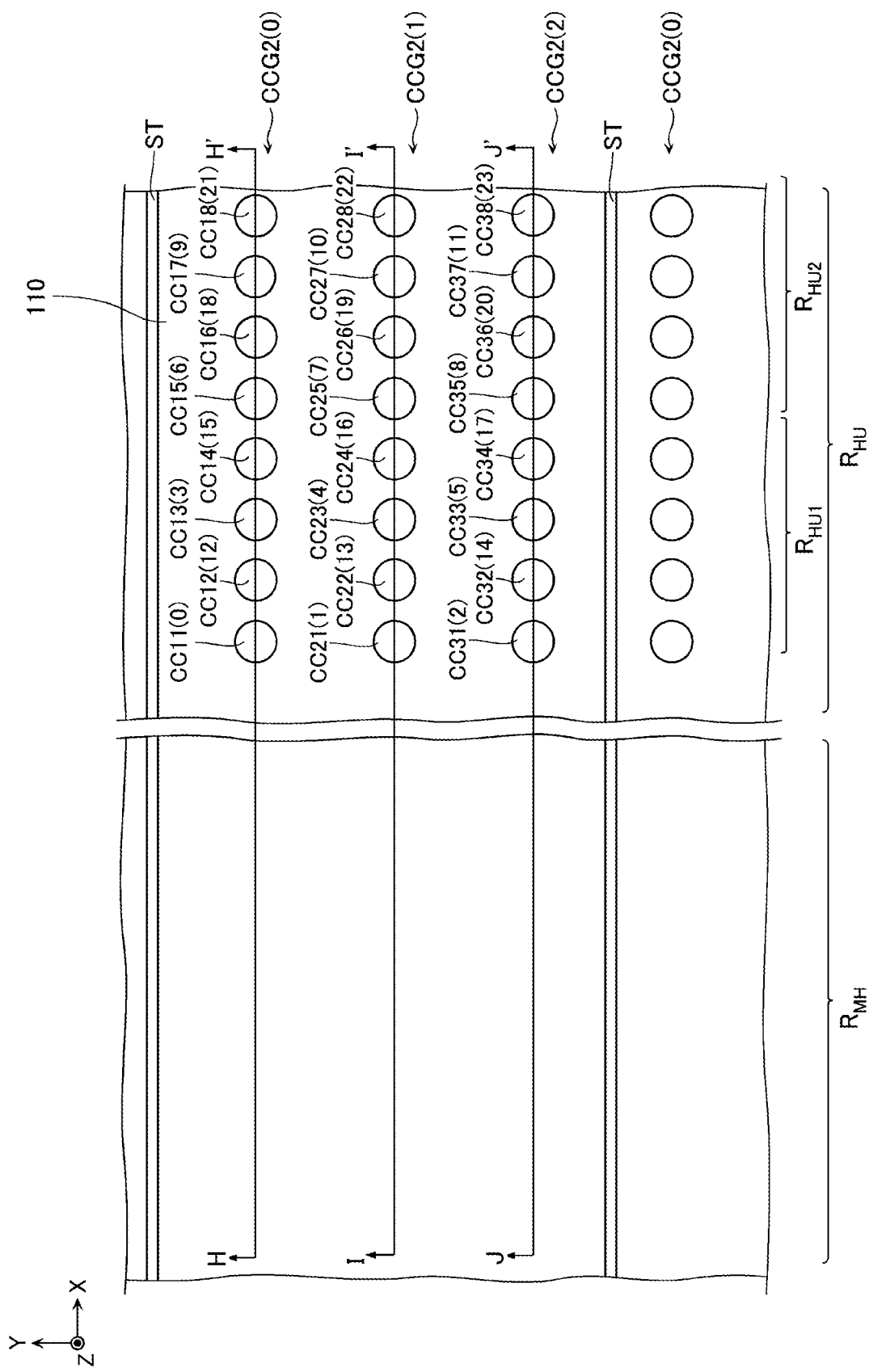
FIG. 47 is a schematic plan view illustrating a partial configuration of a semiconductor storage device according to a second embodiment.
Figure 48:
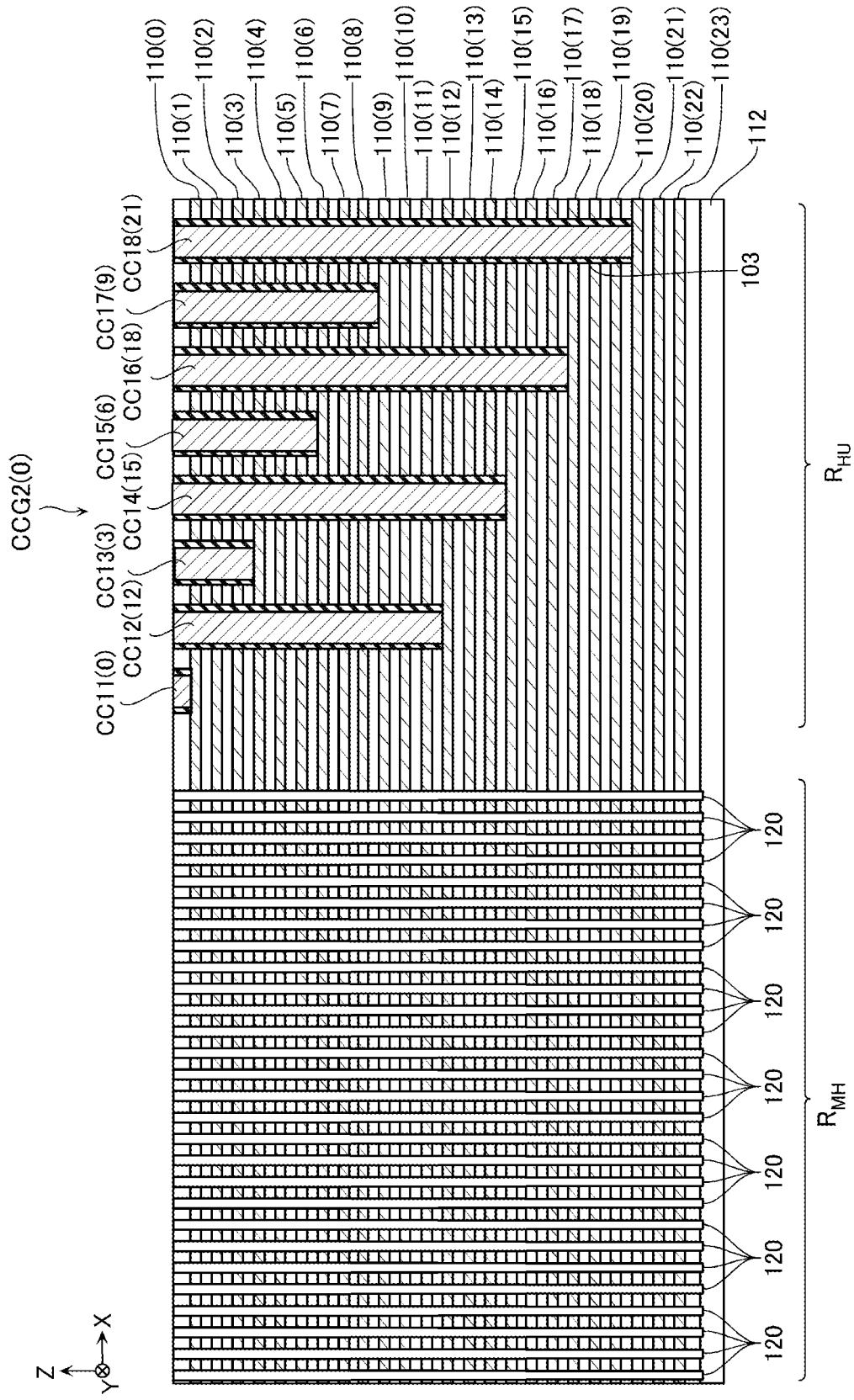
FIG. 48 is a schematic cross-sectional view of a structure illustrated in FIG. 47 taken along line H-H' and viewed along the direction of the arrow.
Figure 49:
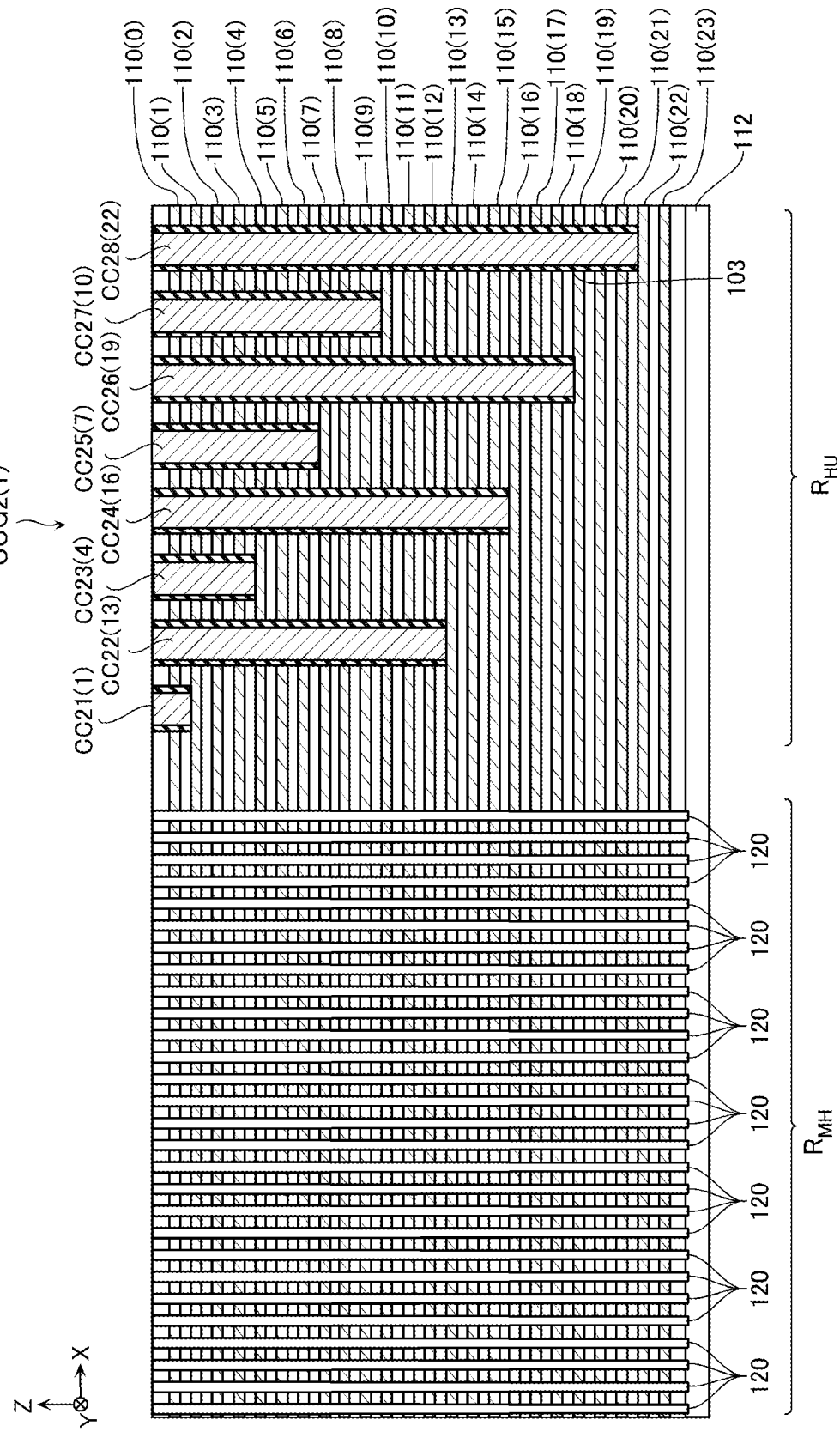
FIG. 49 is a schematic cross-sectional view of the structure illustrated in FIG. 47 taken along line I-I' and viewed along the direction of the arrow.
Figure 50:
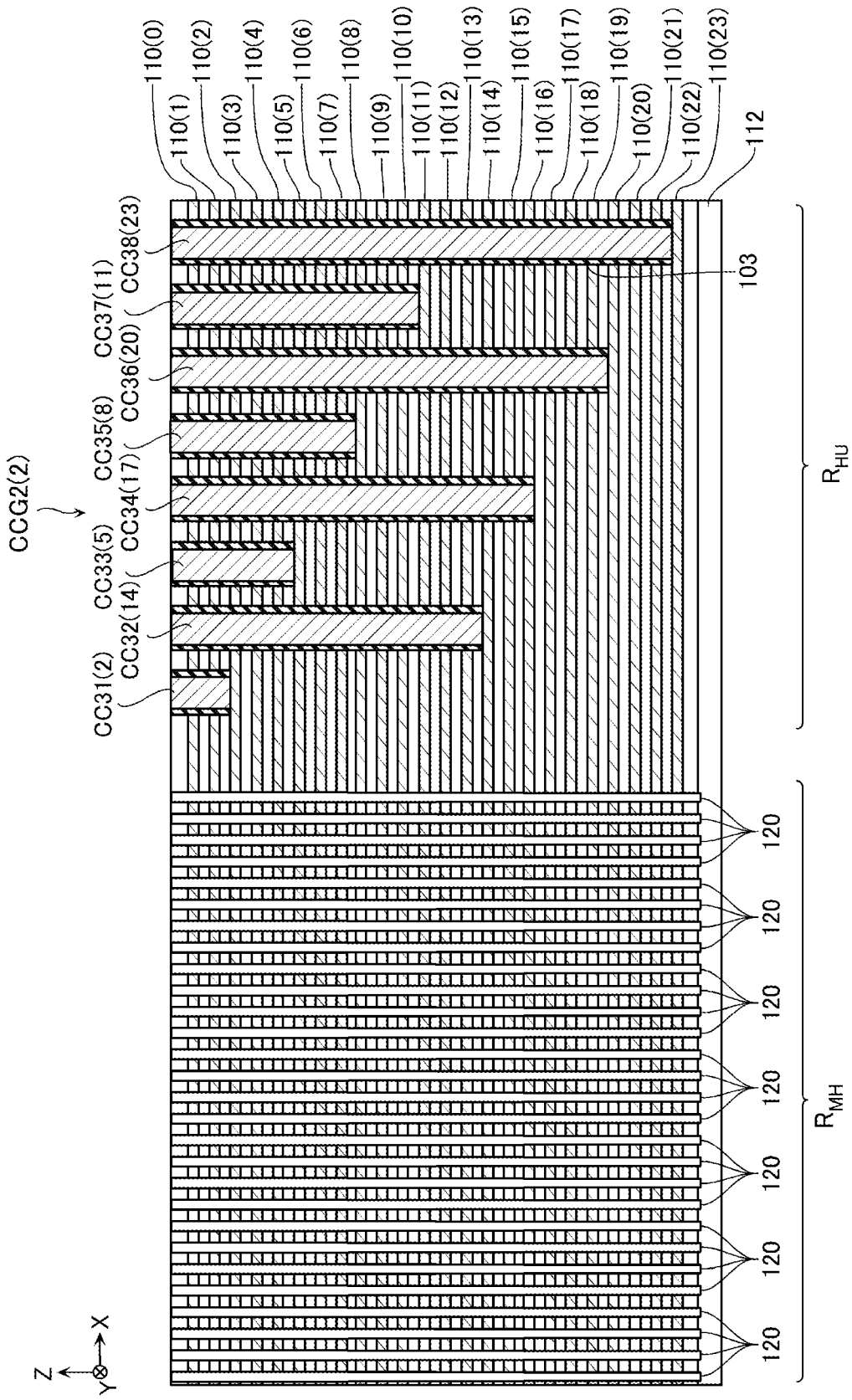
FIG. 50 is a schematic cross-sectional view of the structure illustrated in FIG. 47 taken along line J-J' and viewed along the direction of the arrow.
Figure 51:
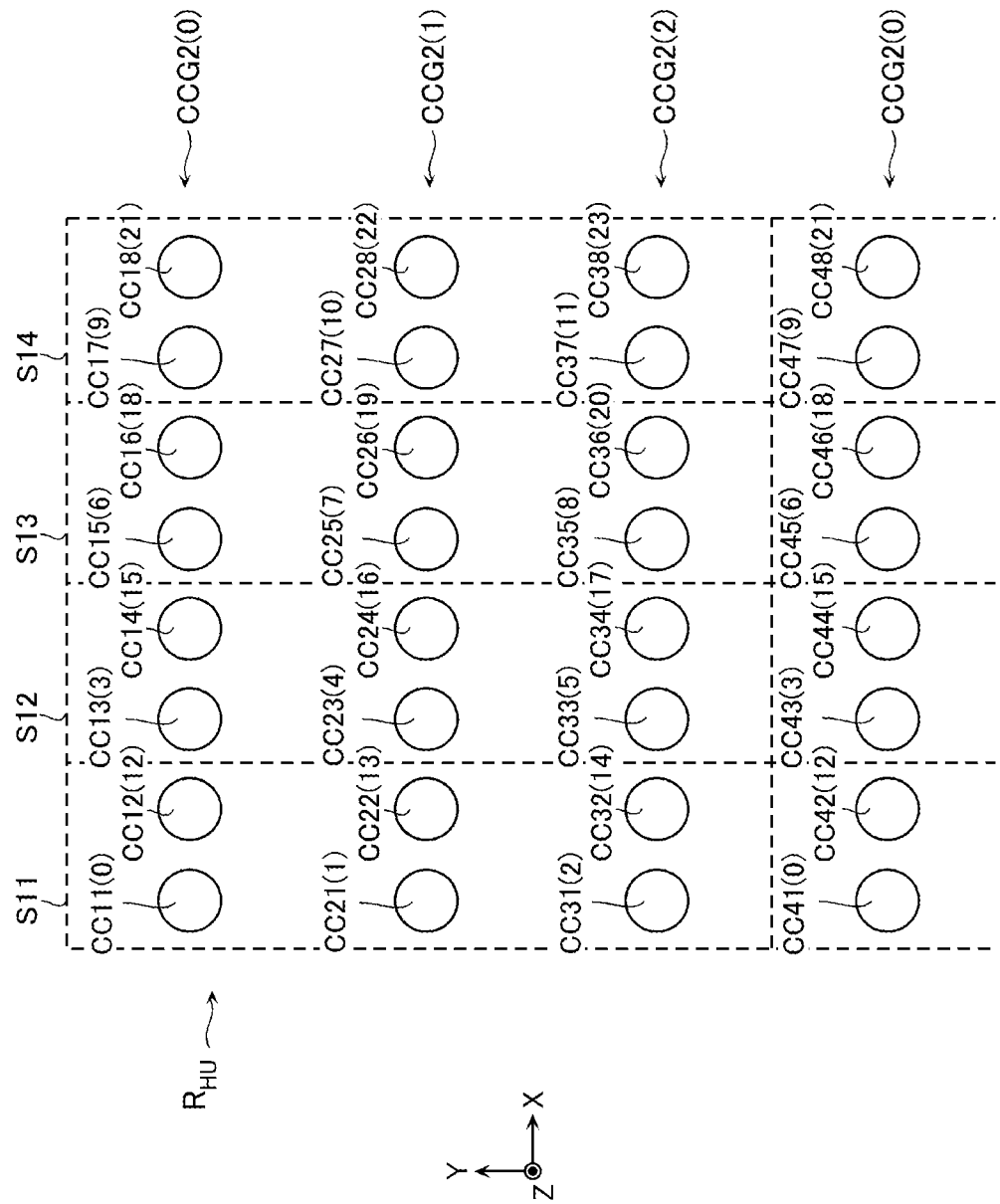
FIG. 51 is a schematic enlarged view of a hook-up region illustrated in FIG. 47.

Next, a semiconductor storage device according to a second embodiment will be described with reference to FIGS. 47 to 51. FIG. 47 is a schematic plan view illustrating a partial configuration of a semiconductor storage device according to a second embodiment. FIG. 48 is a schematic cross-sectional view of a structure illustrated in FIG. 47 taken along line H-H' and viewed along the direction of the arrow. FIG. 49 is a schematic cross-sectional view of the structure illustrated in FIG. 47 taken along line I-I' and viewed along the direction of the arrow. FIG. 50 is a schematic cross-sectional view of the structure illustrated in FIG. 47 taken along line J-J' and viewed along the direction of the arrow. FIG. 51 is a schematic enlarged view of a hook-up region illustrated in FIG. 47.

In the semiconductor storage device according to the first embodiment, as described above with reference to FIGS. 2 and 3, one contact electrode row CCG including eight contact electrodes CC is provided between the inter-block insulating layers ST. On the other hand, in the semiconductor storage device according to the second embodiment, as illustrated in FIG. 47, three contact electrode rows CCG2 each including eight contact electrodes CC are provided between the inter-block insulating layers ST. Further, the plurality of memory blocks BLK arranged in the Y direction are formed as regions between the inter-block insulating layers ST.

Further, in the semiconductor storage device according to the first embodiment, as described with reference to FIGS. 2, 4, and 6, eight conductive layers 110 and eight insulating layers 101 are formed. On the other hand, in the semiconductor storage device according to the second embodiment, as illustrated in FIGS. 48 to 50, twenty-four conductive layers 110 and twenty-four insulating layers 101 are formed.

The hook-up region $R_{HU}$ of the memory block BLK includes, for example, a part of the conductive layer 110 and the plurality of contact electrodes CC arranged in a matrix in the X direction and the Y direction, as illustrated in FIG. 47.

Moreover, with regard to the plurality of contact electrodes CC illustrated in FIG. 47 among the plurality of contact electrodes CC arranged in the hook-up region $R_{HU}$, the contact electrode CC which is the $a^{th}$ one (a is an integer of 1 or more) counted from the +Y direction to the −Y direction and is the $b^{th}$ one (b is an integer of 1 or more) counted from the −X direction to the +X direction may be referred to as a contact electrode CCab.

A row of eight contact electrodes CC arranged in the X direction may be referred to as a contact electrode row CCG2. Further, each region corresponding to the contact electrode row CCG2 may be referred to as a contact electrode region. As illustrated in FIG. 47, three contact electrode rows CCG2(0), CCG2(1) and CCG2(2) are arranged in the Y direction between the inter-block insulating layers ST of the hook-up region $R_{HU}$.

As illustrated in FIG. 48, the contact electrode row CCG2(0) includes contact electrodes CC11(0), CC12(12), CC13(3), CC14(15), CC15(6), CC16(18), CC17(9), and CC18(21) in order from the one closest to the memory hole region $R_{MH}$.

As illustrated in FIG. 49, the contact electrode row CCG2(1) includes contact electrodes CC21(1), CC22(13), CC23(4), CC24(16), CC25(7), CC26(19), CC27(10), and CC28(22) in order from the one closest to the memory hole region $R_{MH}$.

As illustrated in FIG. 50, the contact electrode row CCG2(2) includes contact electrodes CC31(2), CC32(14), CC33(5), CC34(17), CC35(8), CC36(20), CC37(11), and CC38(23) in order from the one closest to the memory hole region $R_{MH}$.

In the example of FIG. 51, a region having a fixed area including six contact electrodes CC in 3 rows and 2 columns (three in the Y direction and two in the X direction) is defined as a unit region. The hook-up region $R_{HU}$ is virtually divided into a plurality of unit regions.

In FIG. 51, a unit region S11 is a region including six contact electrodes CC11(0), CC12(12), CC21(1), CC22(13), CC31(2), and CC32(14). A unit region S12 is a region including six contact electrodes CC13(3), CC14(15), CC23(4), CC24(16), CC33(5), and CC34(17). A unit region S13 is a region including six contact electrodes CC15(6), CC16(18), CC25(7), CC26(19), CC35(8), and CC36(20). A unit region S14 is a region including six contact electrodes CC17(9), CC18(21), CC27(10), CC28(22), CC37(11), and CC38(23).

The average value of the depth levels n of the six contact electrodes CC arranged in the unit region S11 is "7" (=42/6). The average value of the depth levels n of the six contact electrodes CC arranged in the unit region S12 is "10" (=60/6). The average value of the depth levels n of the six contact electrodes CC arranged in the unit region S13 is "13" (=78/6). The average value of the depth levels n of the six contact electrodes CC arranged in the unit region S14 is "16" (=96/6).

The minimum value of the average value of the depth levels n of the six contact electrodes CC is "7" of the unit region S11, and the maximum value of the average value of the depth levels n of the six contact electrodes CC is "16" of the unit region S14.

Further, as illustrated in FIG. 51, the contact electrode row CCG2(0) including contact electrodes CC41(0), CC42(12), CC43(3), CC44(15), CC45(6), CC46(18), CC47(9), and CC48(21) is a contact electrode row having the same arrangement as that of the contact electrode row CCG2(0) including the contact electrodes CC11(0), CC12(12), CC13 (3), CC14(15), CC15(6), CC16(18), CC17(9), and CC18 (21).

Moreover, as illustrated in FIG. 47, the hook-up region $R_{HU}$ in which the plurality of contact electrodes CC are arranged is divided into the first region $R_{HU1}$ and the second region $R_{HU2}$ arranged in the X direction. For example, the first region $R_{HU1}$ is a region including the contact electrodes CC11 to CC14, CC21 to CC24, . . . , and the second region $R_{HU2}$ is a region including the contact electrode CC15 to CC18, CC25 to CC28, . . . .

Further, the number of contact electrodes CC provided in the plurality of unit regions is defined as m (m is an integer of 2 or more). Then, the average value of the lengths in the Z direction of m contact electrodes CC having the first to the $m^{th}$ largest lengths in Z direction among the plurality of contact electrodes CC is defined as "the third length". Further, the average value of the lengths in the Z direction of m contact electrodes CC having the first to the $m^{th}$ smallest lengths in Z direction among the plurality of contact electrodes CC is defined as "the fourth length".

For example, in the example of FIG. 51, the number m of contact electrodes CC provided in the plurality of unit regions is "6". Then, the average value of the lengths in the Z direction of six contact electrodes having the first to the sixth largest lengths in the Z direction (for example, the contact electrodes CC38(23), CC28(22), CC18(21), CC36 (20), CC26(19), and CC16(18)) is "20.5". Thus, "the third length" is "20.5". Further, the average value of the lengths in the Z direction of six contact electrodes having the first to the sixth smallest lengths in the Z direction (for example, the contact electrodes CC11(0), CC21(1), CC31(2), CC13(3), CC23(4), and CC33(5)) is "2.5". Thus, "the fourth length" is "2.5".

As described above, the minimum value of the average value of the depth levels n of the six contact electrodes CC is "7" of the unit region S11, and the maximum value of the average value of the depth levels n of the six contact electrodes CC is "16" of the unit region S14. Accordingly, each average value of the lengths in the Z direction of the six contact electrodes CC in each of the unit regions S11 to S14 is smaller than "the third length" and is larger than "the fourth length".

[Manufacturing Method]

Figure 52:
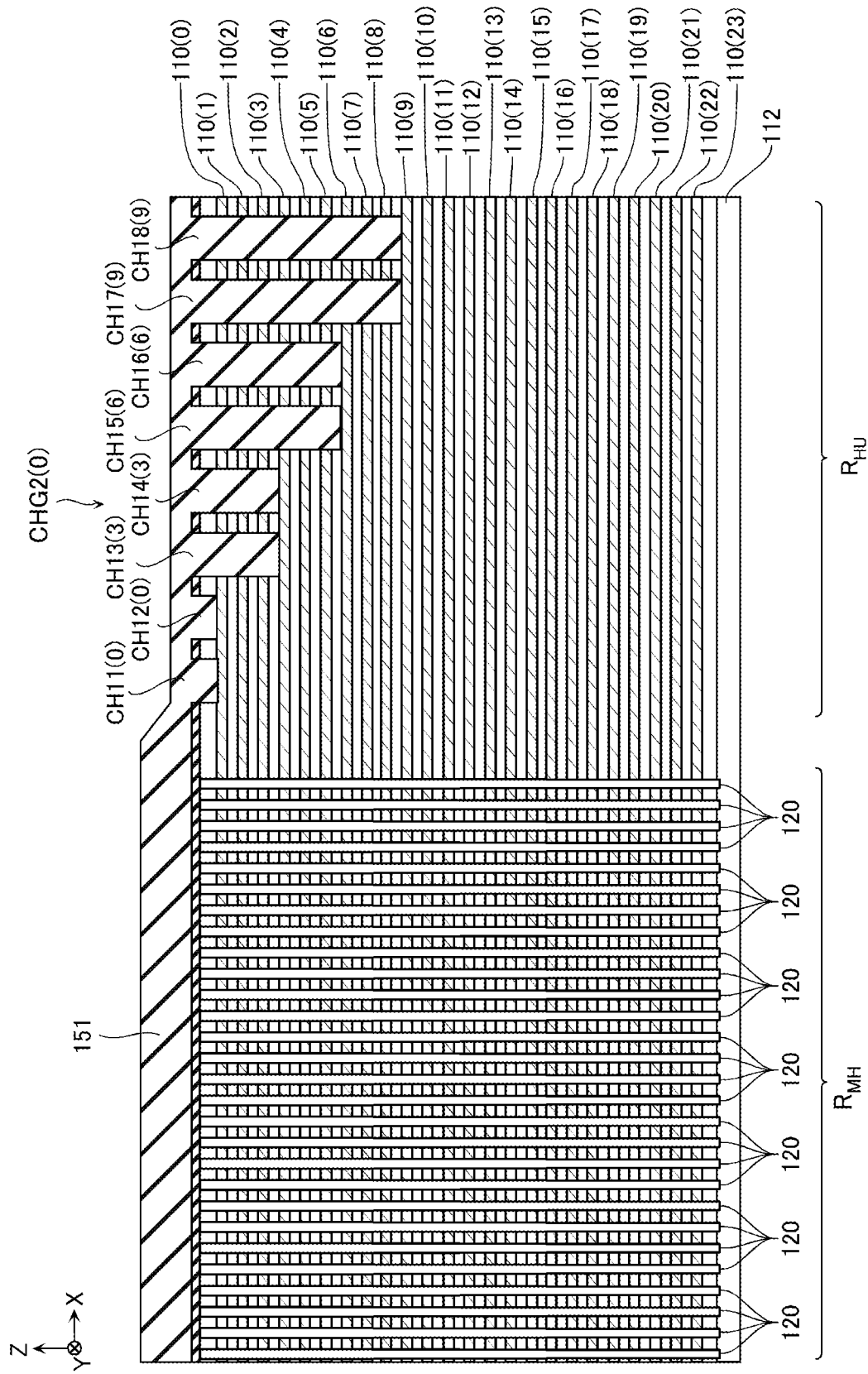
FIG. 52 is a schematic cross-sectional view illustrating a method of manufacturing the semiconductor storage device according to the second embodiment.
Figure 53:
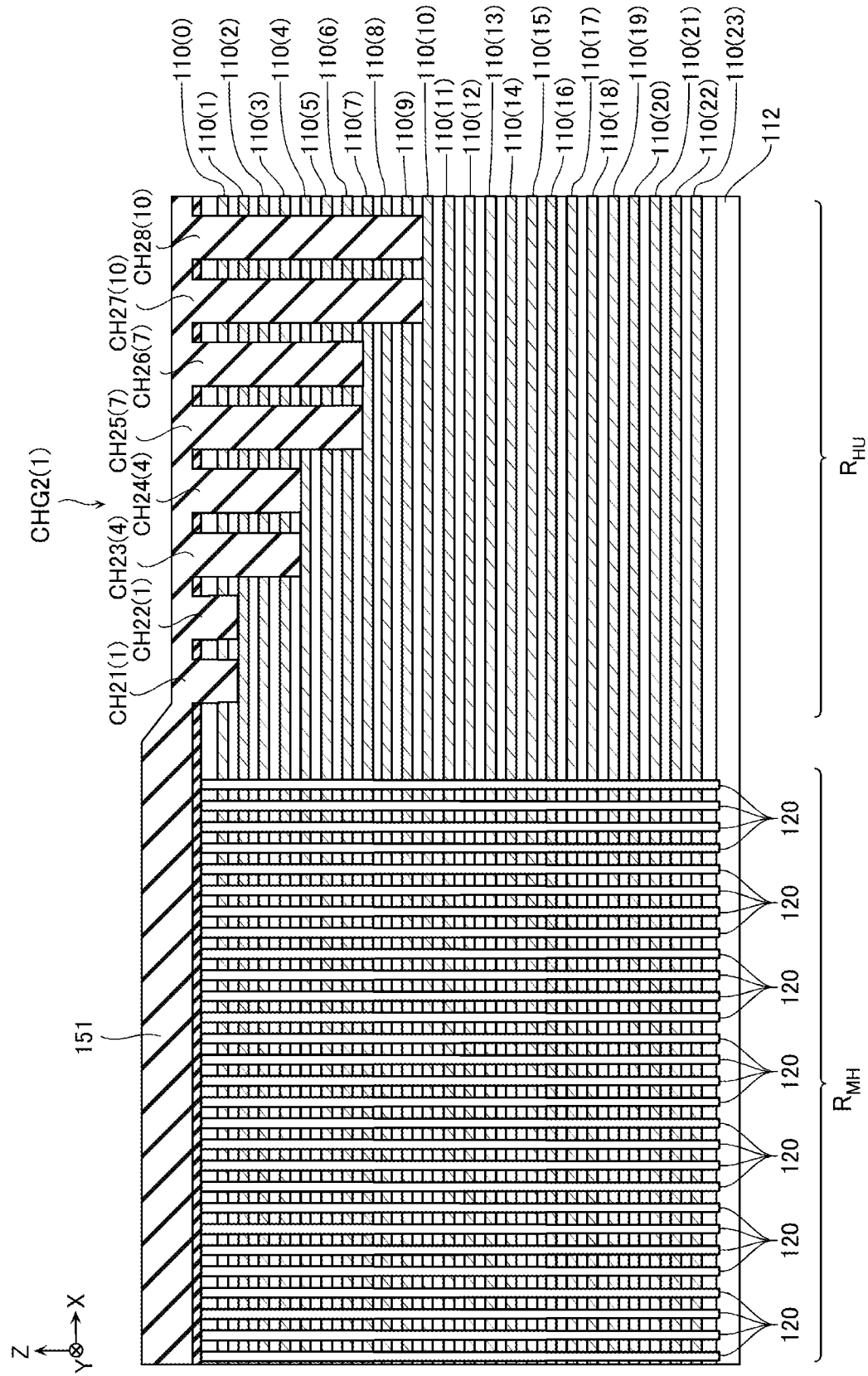
FIG. 53 is a schematic cross-sectional view illustrating the manufacturing method.
Figure 54:
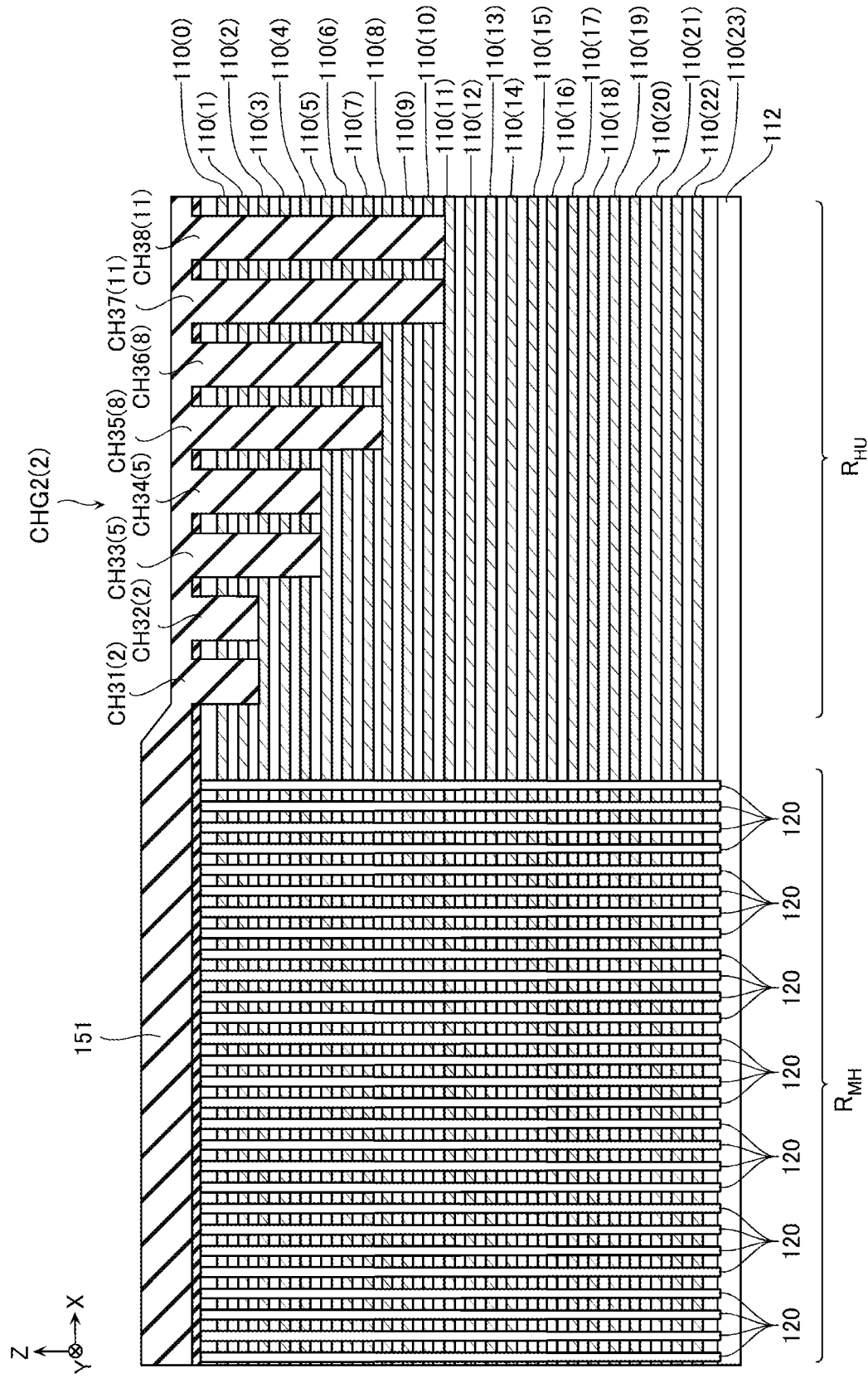
FIG. 54 is a schematic cross-sectional view illustrating the manufacturing method.

Next, a method of manufacturing the semiconductor storage device according to the second embodiment will be described with reference to FIGS. 52 to 54. FIGS. 52 to 54 are schematic cross-sectional views illustrating a method of manufacturing the semiconductor storage device according to the second embodiment.

The method of manufacturing the semiconductor storage device according to the second embodiment is substantially the same as the method of manufacturing the semiconductor storage device according to the first embodiment.

It is noted that, in the method of manufacturing the semiconductor storage device according to the second embodiment, twenty-four sacrifice layers 111 are formed in the step corresponding to FIG. 9.

Further, in the method of manufacturing the semiconductor storage device according to the first embodiment, the contact holes CH(0) to CH(7) are formed to reach the first to the eight sacrifice layers 111(0) to 111(7) by a combination of the processings of the first layer, the second layer, and the fourth layer (processings of the layers of the power of 2) with respect to the contact holes CH. Meanwhile, in the method of manufacturing the semiconductor storage device according to the second embodiment, the contact holes CH(0) to CH(23) are formed to reach the first to the twenty-fourth sacrifice layers 111(0) to 111(23) by a combination of the processings of the first layer, the second layer, the third layer, the sixth layer, and the twelfth layer with respect to the contact holes CH.

Moreover, FIGS. 52 to 54 show a state where, after the processing of the six layers is performed, the resist 151 corresponding thereto is removed and then, the resist 151 is applied again.

Comparative Example

[Configuration]

Figure 55:
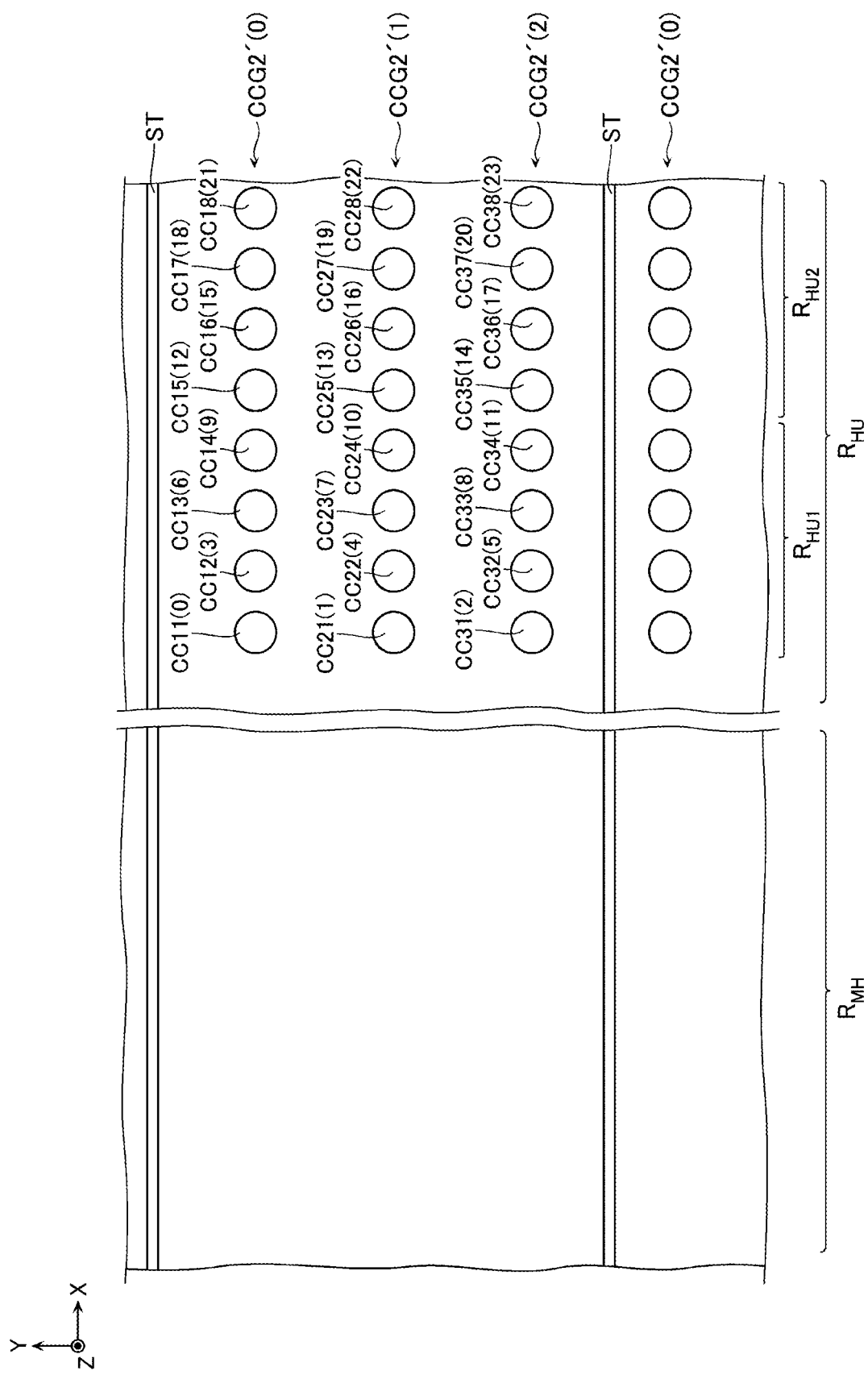
FIG. 55 is a schematic plan view of a semiconductor storage device according to a comparative example.
Figure 56:
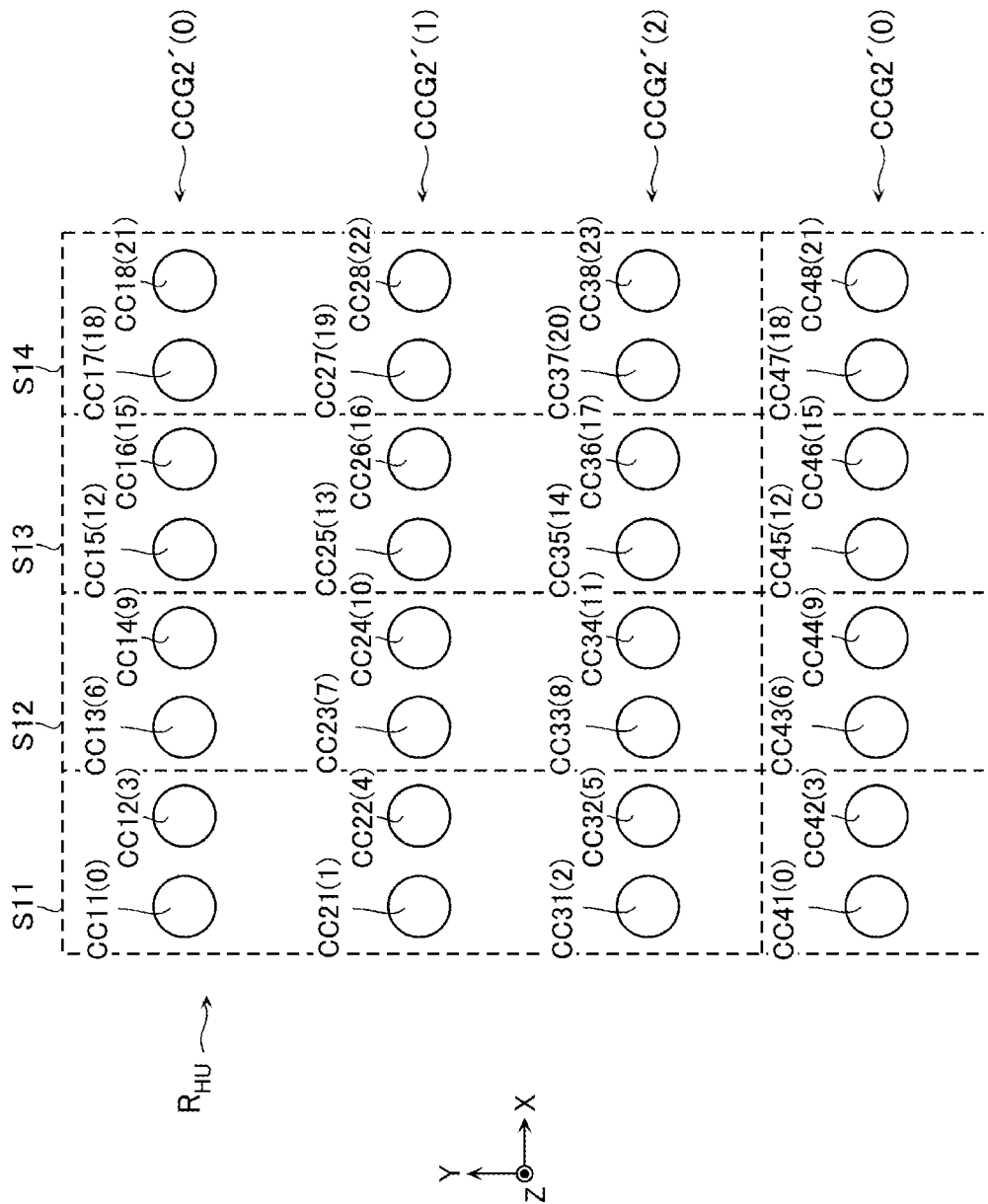
FIG. 56 is a schematic enlarged view of a hook-up region illustrated in FIG. 55.

Next, a configuration of a semiconductor storage device according to a comparative example will be described with reference to FIGS. 55 and 56. FIG. 55 is a schematic plan view of a semiconductor storage device according to a comparative example. FIG. 56 is a schematic enlarged view of a hook-up region illustrated in FIG. 55.

The hook-up region $R_{HU}$ of the memory block BLK includes, for example, a part of the conductive layer 110 and the plurality of contact electrodes CC arranged in a matrix in the X direction and the Y direction, as illustrated in FIG. 55.

Moreover, with regard to the plurality of contact electrodes CC illustrated in FIGS. 55 and 56 among the plurality of contact electrodes CC arranged in the hook-up region $R_{HU}$, the contact electrode CC which is the $a^{th}$ one (a is an integer of 1 or more) counted from the +Y direction to the −Y direction and is the $b^{th}$ one (b is an integer of 1 or more) counted from the −X direction to the +X direction may be referred to as a contact electrode CCab.

A row of eight contact electrodes CC arranged in the X direction may be referred to as a contact electrode row CCG2'. As illustrated in FIG. 55, three contact electrode rows CCG2'(0), CCG2'(1) and CCG2'(2) are arranged in the Y direction between the inter-block insulating layers ST of the hook-up region $R_{HU}$.

As illustrated in FIGS. 55 and 56, the contact electrode row CCG2'(0) includes contact electrodes CC11(0), CC12 (3), CC13(6), CC14(9), CC15(12), CC16(15), CC17(18), and CC18(21) in order from the one closest to the memory hole region $R_{MH}$.

Further, the contact electrode row CCG2'(1) includes contact electrodes CC21(1), CC22(4), CC23(7), CC24(10), CC25(13), CC26(16), CC27(19), and CC28(22) in order from the one closest to the memory hole region $R_{MH}$.

Further, the contact electrode row CCG2'(2) includes contact electrodes CC31(2), CC32(5), CC33(8), CC34(11), CC35(14), CC36(17), CC37(20), and CC38(23) in order from the one closest to the memory hole region $R_{MH}$.

In the example of FIG. 56, a region having a fixed area including six contact electrodes CC in 3 rows and 2 columns (three in the Y direction and two in the X direction) is defined as a unit region. The hook-up region $R_{HU}$ is virtually divided into a plurality of unit regions.

In FIG. 56, the unit region S11 is a region including six contact electrodes CC11(0), CC12(3), CC21(1), CC22(4), CC31(2), and CC32(5). The unit region S12 is a region including six contact electrodes CC13(6), CC14(9), CC23 (7), CC24(10), CC33(8), and CC34(11). The unit region S13 is a region including six contact electrodes CC15(12), CC16 (15), CC25(13), CC26(16), CC35(14), and CC36(17). The unit region S14 is a region including six contact electrodes CC17(18), CC18(21), CC27(19), CC28(22), CC37(20), and CC38(23).

The average value of the depth levels n of the six contact electrodes CC arranged in the unit region S11 is "2.5" (=15/6). The average value of the depth levels n of the six contact electrodes CC arranged in the unit region S12 is "8.5" (=51/6). The average value of the depth levels n of the six contact electrodes CC arranged in the unit region S13 is "14.5" (=87/6). The average value of the depth levels n of the six contact electrodes CC arranged in the unit region S14 is "20.5" (=123/6).

The minimum value of the average value of the depth levels n of the six contact electrodes CC is "2.5" of the unit region S11, and the maximum value of the average value of the depth levels n of the six contact electrodes CC is "20.5" of the unit region S14.

Further, as illustrated in FIG. 56, the contact electrode row CCG2'(0) including the contact electrodes CC41(0), CC42(3), CC43(6), CC44(9), CC45(12), CC46(15), CC47(18), and CC48(21) is a contact electrode row having the same arrangement as that of the contact electrode row CCG2'(0) including the contact electrodes CC11(0), CC12(3), CC13(6), CC14(9), CC15(12), CC16(15), CC17(18), and CC18(21).

Moreover, in the semiconductor storage device according to the comparative example, for example, as illustrated in FIG. 56, the number m of contact electrodes CC provided in the plurality of unit regions is "6". Further, "the third length" as described in the second embodiment is "20.5", and "the fourth length" is "2.5".

As described above, the minimum value of the average value of the depth levels n of the six contact electrodes CC is "2.5" of the unit region S11, and the maximum value of the average value of the depth levels n of the six contact electrodes CC is "20.5" of the unit region S14. Accordingly, the average value of the lengths in the Z direction of the six contact electrodes CC in the unit region S14 is the same as "the third length", and the average value of the lengths in the Z direction of the six contact electrodes CC in the unit region S11 is the same as "the fourth length". In this way, each average value of the lengths in the Z direction of the six contact electrodes CC in each unit region S11 to S14 is not always smaller than "the third length". Further, each average value of the lengths in the Z direction of the six contact electrodes CC in each unit region S11 to S14 is not always larger than "the fourth length".

[Manufacturing Method]

Figure 57:
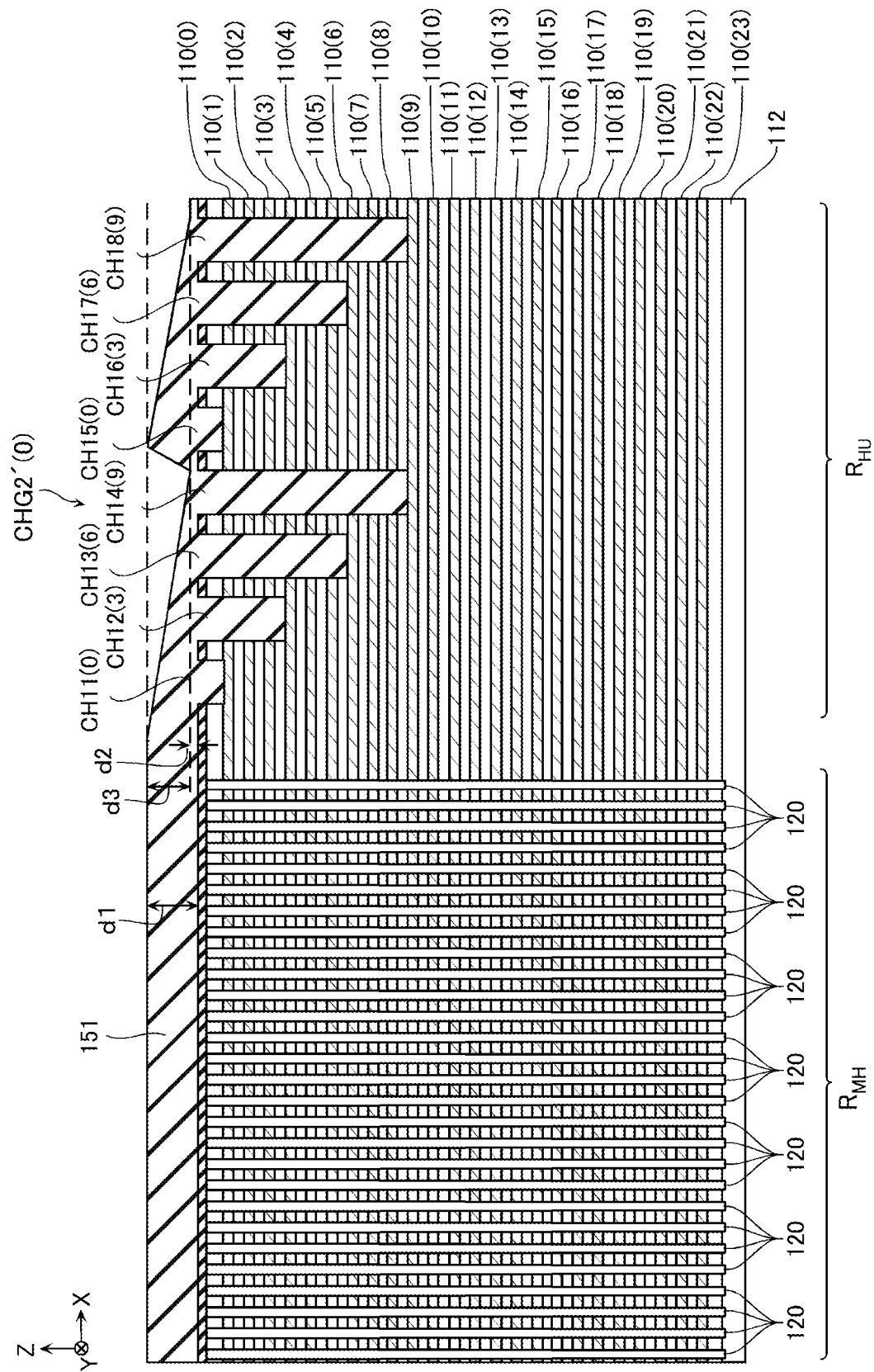
FIG. 57 is a schematic cross-sectional view illustrating a method of manufacturing the semiconductor storage device according to the comparative example.
Figure 58:
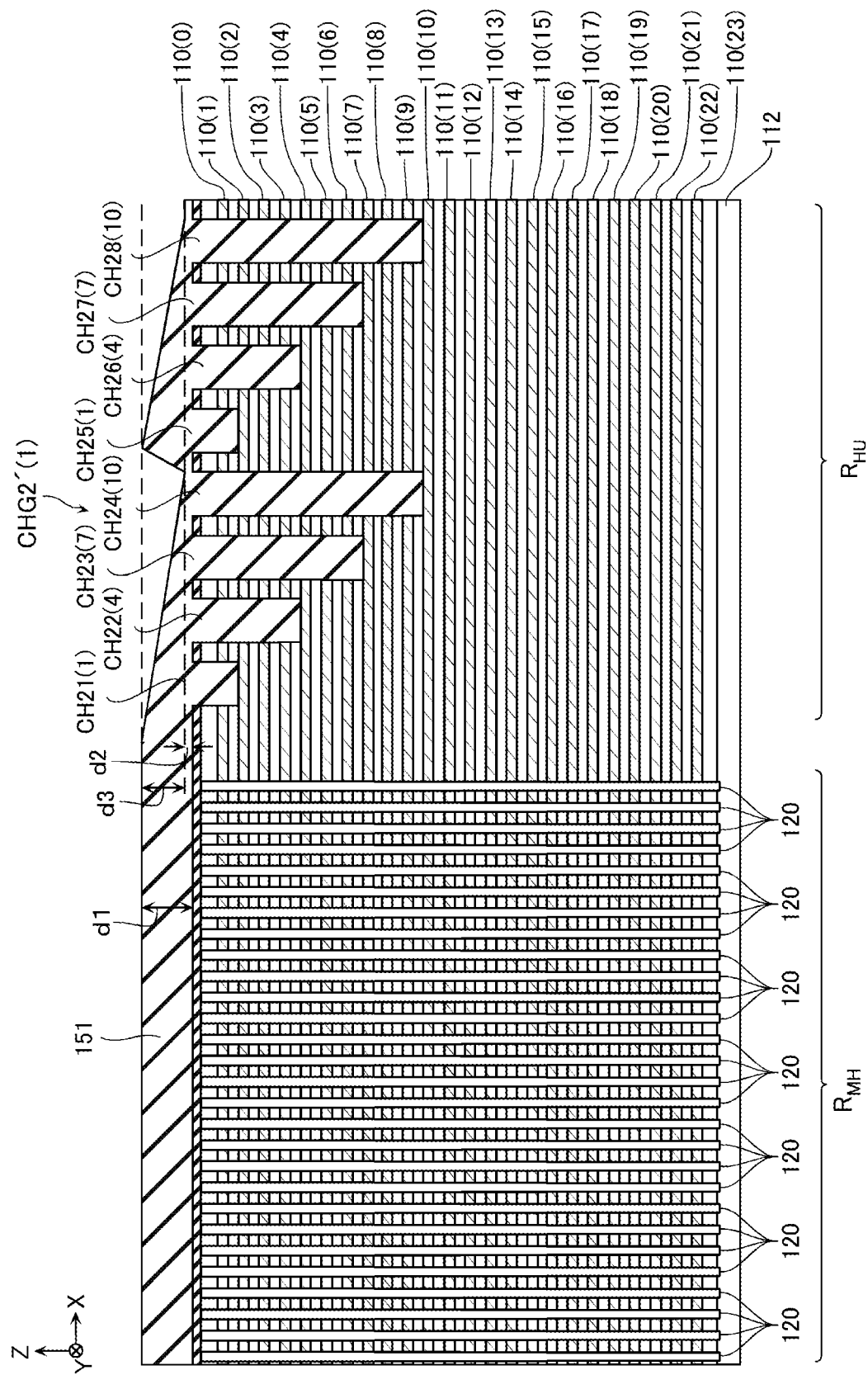
FIG. 58 is a schematic cross-sectional view illustrating the method of manufacturing the semiconductor storage device according to the comparative example.
Figure 59:
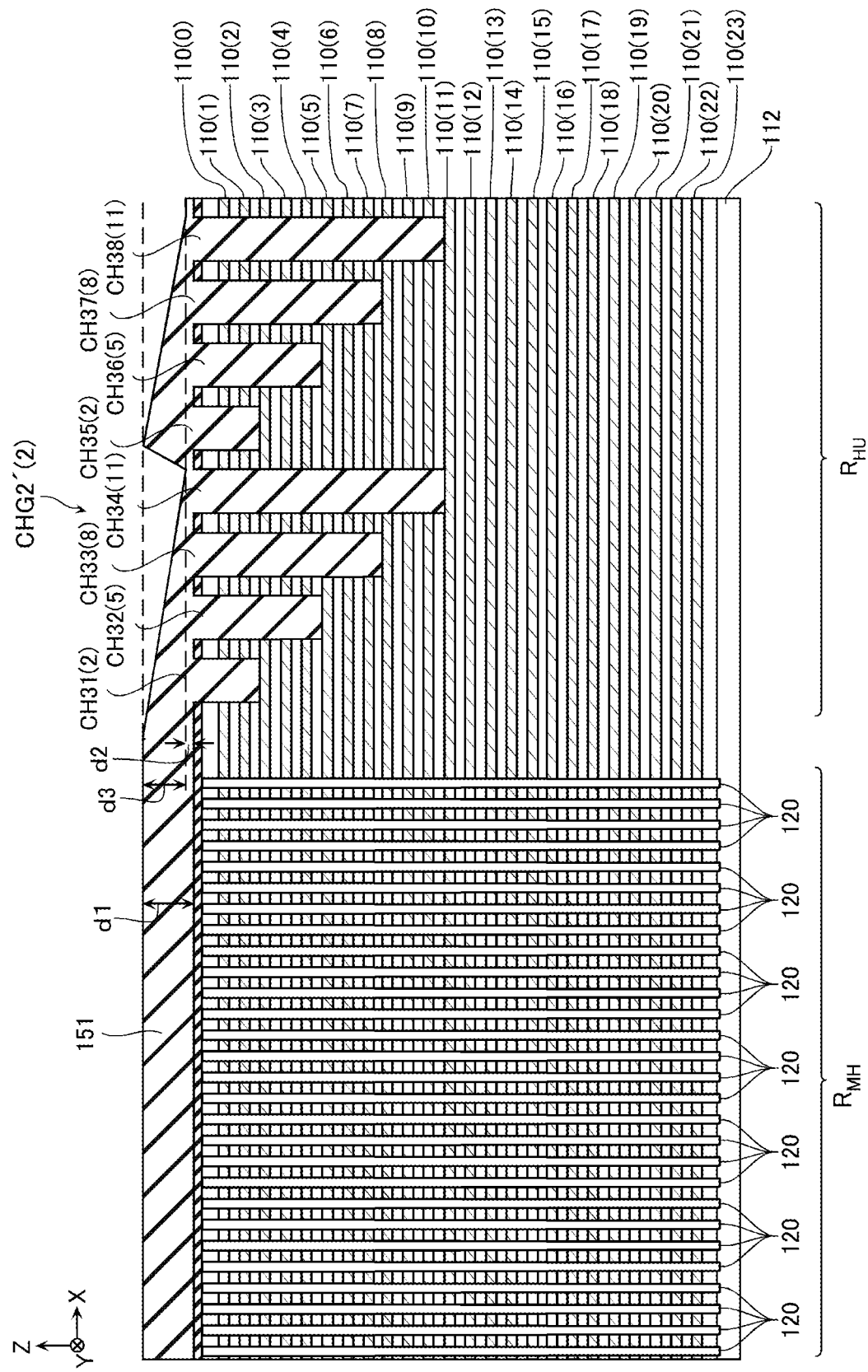
FIG. 59 is a schematic cross-sectional view illustrating the method of manufacturing the semiconductor storage device according to the comparative example.

Next, a method of manufacturing the semiconductor storage device according to the comparative example will be described with reference to FIGS. 57 to 59. FIGS. 57 to 59 are schematic cross-sectional views illustrating a method of manufacturing the semiconductor storage device according to the comparative example.

In the manufacture of the semiconductor storage device according to the comparative example, the same steps as those described in the second embodiment are performed.

The structures illustrated in FIGS. 57 to 59 correspond to the structures described with reference to FIGS. 52 to 54, respectively. The resist 151 illustrated in FIGS. 52 to 54 has a constant film thickness (thickness in the Z direction) and a flat upper surface in the hook-up region $R_{HU}$.

Meanwhile, the resist 151 illustrated in FIGS. 57 to 59 has a variation in the film thickness (thickness in the Z direction) and thus the level difference d3 created on the upper surface thereof in the hook-up region $R_{HU}$.

Specifically, for example, in the structures illustrated in FIGS. 57 to 59, the film thickness of the resist 151 in the memory hole region $R_{MH}$ is d1. The film thickness of the resist 151 becomes gradually thinner as the distance from the memory hole region $R_{MH}$ increases. The film thickness of the resist 151 above the contact hole CH14(9) is d2. The film thickness of the resist 151 becomes rapidly thicker from above the contact hole CH14(9) toward above the contact hole CH15(0). Then, the film thickness of the resist 151 again becomes gradually thinner as the distance from the memory hole region $R_{MH}$ increases. The level difference d3 is created as a variation in the film thickness of the resist 151 as described above.

In the semiconductor storage device according to the comparative example, the minimum value of the average value of the depth levels n of the six contact electrodes CC is "2.5" of the unit region S11, and the maximum value of the average value of the depth levels n of the six contact electrodes CC is "20.5" of the unit region S14. In this way, there occurs a deviation in the depths of the contact holes CH for each unit region. In this case, when the resist 151 is applied, the contact hole CH having a deep hole depth has a larger suction amount of the resist 151 than the contact hole CH having a shallow hole depth. As a result, the film thickness of the resist 151 above the contact hole CH having a deep hole depth is smaller than the film thickness of the resist 151 above the contact hole CH having a shallow hole depth.

In this way, because the film thickness of the resist 151 varies due to a deviation in the depths of the contact holes CH, the optimum focus of the exposure device is shifted between a thick portion and a thin portion of the resist 151. Thus, the process margin of lithography with respect to the focus shift of the exposure device is deteriorated. As a result, there is a risk of the contact hole CH being not opened or the uniformity of the dimension of the contact hole CH being deteriorated. Further, there is a possibility that the film thickness of the resist 151 will be insufficient at a location of the contact hole CH having a deep hole depth.

Meanwhile, in the semiconductor storage device according to the second embodiment, the minimum value of the average value of the depth levels n of the six contact electrodes CC is "7" of the unit region S11, and the maximum value of the average value of the depth levels n of the six contact electrodes CC is "16" of the unit region S14. In this way, the semiconductor storage device according to the second embodiment has a smaller deviation in the depths of the contact holes CH for each unit region than the semiconductor storage device according to the comparative example. As a result, the semiconductor storage device according to the second embodiment has a smaller variation in the film thickness of the resist 151 than the semiconductor storage device according to the comparative example.

Accordingly, it is possible to secure the process margin of lithography. As a result, it is possible to prevent the occurrence of unopened contact holes CH or deterioration in the uniformity of the dimension of the contact holes CH. Further, it is possible to prevent the resist 151 from having an insufficient film thickness.

Third Embodiment

Figure 60:
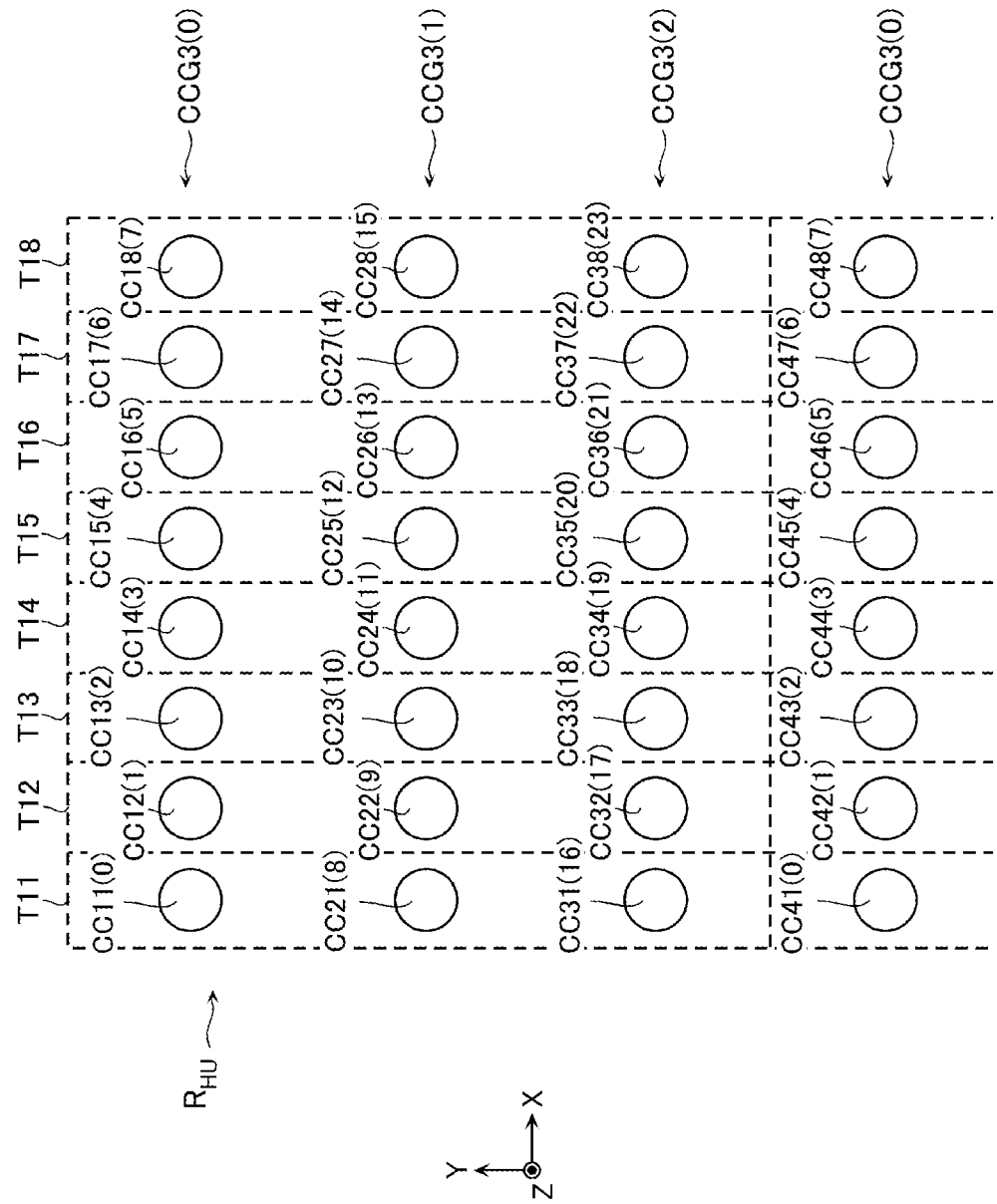
FIG. 60 is a schematic enlarged view of a hook-up region of a semiconductor storage device according to a third embodiment.

Next, a semiconductor storage device according to a third embodiment will be described with reference to FIG. 60. FIG. 60 is a schematic enlarged view of a hook-up region of a semiconductor storage device according to a third embodiment.

In the semiconductor storage device according to the third embodiment, as illustrated in FIG. 60, three contact electrode rows CCG3 each including eight contact electrodes CC are provided between the inter-block insulating layers ST. Further, in the semiconductor storage device according to the third embodiment, twenty-four conductive layers 110 and twenty-four insulating layers 101 are formed.

A row of eight contact electrodes CC arranged in the X direction may be referred to as a contact electrode row CCG3. Further, each region corresponding to the contact electrode row CCG3 may be referred to as a contact electrode region. As illustrated in FIG. 60, three contact electrode rows CCG3(0), CCG3(1), and CCG3(2) are arranged in the Y direction between the inter-block insulating layers ST of the hook-up region $R_{HU}$.

As illustrated in FIG. 60, the contact electrode row CCG3(0) includes contact electrodes CC11(0), CC12(1), CC13(2), CC14(3), CC15(4), CC16(5), CC17(6), and CC18(7) in order from the one closest to the memory hole region $R_{MH}$.

The contact electrode row CCG3(1) includes contact electrodes CC21(8), CC22(9), CC23(10), CC24(11), CC25(12), CC26(13), CC27(14), and CC28(15) in order from the one closest to the memory hole region $R_{MH}$.

The contact electrode row CCG3(2) includes contact electrodes CC31(16), CC32(17), CC33(18), CC34(19), CC35(20), CC36(21), CC37(22), and CC38(23) in order from the one closest to the memory hole region $R_{MH}$.

In the example of FIG. 60, a region having a fixed area including three contact electrodes CC arranged in the Y direction is defined as a unit region. The hook-up region $R_{HU}$ is virtually divided into a plurality of unit regions.

In FIG. 60, a unit region T11 is a region including three contact electrodes CC11(0), CC21(8), and CC31(16). A unit region T12 is a region including three contact electrodes CC12(1), CC22(9), and CC32(17). A unit region T13 is a region including three contact electrodes CC13(2), CC23(10), and CC33(18). A unit region T14 is a region including three contact electrodes CC14(3), CC24(11), and CC34(19). A unit region T15 is a region including three contact electrodes CC15(4), CC25(12), and CC35(20). A unit region T16 is a region including three contact electrodes CC16(5), CC26(13), and CC36(21). A unit region T17 is a region including three contact electrodes CC17(6), CC27(14), and CC37(22). A unit region T18 is a region including three contact electrodes CC18(7), CC28(15), and CC38(23).

The average value of the depth levels n of the three contact electrodes CC arranged in the unit region T11 is "8" (=24/3). The average value of the depth levels n of the three contact electrodes CC arranged in the unit region T12 is "9" (=27/3). The average value of the depth levels n of the three contact electrodes CC arranged in the unit region T13 is "10" (=30/3). The average value of the depth levels n of the three contact electrodes CC arranged in the unit region T14 is "11" (=33/3).

The average value of the depth levels n of the three contact electrodes CC arranged in the unit region T15 is "12" (=36/3). The average value of the depth levels n of the three contact electrodes CC arranged in the unit region T16 is "13" (=39/3). The average value of the depth levels n of the three contact electrodes CC arranged in the unit region T17 is "14" (=42/3). The average value of the depth levels n of the three contact electrodes CC arranged in the unit region S18 is "15" (=45/3).

The minimum value of the average value of the depth levels n of the three contact electrodes CC is "8" of the unit region T11, and the maximum value of the average value of the depth levels n of the three contact electrodes CC is "15" of the unit region T18.

In this way, the contact electrode CC having a shallow hole depth and the contact electrode CC having a deep hole depth are arranged in each of the unit regions T11 to T18. Thus, a difference between the minimum value of the average value of the depth levels n of the contact electrodes CC and the maximum value of the average value of the depth levels n of the contact electrodes CC is small. Accordingly, it is possible to secure the process margin of lithography. As a result, it is possible to prevent the occurrence of unopened contact holes CH or deterioration in the uniformity of the dimension of the contact holes CH. Further, it is possible to prevent the resist 151 from having an insufficient film thickness, and to form a desired pattern on the resist 151.

Fourth Embodiment

Figure 61:
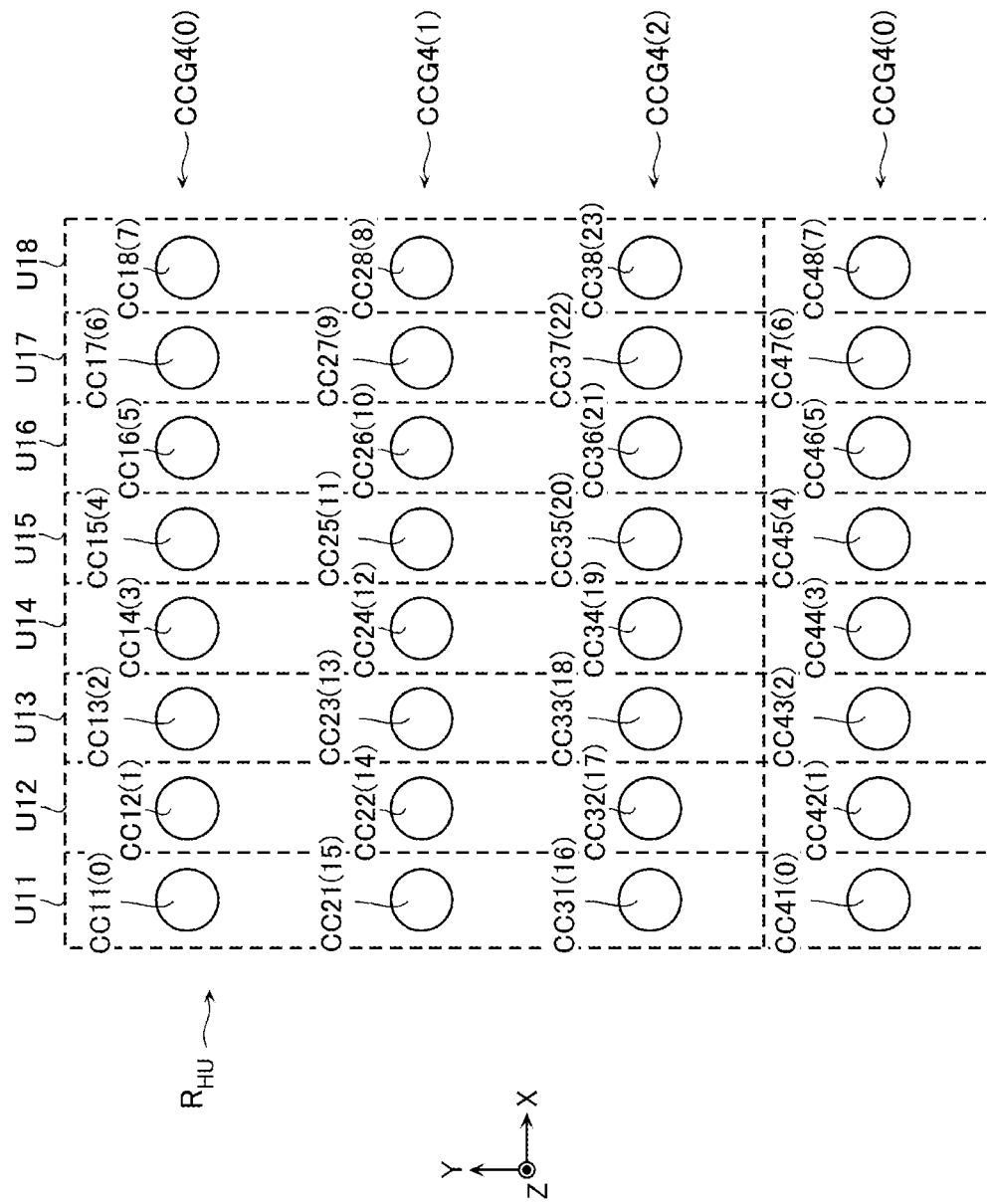
FIG. 61 is a schematic enlarged view of a hook-up region of a semiconductor storage device according to a fourth embodiment.

Next, a semiconductor storage device according to a fourth embodiment will be described with reference to FIG. 61. FIG. 61 is a schematic enlarged view of a hook-up region of a semiconductor storage device according to a fourth embodiment.

In the semiconductor storage device according to the fourth embodiment, as illustrated in FIG. 61, three contact electrode rows CCG4 each including eight contact electrodes CC are provided between the inter-block insulating layers ST. Further, in the semiconductor storage device according to the fourth embodiment, twenty-four conductive layers 110 and twenty-four insulating layers 101 are formed.

A row of eight contact electrodes CC arranged in the X direction may be referred to as a contact electrode row CCG4. Further, each region corresponding to the contact electrode row CCG4 may be referred to as a contact electrode region. As illustrated in FIG. 61, three contact electrode rows CCG4(0), CCG4(1) and CCG4(2) are arranged in the Y direction between the inter-block insulating layers ST of the hook-up region $R_{HU}$.

As illustrated in FIG. 61, the contact electrode row CCG4(0) includes contact electrodes CC11(0), CC12(1), CC13(2), CC14(3), CC15(4), CC16(5), CC17(6), and CC18(7) in order from the one closest to the memory hole region $R_{MH}$.

The contact electrode row CCG4(1) includes contact electrodes CC21(15), CC22(14), CC23(13), CC24(12), CC25(11), CC26(10), CC27(9), and CC28(8) in order from the one closest to the memory hole region $R_{MH}$.

The contact electrode row CCG4(2) includes contact electrodes CC31(16), CC32(17), CC33(18), CC34(19), CC35(20), CC36(21), CC37(22), and CC38(23) in order from the one closest to the memory hole region $R_{MH}$.

In an example of FIG. 61, a region having a fixed area including three contact electrodes CC arranged in the Y direction is defined as a unit region. The hook-up region $R_{HU}$ is virtually divided into a plurality of unit regions.

In FIG. 61, a unit region U11 is a region including three contact electrodes CC11(0), CC21(15), and CC31(16). A unit region U12 is a region including three contact electrodes CC12(1), CC22(14), and CC32(17). A unit region U13 is a region including three contact electrodes CC13(2), CC23(13), and CC33(18). A unit region U14 is a region including three contact electrodes CC14(3), CC24(12), and CC34(19). A unit region U15 is a region including three contact electrodes CC15(4), CC25(11), and CC35(20). A unit region U16 is a region including three contact electrodes CC16(5), CC26(10), and CC36(21). A unit region U17 is a region including three contact electrodes CC17(6), CC27(9), and CC37(22). A unit region U18 is a region including three contact electrodes CC18(7), CC28(8), and CC38(23).

The average value of the depth levels n of the three contact electrodes CC arranged in the unit region U11 is about "10.33" (=31/3). The average value of the depth levels n of the three contact electrodes CC arranged in the unit region U12 is about "10.67" (=32/3). The average value of the depth levels n of the three contact electrodes CC arranged in the unit region U13 is about "11" (=33/3). The average value of the depth levels n of the three contact electrodes CC arranged in the unit region U14 is about "11.33" (=34/3).

The average value of the depth levels n of the three contact electrodes CC arranged in the unit region U15 is about "11.67" (=35/3). The average value of the depth levels n of the three contact electrodes CC arranged in the unit region U16 is "12" (=36/3). The average value of the depth levels n of the three contact electrodes CC arranged in the unit region U17 is about "12.33" (=37/3). The average value of the depth levels n of the three contact electrodes CC arranged in the unit region U18 is about "12.67" (=38/3).

The minimum value of the average value of the depth levels n of the three contact electrodes CC is about "10.33" of the unit region U11, and the maximum value of the average value of the depth levels n of the three contact electrodes CC is about "12.67" of the unit region U18.

In this way, the contact electrode CC having a shallow hole depth and the contact electrode CC having a deep hole depth are arranged in each of the unit regions U11 to U18. Thus, the semiconductor storage device according to the fourth embodiment has a smaller difference between the minimum value of the average value of the depth levels n of the contact electrodes CC and the maximum value of the average value of the depth levels n of the contact electrodes CC than the semiconductor storage device according to the third embodiment. Accordingly, it is possible to secure the process margin of lithography. As a result, it is possible to prevent the occurrence of unopened contact holes CH or deterioration in the uniformity of the dimension of the contact holes CH. Further, it is possible to prevent the resist 151 from having an insufficient film thickness.

Other Embodiments

The semiconductor storage devices according to the first embodiment to the fourth embodiment have been described above. It is noted that the configurations and manufacturing methods of the semiconductor storage devices according to the first embodiment to the fourth embodiment are merely by way of example. The specific configurations and manufacturing methods may be appropriately adjusted.

For example, a difference between the average values of the depth levels of the contact holes CH (contact electrodes CC) for each unit region may be small as a whole in the hook-up region $R_{HU}$ of the memory block BLK.

For example, in the first embodiment, the deep contact hole CH (contact electrode CC) and the shallow contact hole CH (contact electrode CC) are arranged in the Y direction. Alternatively, the deep contact hole CH (contact electrode CC) and shallow contact hole CH (contact electrode CC) may be alternately arranged in the X direction.

Further, for example, in the first embodiment to the fourth embodiment, the contact holes CH (the plurality of contact electrodes CC) are arranged in a matrix in the X direction and the Y direction in the hook-up region $R_{HU}$. Alternatively, the plurality of contact holes CH (contact electrodes CC) may be arranged in various geometric patterns constituted by figures such as a triangle and a square.

Further, for example, in the first embodiment, one contact hole row CHG (contact electrode row CCG) is provided between two inter-block insulating layers ST adjacent to each other in the Y direction, and in the second embodiment to the fourth embodiment, three contact hole rows CHG (contact electrode rows CCG) are provided between two inter-block insulating layers ST adjacent to each other in the Y direction. Alternatively, the number of contact hole rows CHG (contact electrode rows CCG) provided between the two inter-block insulating layers ST adjacent to each other in the Y direction is not limited to "1" or "3", but may be "2" or "4 or more".

Further, for example, in the first embodiment to the fourth embodiment, the contact hole row CHG (contact electrode row CCG) includes eight contact holes CH (contact electrodes CC). Alternatively, the number of contact holes CH (contact electrodes CC) provided in the contact hole row CHG (contact electrode row CCG) is not limited to "8", but may be any other number.

Further, for example, in the first embodiment, the number of conductive layers 110 is "8", and in the second embodiment to the fourth embodiment, the number of conductive layers 110 is "24". Alternatively, the number of conductive layers 110 is not limited to "8" or "24", but may be any other number.

When applying the resist 151, the amount of the resist 151 to be applied may be increased when the contact hole CH has a deep depth as compared with that when the contact hole CH has a shallow depth. This is because the suction amount of the resist 151 in the contact hole CH is increased.

Further, the unit regions R11 to R18 and R21 to R28 are regions including two contact electrodes CC in the first embodiment, the unit regions S11 to S14 are regions including six contact electrodes CC in the second embodiment, and the unit regions T11 to T18 and U11 to U18 are regions including three contact electrodes CC in the third and fourth embodiments. The unit region may be set freely, but the number (a fixed number) of contact electrodes provided in the unit region is at least smaller than the number of conductive layers. In general, as the number of contact electrodes provided in the unit region is small (that is, the area of the unit region is small) and a difference between the average values of the depth levels of the contact electrodes in the unit regions is small, the film thickness of the resist 151 tends to be uniform.

Further, for example, in the first embodiment to the fourth embodiment, one end of the semiconductor layer 120 in the Z direction is connected to the semiconductor layer 112. Alternatively, one end of the semiconductor layer 120 in the Z direction may be connected to the semiconductor substrate 100. Further, for example, in the first embodiment to the fourth embodiment, the contact electrode CC is connected to the upper surface of the conductive layer 110. Alternatively, the contact electrode CC may be connected to the lower surface of the conductive layer 110.

Further, for example, as described with reference to FIGS. 10 and 11, the hard mask 105 is used in the manufacturing methods according to the first embodiment to the fourth embodiment. It is noted that these methods are merely by way of example. A specific method may be appropriately adjusted. For example, the semiconductor storage device according to any of the embodiments may be manufactured without using the hard mask 105.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
   a substrate having a memory region and a hook-up region arranged in a first direction; and
   a plurality of memory structures arranged in a second direction intersecting the first direction,
   wherein each of the plurality of memory structures includes:
   a plurality of conductive layers arranged in a third direction intersecting a surface of the substrate, the plurality of conductive layers extending in the first direction over the memory region and the hook-up region;
   a semiconductor layer disposed in the memory region and extending in the third direction to face the plurality of conductive layers;
   a charge storage film disposed between the plurality of conductive layers and the semiconductor layer; and
   a plurality of contact electrodes disposed in the hook-up region, the plurality of contact electrodes extending in the third direction to have an outer peripheral surface surrounded by a part of the plurality of conductive layers, each contact electrode being connected to any of the plurality of conductive layers,
   wherein the hook-up region includes a first region and a second region arranged in the first direction,
   wherein the first region includes a first contact electrode and a second contact electrode adjacent to each other along the second direction, and the second region includes a third contact electrode and a fourth contact electrode adjacent to each other along the second direction, and
   wherein, in the third direction, a first average length of the first and second electrodes is equal to a second average length of the third and fourth contact electrodes.

2. The semiconductor storage device according to claim 1, wherein each of the plurality of contact electrodes is disposed in the first region or the second region, and
   the number of contact electrodes disposed in the first region is equal to the number of contact electrodes disposed in the second region.

3. The semiconductor storage device according to claim 1, wherein the contact electrodes disposed in the first region are respectively aligned with the contact electrodes disposed in the second region in the first direction.

4. The semiconductor storage device according to claim 1, wherein the hook-up region includes a first contact electrode region and a second contact electrode region arranged in the second direction,
   each of the first contact electrode region and the second contact electrode region includes a predetermined number of contact electrodes arranged in the first direction,
   among the predetermined number of contact electrodes disposed in the first contact electrode region, those provided closer to one side in the first direction have a larger length in the third direction, and
   among the predetermined number of contact electrodes disposed in the second contact electrode region, those provided closer to a remaining side in the first direction have a larger length in the third direction.

5. A semiconductor storage device comprising:
   a substrate having a memory region and a hook-up region arranged in a first direction; and
   a first memory structure and a second memory structure arranged in a second direction intersecting the first direction,
   wherein each of the first memory structure and the second memory structure includes:
   a plurality of conductive layers arranged in a third direction intersecting a surface of the substrate and extending in the first direction over the memory region and the hook-up region;
   a semiconductor layer disposed in the memory region and extending in the third direction to face the plurality of conductive layers;
   a charge storage film disposed between the plurality of conductive layers and the semiconductor layer; and
   a plurality of contact electrodes disposed in the hook-up region, the plurality of contact electrodes extending in the third direction to have an outer peripheral surface surrounded by a part of the plurality of conductive layers, each contact electrode being connected to any of the plurality of conductive layers,
   wherein the hook-up region includes a plurality of unit regions arranged in the first direction,
   wherein the plurality of contact electrodes provided in the first memory structure and the plurality of contact electrodes provided in the second memory structure are respectively disposed in any of the plurality of unit regions, and
   wherein, the number of contact electrodes provided in each of the plurality of unit regions is m (m is an integer of 2 or more),
   an average value of lengths in the third direction of the m contact electrodes of a first one of the plurality of unit regions is a first length,
   an average value of lengths in the third direction of the m contact electrodes of a second one of the plurality of unit regions is a second length, and
   the first length is equal to the second length.

6. The semiconductor storage device according to claim 5, wherein the hook-up region includes a first contact electrode region and a second contact electrode region arranged in the second direction,
   each of the first contact electrode region and the second contact electrode region includes a predetermined number of contact electrodes arranged in the first direction,
   among the predetermined number of contact electrodes disposed in the first contact electrode region, those disposed closer to one side in the first direction have a larger length in the third direction, and
   among the predetermined number of contact electrodes disposed in the second contact electrode region, those disposed closer to a remaining side in the first direction have a larger length in the third direction.

7. The semiconductor storage device according to claim 5, wherein the hook-up region includes a third contact electrode region,
   the third contact electrode region includes a fourth contact electrode, a fifth contact electrode, and a sixth contact electrode arranged in the first direction,
   the fifth contact electrode is disposed between the fourth contact electrode and the sixth contact electrode, and a length of the fifth contact electrode in the third direction is larger than or smaller than any of a length of the fourth contact electrode in the third direction or a length of the sixth contact electrode in the third direction.

8. A semiconductor storage device comprising:
a memory region and a hook-up region arranged in a first direction;
a plurality of conductive layers arranged in a third direction intersecting a surface of the substrate, the plurality of conductive layers extending in the first direction over the memory region and the hook-up region;
a semiconductor layer disposed in the memory region and extending in the third direction to face the plurality of conductive layers;
a charge storage film disposed between the plurality of conductive layers and the semiconductor layer; and
a plurality of contact electrodes disposed in the hook-up region and extending in the third direction to have an outer peripheral surface surrounded by a part of the plurality of conductive layers, each contact electrode being connected to any of the plurality of conductive layers,
wherein the hook-up region includes a plurality of unit regions arranged in the first direction,
wherein the contact electrodes are disposed in any of the plurality of unit regions, and
wherein, the number of contact electrodes provided in each of the plurality of unit regions is m (m is an integer of 2 or more),
an average value of lengths in the third direction of the m contact electrodes of a first one of the plurality of unit regions is a first length,
an average value of lengths in the third direction of the m contact electrodes of a second one of the plurality of unit regions is a second length, and
the first length is equal to the second length.

9. The semiconductor storage device according to claim 8, wherein each average value of the lengths in the third direction of the m contact electrodes in each unit region is substantially constant.

10. The semiconductor storage device according to claim 8, wherein the hook-up region includes a first contact electrode region and a second contact electrode region arranged in a second direction, the second direction intersecting the first direction and the third direction,
each of the first contact electrode region and the second contact electrode region includes a predetermined number of contact electrodes arranged in the first direction,
among the predetermined number of contact electrodes disposed in the first contact electrode region, those disposed closer to one side in the first direction have a larger length in the third direction, and
among the predetermined number of contact electrodes disposed in the second contact electrode region, those disposed closer to a remaining side in the first direction have a larger length in the third direction.

11. The method according to claim 8, wherein the hook-up region includes a third contact electrode region,
the third contact electrode region includes a fourth contact electrode, a fifth contact electrode, and a sixth contact electrode arranged in the first direction,
the fifth contact electrode is disposed between the fourth contact electrode and the sixth contact electrode, and
a length of the fifth contact electrode in the third direction is larger than or smaller than any of a length of the fourth contact electrode in the third direction or a length of the sixth contact electrode in the third direction.

12. The semiconductor storage device according to claim 1, wherein the substrate includes silicon.

13. The semiconductor storage device according to claim 1, wherein the semiconductor storage device includes a memory die.

14. The semiconductor storage device according to claim 1, wherein the charge storage film includes silicon nitride.

15. The semiconductor storage device according to claim 1, further comprising a block insulating film contacting a first side of the charge storage film.

16. The semiconductor storage device according to claim 15, further comprising a tunnel insulating film contacting a second side of the charge storage film opposite to the first side.

17. The semiconductor storage device according to claim 16, wherein the charge storage film, the block insulating film and the tunnel insulating film have a substantially cylindrical shape.

18. The semiconductor storage device according to claim 15, wherein the block insulating film includes silicon oxide.

* * * * *